(12) United States Patent
Nakamura et al.

(10) Patent No.: US 7,002,845 B2
(45) Date of Patent: Feb. 21, 2006

(54) SEMICONDUCTOR MEMORY DEVICE CAPABLE OF REALIZING A CHIP WITH HIGH OPERATION RELIABILITY AND HIGH YIELD

(75) Inventors: Hiroshi Nakamura, Kawasaki (JP); Ken Takeuchi, Tokyo (JP); Hideko Oodaira, Kuroishi (JP); Kenichi Imamiya, Kawasaki (JP); Kazuhito Narita, Yokkaichi (JP); Kazuhiro Shimizu, Yokohama (JP); Seiichi Aritome, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/957,722

(22) Filed: Oct. 5, 2004

(65) Prior Publication Data

US 2005/0063209 A1    Mar. 24, 2005

Related U.S. Application Data

(60) Continuation of application No. 10/452,128, filed on Jun. 3, 2003, now Pat. No. 6,836,444, which is a continuation of application No. 10/166,779, filed on Jun. 12, 2002, now Pat. No. 6,611,447, which is a continuation of application No. 09/749,443, filed on Dec. 28, 2000, now Pat. No. 6,424,588, which is a division of application No. 09/345,443, filed on Jul. 1, 1999, now Pat. No. 6,240,012.

(30) Foreign Application Priority Data

Jul. 2, 1998    (JP) ................................. 10-187398

(51) Int. Cl.
*G11C 16/04*    (2006.01)

(52) U.S. Cl. .......................... 365/185.11; 365/230.03; 365/63

(58) Field of Classification Search ........... 365/185.11, 365/230.03, 63
See application file for complete search history.

(56) References Cited

U.S. PATENT DOCUMENTS 4,839,860 A    6/1989    Shinoda et al.

(Continued)

FOREIGN PATENT DOCUMENTS

JP    10-173157    6/1998

*Primary Examiner*—Son T. Dinh
(74) *Attorney, Agent, or Firm*—Banner & Witcoff, Ltd.

(57) ABSTRACT

A semiconductor memory device capable of preventing occurrence of a defect caused by a lowering in the etching precision in an end area of the memory cell array and realizing an inexpensive chip having high operation reliability and high manufacturing yield is provided. A first block is constructed by first memory cell units each having a plurality of memory cells connected, a second block is constructed by second memory cell units each having a plurality of memory cells connected, and the memory cell array is constructed by arranging the first blocks on both end portions thereof and arranging the second blocks on other portions thereof. The structure of the first memory cell unit on the end side of the memory cell array is different from that of the second memory cell unit. Wirings for connecting the selection gate lines of the memory cell array to corresponding transistors in a row decoder are formed of wiring layers formed above wirings for connecting control gate lines of the memory cell array to the transistors in the row decoder. By use of the semiconductor memory device, occurrence of a defect caused by a lowering in the etching precision in an end area of the memory cell array can be prevented, and the manufacturing yield can be made high and the operation reliability can be made high without substantially increasing the chip size.

40 Claims, 31 Drawing Sheets

U.S. PATENT DOCUMENTS

| | | |
|---|---|---|
| 5,404,331 A | 4/1995 | McClure |
| 5,508,957 A | 4/1996 | Momodomi et al. |
| 5,590,073 A * | 12/1996 | Arakawa et al. ........ 365/185.08 |
| 5,637,895 A | 6/1997 | Iwata et al. |
| 5,637,985 A | 6/1997 | Kakizaki et al. |
| 5,677,556 A | 10/1997 | Endoh |
| 5,764,575 A | 6/1998 | Kawai et al. |
| 5,822,248 A | 10/1998 | Satori et al. |
| 5,910,913 A | 6/1999 | Kato et al. |
| 5,986,933 A | 11/1999 | Takeuchi et al. |
| 6,002,606 A | 12/1999 | Komatsu |
| 6,011,287 A | 1/2000 | Itoh et al. |

* cited by examiner

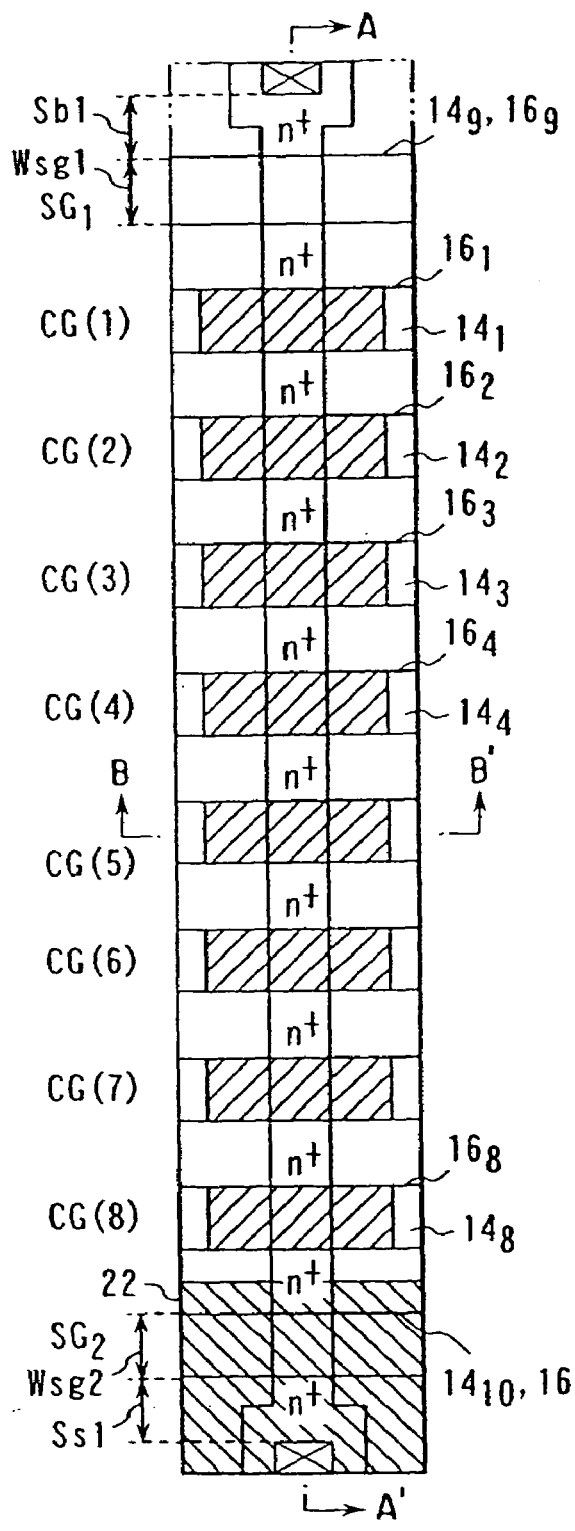
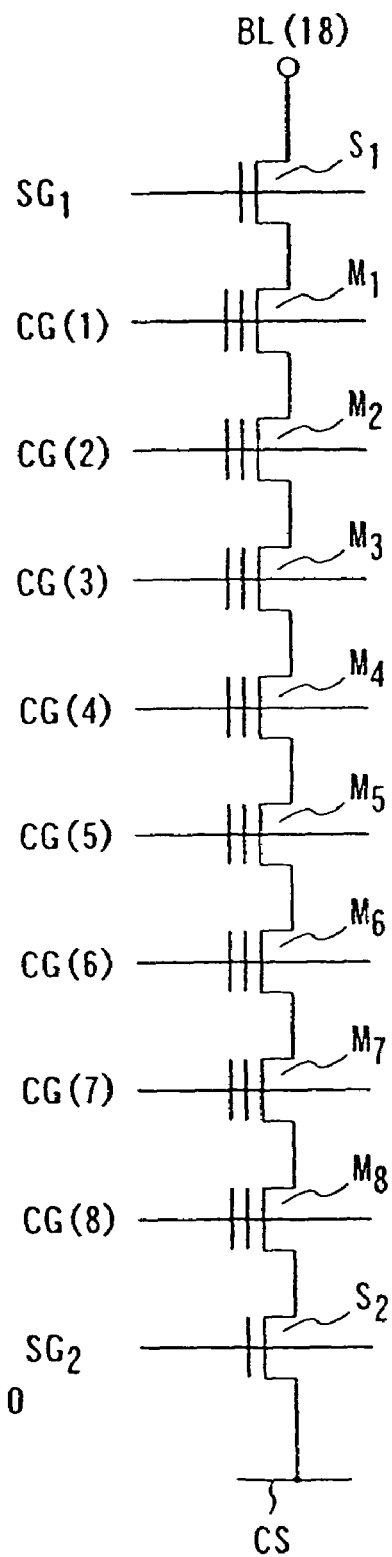
FIG. 3A
FIG. 3B

SEMICONDUCTOR MEMORY DEVICE CAPABLE OF REALIZING A CHIP WITH HIGH OPERATION RELIABILITY AND HIGH YIELD

CROSS-REFERENCE TO RELATED APPLICATIONS

This application is a continuation of prior application Ser. No. 10/452,128, filed Jun. 3, 2003 U.S. Pat. No. 6,836,444, which is a continuation of prior application Ser. No. 10/166,779, filed Jun. 12, 2002, now U.S. Pat. No. 6,611,447, which is a continuation of prior application Ser. No. 09/749,443, filed Dec. 28, 2000, now U.S. Pat. No. 6,424,588, which is divisional of prior application Ser. No. 09/345,443, filed Jul. 1, 1999, now U.S. Pat. No. 6,240,012, which is based upon and claims the benefit of priority from the prior Japanese Patent Application No. 10-187398, filed Jul. 2, 1998. The entire disclosures of the prior applications are incorporated herein by reference.

BACKGROUND OF THE INVENTION

This invention relates to a semiconductor memory device and more particularly to a nonvolatile semiconductor memory device such as a NAND cell, NOR cell, DINOR cell or AND cell type EEPROM.

As one type of a semiconductor memory device, an EEPROM capable of electrically programming data is known. A NAND cell type EEPROM having NAND cell blocks each constructed by serially connecting a plurality of memory cells has received much attention since it is integrated with high density.

One memory cell in the NAND cell type EEPROM has an FET-MOS structure which has a floating gate (charge storing layer) and control gate stacked on a semiconductor substrate with an insulating film disposed therebetween. A plurality of memory cells are serially connected with the adjacent two of the memory cells commonly using the source/drain to construct a NAND cell and the NAND cell is dealt with as one unit and connected to a bit line. The NAND cells are arranged in a matrix form to construct a memory cell array. Generally, the memory cell array is integrated on a p-type semiconductor substrate or p-type well region.

The drains on one-end sides of the NAND cells arranged in the column direction of the memory cell array are commonly connected to a bit line via selection gate transistors and the sources thereof on the other sides are connected to a common source line via selection gate transistors. The control gates of the memory cells and the gate electrodes of the selection transistors are formed to continuously extend in the row direction of the memory cell array and used as control gate lines (word lines) and selection gate lines.

The operation of the NAND cell type EEPROM with the above construction is as follows. First, the data programming operation is sequentially effected for the memory cells starting from the memory cell which is formed in position farthest away from the bit line contact. A high voltage Vpp (=approx. 20V) is applied to the control gate of the selected memory cell, an intermediate voltage Vmc (=approx. 10V) is applied to the control gates and selection gates of memory cells lying on the bit line contact side with respect to the selected memory cell and a voltage of 0V or intermediate voltage Vmb (=approx. 8V) is applied to the bit line according to data. When 0V is applied to the bit line, the potential is transmitted to the drain of the selected memory cell, thereby causing electrons to be injected from the drain into the floating gate. As a result, the threshold voltage of the selected memory cell is shifted in a positive direction. This state is defined as "1". On the other hand, if the intermediate voltage Vmb is applied to the bit line, injection of electrons does not occur and the threshold voltage is not changed and is kept negative. This state is defined as "0".

The data erase operation is effected for all of the memory cells in the selected NAND cell block. That is, all of the control gates in the selected NAND cell block are set to 0V and a high voltage of approx. 20V is applied to the bit line, source line, p-type well region (or p-type semiconductor substrate), and all of the selection gates and control gates in the non-selected NAND cell blocks. As a result, electrons in the floating gates of all of the memory cells in the selected NAND cell block are discharged into the p-type well region (or p-type semiconductor substrate) to shift the threshold voltage in the negative direction.

Further, the data readout operation is effected by setting the control gate of a selected memory cell to 0V, setting the selection gates and control gates of the memory cells other than the selected memory cell to a power supply voltage Vcc and determining whether or not a current flows in the selected memory cell.

Next, the memory cell array, block arrangement and the construction of the NAND cell in the NAND cell type EEPROM are explained in detail.

FIG. 32 shows the block arrangement of the memory cell array in the conventional NAND cell type EEPROM described above. In FIG. 32, all of the blocks 1-0 to 1-N in the memory cell array 1 are formed of NAND cells (which are referred to as NAND-A cells) of the same construction. To each of the blocks 1-0 to 1-N, selection gate lines $SG_1$, $SG_2$ and control gate lines CG(1) to CG(8) are connected. According to a row address, the block and the row of the NAND cell are selected so that a voltage can be supplied to the selection gate lines $SG_1$, $SG_2$ and control gate lines CG(1) to CG(8) from a row decoder.

FIG. 33 shows an example of the detail construction of part of the memory cell array 1 shown in FIG. 32 and is an equivalent circuit diagram of the memory cell array having the NAND cells arranged in a matrix form. Each of the blocks 1-0 to 1-N in the memory cell array 1 shown in FIG. 32 corresponds to an area 1-L (L=0 to N) indicated by broken lines in FIG. 33. In this example, a NAND cell group commonly having the same word line and selection gate line is called a block and the area 1-L surrounded by the broken lines in FIG. 33 is defined as one block. The drain of a selection gate transistor $S_1$ of each NAND cell is connected to a corresponding one of bit lines $BL_1$, $BL_2$, ..., $BL_m$ and the source of a selection gate transistor $S_2$ is connected to a common source line CS. Memory cells $M_1$, $M_2$, ..., $M_8$ are serially connected between the source of the selection gate transistor $S_1$ and the drain of the selection gate transistor $S_2$. The operation such as the readout/program operation is generally effected by selecting one block (which is called a selected block) from a plurality of blocks by use of the selection gate transistors $S_1$, $S_2$.

FIGS. 34A, 34B and FIGS. 35A, 35B show in detail one NAND cell extracted from the circuit shown in FIG. 33. FIGS. 34A, 34B are a pattern plan view and equivalent circuit diagram of a NAND cell portion and FIGS. 35A, 35B are cross sectional views respectively taken along the A–A' line and B–B' line of the pattern shown in FIG. 34A. A memory cell array formed of a plurality of NAND cells is formed on a p-type silicon substrate (or p-type well region) 11 surrounded by an element isolation oxide film 12. In this example, eight memory cells $M_1, M_2, \ldots, M_8$ are serially connected in each NAND cell.

In each of the memory cells $M_1, M_2, \ldots, M_8$, a floating gate 14 ($14_1, 14_2, \ldots, 14_8$) is formed above the substrate 11 with a gate insulating film 13 formed therebetween and a control gate 16 ($16_1, 16_2, \ldots, 16_8$) is formed above the corresponding floating gate with a gate insulating film 15 formed therebetween. Further, n-type diffusion layers 19 ($19_1, 19_2, \ldots, 19_8$) used as the sources and drains of the memory cells are connected with the sources/drains of the adjacent memory cells commonly used so as to construct the series-connected memory cells $M_1, M_2, \ldots, M_8$.

Selection gates $14_9, 16_9$ and $14_{10}, 16_{10}$ which are formed in the same step as the floating gates and control gates of the memory cells are formed on the drain side and source side of the NAND cell. The selection gates $14_9, 16_9$ and $14_{10}, 16_{10}$ are electrically connected to each other in an area (not shown) and respectively used as the gate electrodes of the selection gate transistors $S_1, S_2$. The upper surface of the substrate 11 on which the elements are formed is covered with a CVD oxide film (inter-level insulating film) 17 and bit lines are formed on the CVD oxide film 17. The bit line 18 is formed in contact with a diffusion layer $19_0$ on the drain side of one end of the NAND cell. The control gates 14 of the NAND cells arranged in the row direction are respectively commonly arranged as the control gate lines CG(1), CG(2), ..., CG(8). The control gate lines are used as word lines. The selection gates $14_9, 16_9$ and $14_{10}, 16_{10}$ are also arranged continuously in the row direction as the selection gate lines $SG_1, SG_2$. A wiring layer 22 for the source line is disposed between the bit line 18 and a wiring layer exclusively used for the control gate line/selection gate and is formed in contact with a diffusion layer $19_{10}$ on the source side of the NAND cell (on the end opposite to the bit line contact portion).

Thus, conventionally, the memory cells of the same dimensions and same construction are formed in each block of the memory cell array.

In the memory cell array shown in FIG. 32, since the blocks are regularly arranged, the control gate lines CG(1) to CG(8) and selection gate lines $SG_1, SG_2$ are arranged at substantially regular intervals in the entire memory cell array, and therefore, the processing precision for the word lines or the like becomes relatively high in the blocks (corresponding to the blocks 1-1 to 1-(N−1) shown in FIG. 32) lying inside the memory cell array 1. However, since the wiring pattern becomes irregular in the blocks (corresponding to the blocks 1-0, 1-N shown in FIG. 32) lying on the end portion of the memory cell array, particularly, in a portion near the outer periphery (near the selection gate line $SG_2$ in FIG. 33) of the memory cell array 1, the etching condition cannot be made constant and the processing precision is lowered.

Generally, the blocks in the end portion of the memory cell array are dealt with as non-use blocks by taking it into consideration that the processing precision is lowered, but even in this case, it is not a satisfactory measure, and the selection gate line $SG_2$ in the block 1-0, 1-N of FIG. 32 is cut off or it short-circuits to a source line contact portion by an increase in the wiring width of the selection gate line $SG_2$, thus causing a problem. Generally, the selection gate lines $SG_1, SG_2$ are wirings whose potentials are determined according to the selection/non-selection of the block and the influence given by the non-selected block at the time of program/readout operation, for example, is eliminated by setting the bit lines, source line and NAND cell into the non-selected state when the block is not selected. However, if the line is cut off, it is difficult to set the non-conductive state. In this case, there occurs a problem that a leak current flows from the bit line, the load capacitance of the bit line and source line is increased, or a short circuit between the bit line and the source line occurs, and the operation margin is reduced and the operation may become defective. Further, when the selection gate line $SG_2$ is short-circuited to the source line contact portion, the source line voltage and the voltage of the selection gate line $SG_2$ may vary and a defect occurs.

A problem of a lowering in the processing precision due to disturbance of the regular arrangement of the wiring pattern may occur not only in the entire memory cell array but also in one NAND cell if higher precision is required. Next, a lowering in the processing precision in a case where special attention is given to one NAND cell is explained in detail with reference to FIGS. 36A, 36B, 37A, 37B. FIGS. 36A, 36B are a pattern plan view and equivalent circuit diagram showing one NAND cell portion of the memory cell array, and FIGS. 37A, 37B are cross sectional views taken along the A–A' line and the B–B' line of FIG. 36A. In FIGS. 36A, 36B, 37A, 37B, portions which are the same as those of FIGS. 34A, 34B, 35A, 35B are denoted by the same reference numerals and the detail explanation therefor is omitted.

In this example, the line widths of the selection gate lines $SG_1, SG_2$ in FIGS. 36A, 36B, 37A, 37B are denoted by Wsg1, Wsg2, the line widths of the control gate lines CG(1), CG(2), ..., CG(8) are denoted by Wcg1, Wcg2, ..., Wcg8, spaces between the control gate lines are denoted by Scg12, Scg23, ..., Scg78, and spaces between the control gate lines and the selection gate lines are denoted by Ssg1, Ssg2. The NAND cell shown in FIGS. 36A, 36B, 37A, 37B is different from the NAND cell shown in FIGS. 34A, 34B, 35A, 35B in that the wiring layer 22 for the source line is not provided.

In the above NAND cell, conventionally, the designed values of all of the control gate line widths in the NAND cell are the same. That is, in FIGS. 36A, 37A, Wcg1=Wcg2= ..., =Wcg8. Further, the spaces between the control gate lines are set to the same value, that is, Scg12=Scg23= ..., Scg78. On the other hand, the selection gate line width is designed to be slightly larger than the control gate line width in order to enhance the cut-off characteristic of the selection gate transistors $S_1, S_2$ (reduce the leak current at the time of $SG_1=SG_2=0V$).

Further, the wiring layer 14 for the selection gate lines $SG_1, SG_2$ is formed continuous (the wiring layer 14 is made continuous in a portion between the selection gate transistors which are adjacent in a direction along the selection gate line) and the wiring layer 14 for each control gate line CG is divided between the memory cells (refer to the hatched portion in FIG. 36A). Therefore, in order to lower the damage to the wiring layer 14 of the selection gate line portion at the time of processing of the wiring layer 14 of the control gate line portion, the spaces Ssg1, Ssg2 mat be made larger than Scg12 to Scg78 in some cases.

Thus, in the conventional NAND cell, the line widths and spaces of and between the control gate lines CG(1) to CG(8) are regularly set (with the same dimensions), but the regularity of the wiring arrangement is not attained in an area (corresponding to an area above the control gate line CG(1) or below the control gate line CG(8) of FIG. 36A) other than the arrangement area of the control gate lines. Therefore, there occurs a problem that the processing for the control gate lines CG(1) and CG(8) on both end portions of the CG line arrangement portion becomes unstable in comparison with the control gate lines CG(2) to CG(7) which are arranged with the regularity with respect to the adjacent wirings, that is, the processing precision is lowered. If the processing precision is lowered, the line width of the control gate line adjacent to the selection gate line or the channel length of a corresponding memory cell varies depending on a variation in the processing precision.

The most serious problem occurring when the processing precision is lowered may occur in a case where the line widths of the control gate lines CG(1) and CG(8) on both end portions become smaller than the designed value. The problem is explained with reference FIGS. 38A, 38B. If the line width of the control gate line CG(1) is set to the designed value, as shown in FIG. 38A, no current (leak current IL) flows in a memory cell having "1" data (in a state in which negative charges are injected into the floating gate) when the gate voltage is 0V since the cut-off characteristic of the memory cell is good. If the line width of the control gate line CG(1) is made smaller than the designed value, a state in which a current IL always flows in the memory cell $M_1$ is obtained and "0" data is always read out irrespective of data programmed into the memory cell, that is, the amount of charges in the floating gate $14_1$ since the channel length of the memory cell $M_1$ becomes shorter and the cut-off characteristic of the memory cell is lowered (a leak current (refer to FIG. 38B) in a state in which it is originally turned OFF increases). Therefore, there occurs a problem that correct data cannot be programmed or read out. Like the case of the control gate line CG(1), the same problem occurs when the line width of the control gate line CG(8) is made smaller than the designed value. If all of the eight control gate lines are made wide in order to solve the above problem, a new problem that the memory size becomes larger occurs.

In the above NAND cell, conventionally, wiring structures shown in FIGS. 39A, 39B are used for connecting the selection gate line and the control gate line which extend from the inside portion of the memory cell array to the row decoder. Generally, when a contact for connection between different wiring layers is made, the wiring layer which is to be formed in contact with the other wiring layer is charged in the etching step due to RIE or the like to increase the absolute value of the potential of the wiring in some cases. At this time, since the wiring which is not connected to a pn junction has no current path in which a voltage drop occurs, a high potential is maintained. In this case, the control gate line corresponding to the control gate of the memory cell causes a problem.

Generally, in a memory cell such as a NAND type EEPROM, conventionally, the control gate line is not connected to the pn junction and a high potential is applied thereto in the manufacturing process. At the time of data programming or erasing, a potential as high as approx. 20V is applied between the control gate line and the p-type well region. Further, it is required to inject/discharge electrons into or from the floating gate by 100,000 times or more by use of a tunnel current. Thus, an extremely intense electric field is applied to an insulating film (corresponding to an oxide film between the wiring layer $16_i$ (i=1 to 8) and the wiring layer $14_i$ (i=1 to 8) and an oxide film between the wiring layer $14_i$ (i=1 to 8) and the p-type well region) between the control gate line and the p-type well region. In addition, since data is determined by charges stored in the floating gate, the charge storing characteristic of the floating gate becomes extremely important and discharging of charges from the floating gate due to the leak current cannot be permitted. Therefore, the reliability of the insulating film between the control gate line and the p-type well region is significantly important.

However, conventionally, the wiring is made by use of two types of wiring layers 22, 18 which are formed above the control gate line when the control gate line and selection gate line are connected to a transistor QN in the row decoder from the memory cell array. Therefore, the step of making a contact with the wiring layer $16_i$ used as the control gate line is effected twice in the manufacturing process (corresponding to (α) and (β) in FIG. 39A). In this case, the control gate line is charged at the time of contact processing of (α), and since the wiring layer $16_i$ and the wiring layer 22 are already connected together via the contact (α), the control gate line is also charged at the time of contact processing of (β). Therefore, the period in which the high voltage is kept applied to the control gate line becomes long and stress applied to the control gate line becomes large, thereby degrading the film quality of the oxide film. As a result, the reliability of data stored in the memory cell is lowered and the possibility of data destruction becomes stronger.

In the case of the selection gate line, since the voltage applied thereto is approx. 10 at maximum and it has no floating gate (the wiring layer $14_j$ (j=9, 10) is continuously arranged and a voltage is directly applied thereto inside or outside the memory cell array), normally, the reliability thereof is not lowered even if stress is somewhat applied thereto.

Thus, in the conventional semiconductor memory device such as the NAND cell type EEPROM, the processing precision for the block on the end portion of the memory cell array is lowered and there occurs a problem that the operation margin is lowered and the operation becomes defective.

Further, in the conventional semiconductor memory device such as the NAND cell type EEPROM, the processing precision for the control gate line adjacent to the selection gate line is lower than that for the other control gate line, and when the line width becomes smaller than the designed value, a problem that correct data cannot be programmed or read out occurs. Further, if the line widths of all of the control gate lines are uniformly made larger in order to solve this problem, a new problem that the memory cell size is increased occurs.

In addition, in the conventional semiconductor memory device such as the NAND cell type EEPROM, since stress applied to the control gate line in the manufacturing process is large, the reliability of an insulating film around the floating gate of the memory cell is lowered and the possibility of data destruction becomes stronger.

BRIEF SUMMARY OF THE INVENTION

This invention has been made in order to solve the above problems and an object of this invention is to provide a semiconductor memory device capable of preventing occurrence of a defect caused by a lowering in the processing precision for an end area of a memory cell array and realizing a chip in which the reliability of the operation is high and the manufacturing yield is high without substantially increasing the chip size.

Further, another object of this invention is to provide a semiconductor memory device capable of preventing occurrence of a word line with an extremely small line width due to a lowering in the processing precision caused by loss or disturbance of the regular (regular-interval) arrangement of wirings around the word line and realizing a chip in which the reliability of data programming/readout is high without significantly increasing the chip size.

Still another object of this invention is to provide a semiconductor memory device capable of lowering stress applied to a memory cell in the manufacturing process, reducing the pattern area of a row decoder and realizing an inexpensive chip in which the reliability of the operation is high and the manufacturing yield is high.

According to the present invention, there is provided a semiconductor memory device comprising: a memory cell array having: first blocks including first memory cell units each having a plurality of at least one memory cell; and second blocks including second memory cell units each having at least one memory cell connected; wherein the first blocks are arranged on both end portions of the memory cell array, the second blocks are arranged in the other portion, and the structure of the first memory cell units on the end portions of the memory cell array is different from that of the second memory cell unit.

According to the present invention, there is still provided a semiconductor memory device comprising: a memory cell array having memory cells or memory cell units formed by connecting at least one memory cell, the memory cells or memory cell units being arranged in an array form; wherein selection gate lines are formed by use of a mask having a data pattern in which the width of at least one of a word line and a selection gate line arranged on the end portion of the memory cell array is set larger than that of at least one of a word line and selection gate line arranged on the other portion of the memory cell array.

According to the present invention, there is further provided a semiconductor memory device comprising: a memory cell array having memory cells or memory cell units formed by connecting at least one memory cell, the memory cells or memory cell units being arranged in an array form; wherein at least one of a word line and a selection gate line arranged on the end portion of the memory cell array is formed with a larger width than at least one of a word line and selection gate line arranged the other portion of the memory cell array.

According to the present invention, there is still further provided a semiconductor memory device comprising: a memory cell array having memory cells or memory cell units formed by connecting a plurality of memory cells, the memory cells or memory cell units being arranged in an array form; a word line unit having a plurality of word lines each connected to corresponding ones of the memory cells; and selection gate lines each being connected to corresponding memory cells or memory cell units, wherein the word lines are formed by use of a mask having a data pattern in which the line widths of those of the word lines which are arranged on both end portions of the word line unit is set larger than those of the word lines adjacent thereto.

According to the present invention, there is further provided a semiconductor memory device comprising: a memory cell array comprising memory cell units arranged in an array form, the memory cell units each comprising at least one memory cell and at least one selection transistor; at least one selection gate line formed by continuously extending the gate of the at least one selection transistor; and control gate lines formed by continuously extending the gates of the memory cells; a row decoder for selecting the at least one selection gate line and the control gate lines to control the potentials thereof, the row decoder comprising transistors; first wirings for connecting the control gate lines to corresponding transistors in the row decoder, respectively; and at least one second wiring each for connecting corresponding one of the at least one selection gate line to a corresponding one of the transistors in the row decoder, wherein the first wirings are different in structure from the at least one second wiring.

According to the present invention, there is further provided a semiconductor memory device comprising: a memory cell array having memory cell units arranged in an array form, the memory cell units each being formed of at least one memory cell connected, and each having at least one selection transistor; selection gate lines formed by continuously extending gates of the selection transistors of the memory cell units; control gate lines formed by continuously extending gates of the memory cells of the memory cell units; and a row decoder for selecting the selection gate lines and control gate lines of the memory cell array to control the potentials thereof, the row decoder comprising transistors; wherein the selection gate line is connected to a corresponding transistor in the row decoder from the memory cell array by use of a first wiring layer which lies above all of the wiring layers used for connecting the control gate lines to corresponding transistors in the row decoder from the memory cell array.

According to the construction of this invention, occurrence of a defect caused by a lowering in the processing precision in the end portion of the memory cell array can be prevented by making a block in the end portion of the memory cell array different from the other block in construction. Further, since only the block in the end portion of the memory cell array is made different from the other blocks in construction, a chip having high manufacturing yield and high operation reliability can be attained without substantially increasing the chip size.

In order to make the construction of the first memory cell unit on the end side of the memory cell array different from the second memory cell unit, the first wiring may be formed by use of mask having a data pattern in which the first wiring is wider than a corresponding second wiring in the second memory cell unit.

Alternatively, the first wiring may be made wider than a corresponding second wiring in the second memory cell unit.

As the first wiring, a selection gate line may be used.

Further, in order to make the construction of the first memory cell unit on the end side of the memory cell array different from the second memory cell unit, for example, a space between the contact in the first memory unit and an adjacent wiring may be made larger than a space between the contact in the second memory unit and an adjacent wiring.

The construction of the first memory cell unit on the end side of the memory cell array may be made different from the second memory cell unit by providing a contact in the second memory cell unit and omitting a contact in a corresponding portion in the first memory cell unit. In this case, the operation reliability and manufacturing yield can be significantly enhanced.

More specifically, as the above contact, a contact formed on a node on the source side of the memory cell unit may be used.

Further, the first block may be used as a dummy block or redundancy block.

Further, according to the construction of this invention, in order to solve a problem caused by a lowering in the processing precision due to disturbance of the regular (regular-interval) arrangement of the wirings or the like, the designed value of the word line width is selectively changed.

More specifically, by setting the designed value of the line width of the control gate line adjacent to the selection gate line larger than the line width of the other control gate line, a degradation in the cut-off characteristic of the memory cell can be prevented even if the line width of the control gate line adjacent to the selection gate line becomes smaller than the designed value. Further, since those of the control gate lines in the NAND cell whose line widths must be increased are only two control gate lines adjacent to the selection gate lines, an increase amount in the memory cells is small. Therefore, a chip having high reliability in the data programming/readout operation can be attained without significantly increasing the chip size.

In the data pattern of the mask, the line widths of the word lines arranged on both ends of the word line group may be made larger than the line widths of the adjacent word lines.

Selection gate lines may be arranged adjacent to the word lines whose line widths are set larger in the data pattern of the mask.

A nonvolatile memory cell can be used as a memory cell and the control gate line formed above the floating gate can be used as the word line.

Further, according to the construction of this invention, since the number of times of operations for making a contact with the control gate line can be suppressed to one, stress applied to the control gate line in the manufacturing process can be reduced and the reliability of an insulating film around the floating gate can be enhanced. As a result, a chip having high operation reliability can be attained without increasing the chip size.

As a wiring layer used for connection of the control gate line extending from the end portion of the memory cell array to the transistor in the row decoder, a wiring layer formed below the second wiring layer can be used.

In the wiring length of a wiring layer used for connection of the control gate line extending from the end portion of the memory cell array to the transistor in the row decoder, it is preferable to occupy at least the half portion thereof by a wiring of the second wiring layer and, in the wiring length of a wiring layer used for connection of the selection gate line extending from the memory cell array to the transistor in the row decoder, it is preferable to occupy at least the half portion thereof by a wiring of the first wiring layer.

Further, according to the construction of this invention, since the number of times of operations for making a contact with the control gate line can be suppressed to one and a current path formed of a pn junction for preventing the control gate from being charged to a high voltage is formed in the contact forming step, stress applied to the control gate line in the manufacturing process can be reduced and the reliability of an insulating film around the floating gate can be enhanced. As a result, a chip having high operation reliability can be attained without increasing the chip size.

The selection gate line may be connected from the memory cell array to a transistor in the row decoder by use of a second wiring having no connection with the pn junction other than the source/drain of the transistor in the row decoder.

The uppermost wiring layer among the wiring layers constructing the first wiring can be formed of the same wiring layer as the uppermost wiring layer among the wiring layers constructing the second wiring, and in this case, both of the wiring layers can be formed in the same manufacturing step.

The uppermost wiring layer among the wiring layers constructing the first wiring can be formed of a wiring layer which is formed below the uppermost wiring layer among the wiring layers constructing the second wiring, and in this case, the first and second wirings can be formed in a superposed configuration and the pattern area can be reduced.

The first wiring can be connected to both of the p-type and n-type diffusion layers, and in this case, since a current path for discharging charges in either case wherein positive or negative charges are charged is formed when the wiring tends to be charged at the time of formation of a contact between the wirings in the manufacturing process, stress applied to the memory cell caused by charges in the etching process can be significantly reduced. Further, application stress can be more effectively reduced by using the forward current in the pn junction which is larger than the reverse current.

The first wiring can be formed of a wiring layer which is formed below a wiring layer capable of being directly connected to the wiring layer forming the control gate line in the memory cell array without using an additional intervening wiring layer.

The second wiring can be formed to include a wiring layer which is formed above a wiring layer capable of being directly connected to the wiring layer forming the control gate line in the memory cell array without using an additional intervening wiring layer.

For example, a NAND cell type EEPROM may be adequately used as the memory cell unit in this invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a pattern plan view showing one NAND cell portion of the memory cell array in a construction example of the block constructed by NAND-A cells shown in FIG. 1 and FIG. 3B is an equivalent circuit diagram thereof;

DETAILED DESCRIPTION OF THE INVENTION

There will now be described embodiments of this invention with reference to the accompanying drawings.

[First Embodiment]

Figure 1:
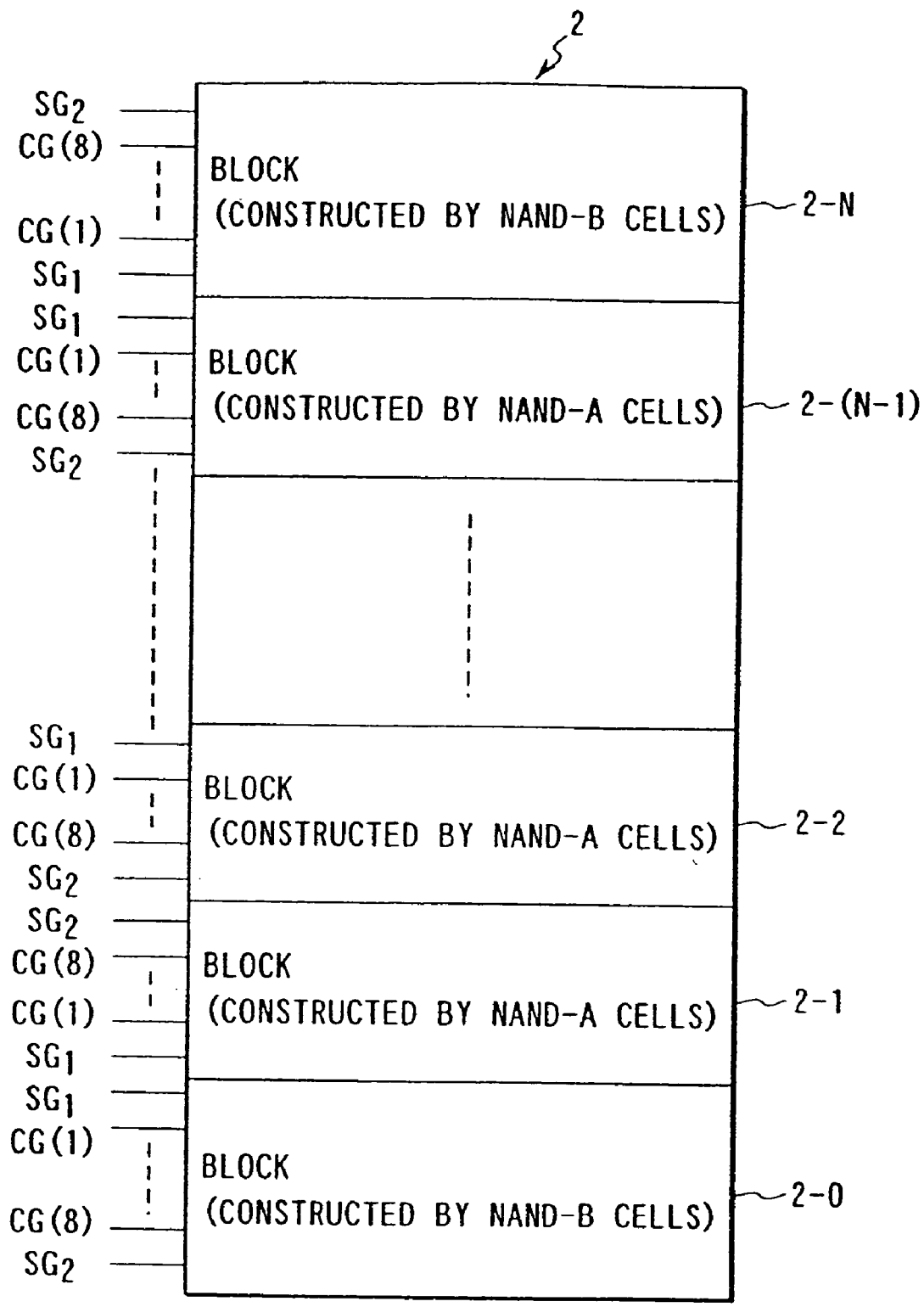
FIG. 1 is a diagram showing the block arrangement in a memory cell array of a NAND cell type EEPROM, for illustrating a semiconductor memory device according to a first embodiment of this invention.

FIG. 1 shows the block arrangement in a memory cell array of a NAND cell type EEPROM, for illustrating a semiconductor memory device according to a first embodiment of this invention. In FIG. 1, NAND cells (NAND-B cells) constructing blocks 2-0, 2-N on both end portions of a memory cell array 2 and NAND cells (NAND-A cells) constructing the other blocks 2-1 to 2-(N–1) inside the memory cell array 2 have different constructions. To each of the blocks 2-0 to 2-N, selection gate lines $SG_1$, $SG_2$ and control gate lines CG(1) to CG(8) are connected. According to a row address, a corresponding one of the blocks and a corresponding one of the rows of the NAND cells are selected so that a voltage can be supplied to the selection gate lines $SG_1$, $SG_2$ and control gate lines CG(1) to CG(8).

Figure 2:
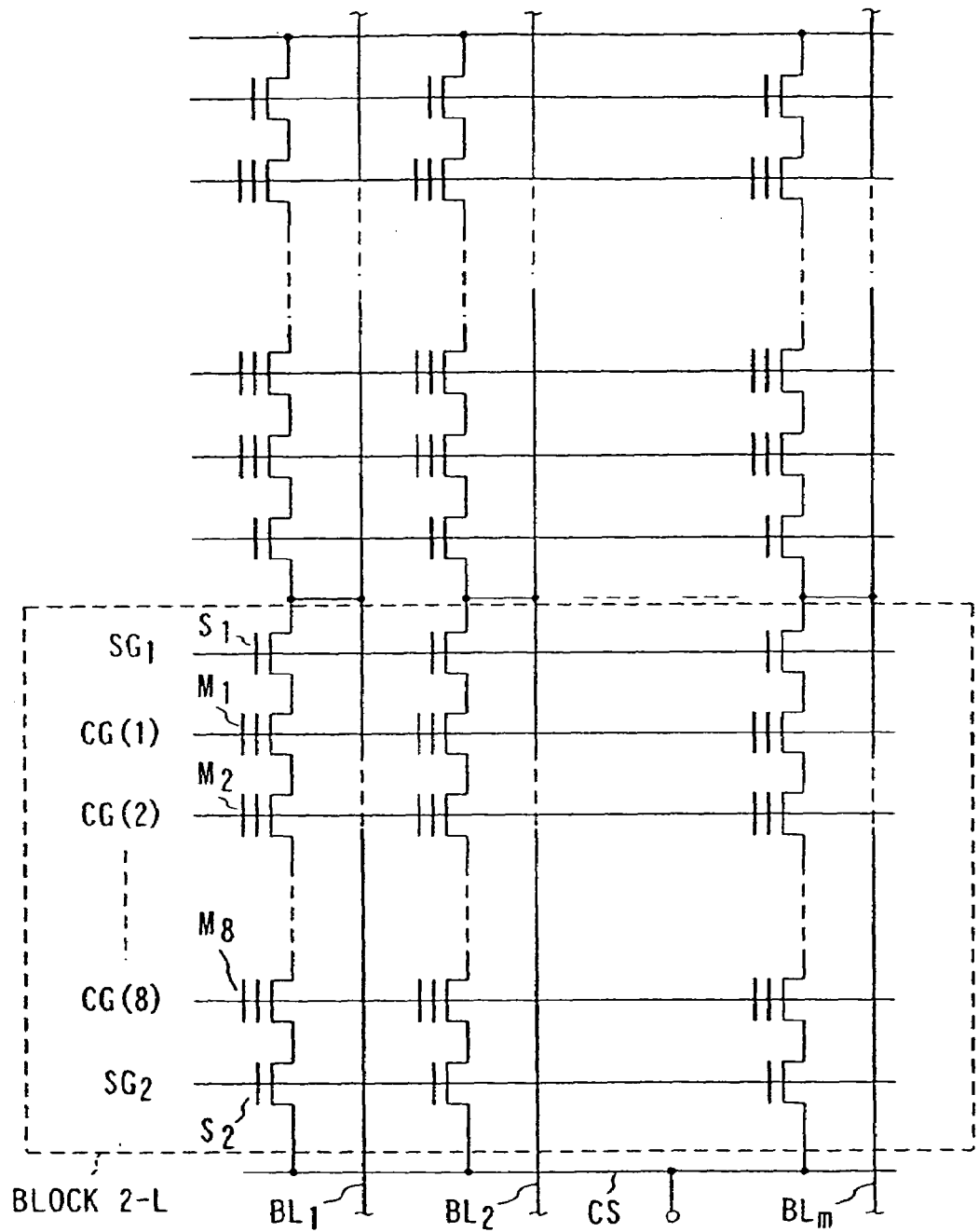
FIG. 2 is an equivalent circuit diagram of the memory cell array having NAND cells arranged in a matrix form.

FIG. 2 is an equivalent circuit diagram of the memory cell array 2 having NAND cells arranged in a matrix form. In this case, a NAND cell group commonly having the same word lines and selection gate lines is called a block and an area 2-L (L=0 to N) surrounded by broken lines in FIG. 2 is defined as one block. The block corresponds to each of the blocks 2-0 to 2-N shown in FIG. 1. The operation such as the readout/program operation is generally effected by selecting one block (which is called a selected block) from a plurality of blocks. The drain of the selection gate transistor $S_1$ of each NAND cell is connected to a corresponding one of bit lines $BL_1$, $BL_2$, ..., $BL_m$ and the source of the selection gate transistor $S_2$ is connected to the common source line CS. Memory cells $M_1$, $M_2$, ..., $M_8$ are serially connected between the source of the selection gate transistor $S_1$ and the drain of the selection gate transistor $S_2$.

Figure 4A:
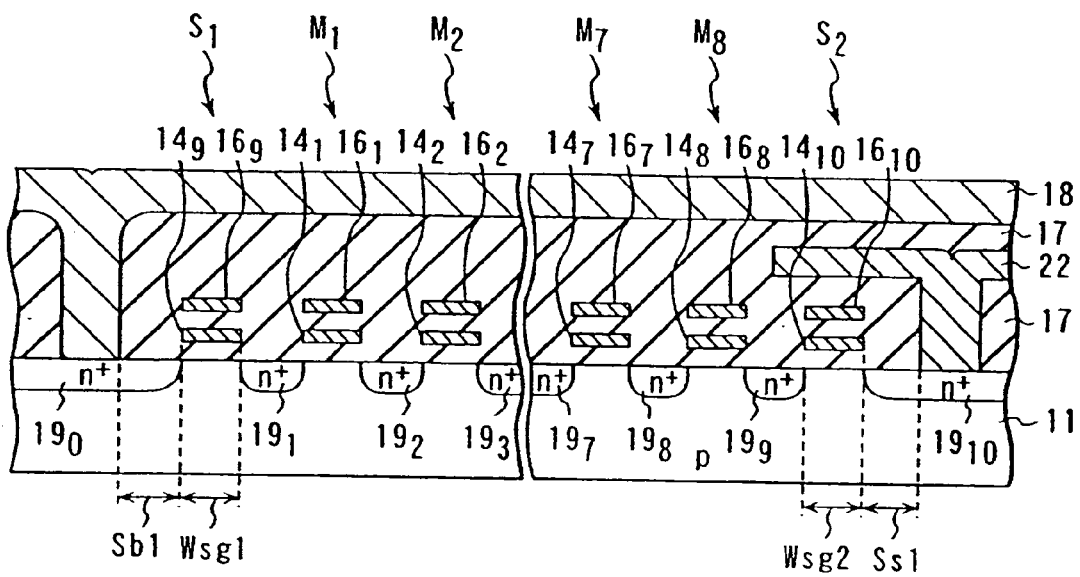
FIG. 4A is a cross sectional view taken along the A–A' line of FIG. 3A
Figure 4B:
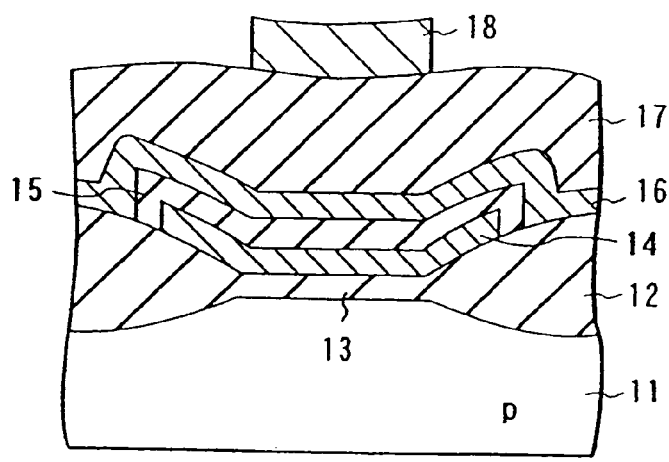
FIG. 4B is a cross sectional view taken along the B–B' line of FIG. 3A.

FIGS. 3A, 3B, 4A, 4B illustrate the NAND-A cell used for constructing each of the central blocks 2-1 to 2-(N–1) arranged in the central portion of the memory cell array 2 shown in FIG. 1. FIGS. 3A, 3B are a pattern plan view and equivalent circuit diagram showing one NAND cell portion shown in FIG. 2 and FIGS. 4A, 4B are cross sectional views taken along the A–A' line and the B–B' line of FIG. 3A. A memory cell array which is formed of a plurality of NAND cells is formed on a p-type silicon substrate (or a p-type well region) 11 surrounded by an element isolation oxide film 12. In this example, in each NAND cell, eight memory cells $M_1$, $M_2$, ..., $M_8$ are serially connected.

In each of the memory cells $M_1$, $M_2$, ..., $M_8$, a floating gate 14 ($14_1$, $14_2$, ..., $14_8$) is formed above the substrate 11 with a gate insulating film 13 formed therebetween and a control gate 16 ($16_1$, $16_2$, ..., $16_8$) is formed above the corresponding floating gate with a gate insulating film 15 formed therebetween. Further, n-type diffusion layers 19 ($19_1$, $19_2$, ..., $19_8$) used as the sources and drains of the memory cells are connected with the sources/drains of the adjacent memory cells commonly used so as to construct the series-connected memory cells $M_1$, $M_2$, ..., $M_8$.

Selection gates $14_9$, $16_9$ and $14_{10}$, $16_{10}$ which are respectively formed in the same steps as the floating gates and control gates of the memory cells are formed on the drain side and source side of the NAND cell. The selection gates $14_9$, $16_9$ and $14_{10}$, $16_{10}$ are electrically connected to each other in an area (not shown) and respectively used as the gate electrodes of the selection gate transistors $S_1$, $S_2$. The upper surface of the substrate 11 on which the elements are formed is covered with a CVD oxide film (inter-level insulating film) 17 and bit lines are formed on the CVD oxide film 17. The bit line 18 is formed in contact with a diffusion layer $19_0$ on the drain side of one end of the NAND cell. The control gates 14 of the NAND cells arranged in the row direction are respectively commonly arranged as the control gate lines CG(1), CG(2), ..., CG(8). The control gate lines are used as word lines. The selection gates $14_9$, $16_9$ and $14_{10}$, $16_{10}$ are also arranged continuously in the row direction and respectively used as the selection gate lines $SG_1$, $SG_2$. A wiring layer 22 for the source line is disposed between the bit line 18 and the wiring layer for the control gate line/selection gate and is formed in contact with a diffusion layer $19_{10}$ on the source side of the NAND cell (on the end opposite to the bit line contact portion).

Figures 5A, 5B:
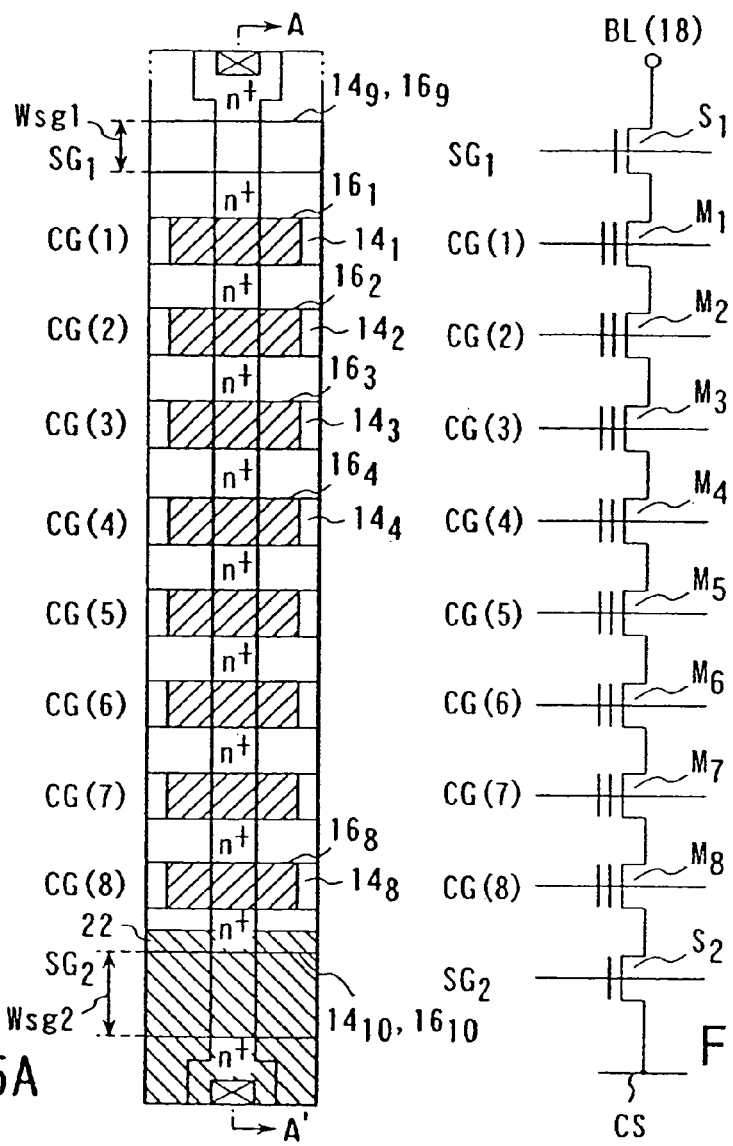
FIG. 5A is a pattern plan view showing one NAND cell portion of the memory cell in a construction example of the block constructed by NAND-B cells shown in FIG. 1
FIG. 5B is an equivalent circuit diagram thereof.
Figure 6:
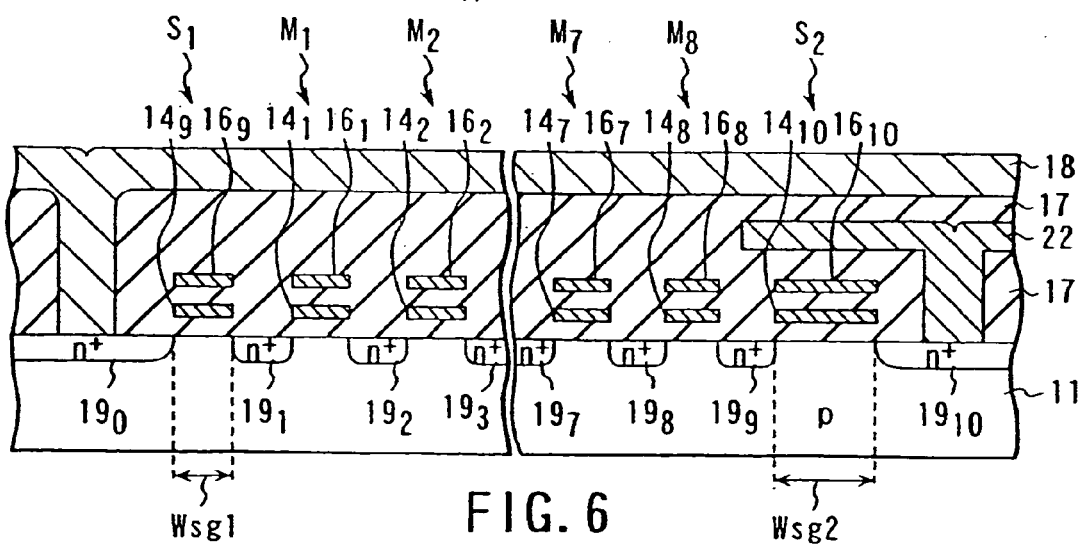
FIG. 6 is a cross sectional view taken along the A–A' line of FIG. 5A, for illustrating the construction example of the block constructed by NAND-B cells shown in FIG. 1.

FIGS. 5A, 5B, 6 illustrate a NAND-B cell used for constructing each of the blocks 2-0, 2-N on the end portion of the memory cell array shown in FIG. 1, FIGS. 5A and 5B being a pattern plan view showing one NAND cell portion shown in FIG. 2 and an equivalent circuit diagram thereof and FIG. 6 being a cross sectional view taken along the A–A' line of FIG. 5A. The NAND cell of FIGS. 5A, 5B, 6 is different from the NAND cell shown in FIGS. 3A, 3B, 4A, 4B in the dimension of the line width of the selection gate line $SG_2$.

That is, the line width of the selection gate line $SG_2$ in the NAND cell shown in FIGS. 5A, 5B, 6 is larger than that in the NAND cell shown in FIGS. 3A, 3B, 4A, 4B, that is, Wsg2 in FIG. 3A<Wsg2 in FIG. 5A.

Figure 34A:
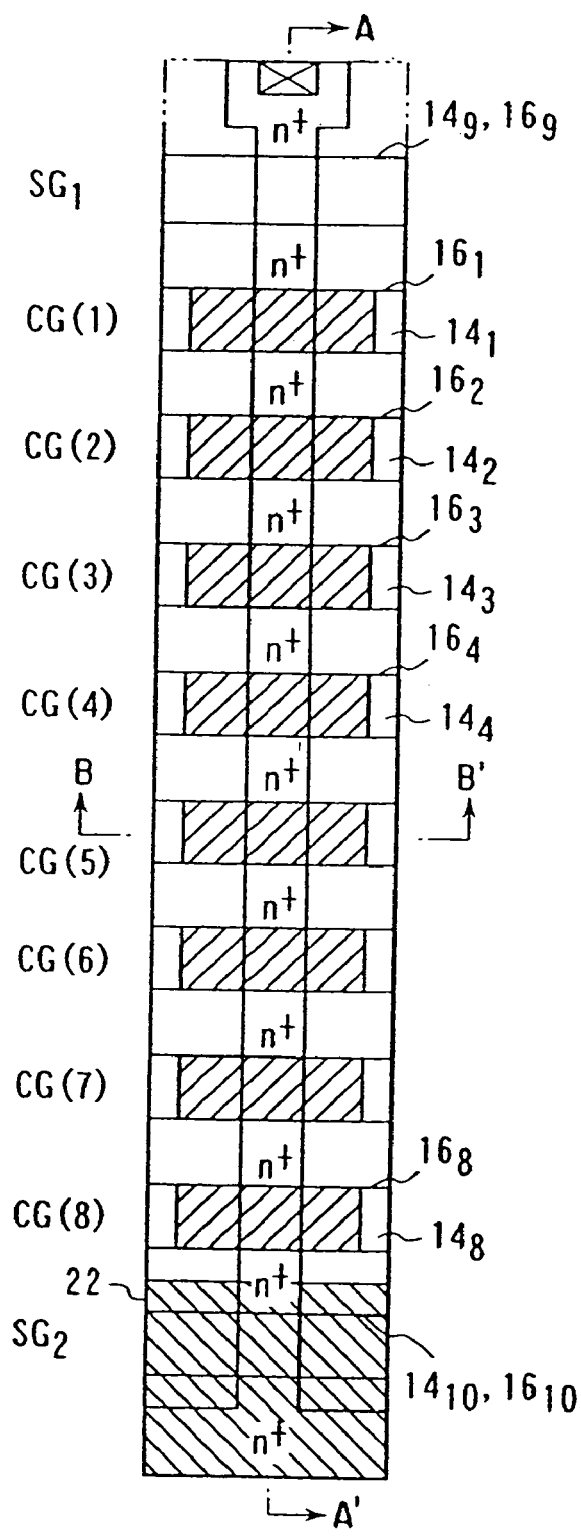
FIG. 34A is a pattern plan view specifically showing one NAND cell portion extracted from the circuit shown in FIG. 33
Figure 34B:
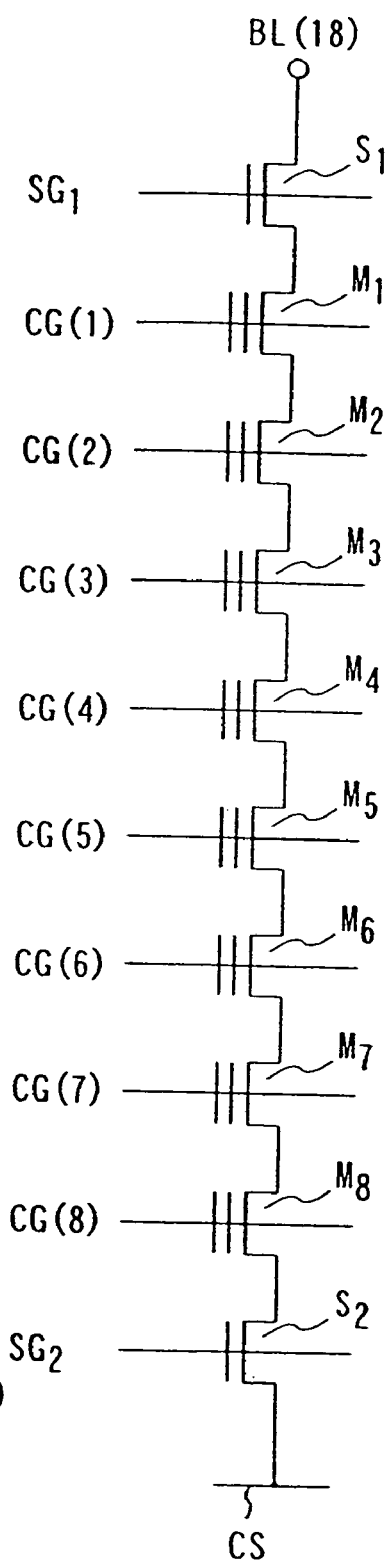
FIG. 34B is an equivalent circuit diagram thereof.
Figure 35A:
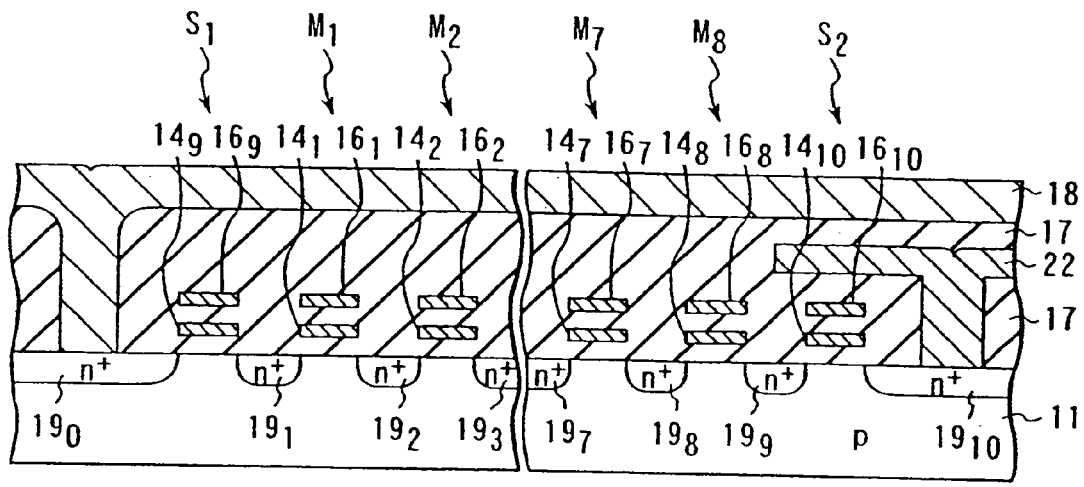
FIGS. 35A, 35B are views each specifically showing one NAND cell portion extracted from the circuit shown in FIG. 33, FIG. 35A being a cross sectional view taken along the A–A' line of the pattern shown in FIG. 34A and FIG. 35B being a cross sectional view taken along the B–B' line of FIG. 34A.
Figure 35B:
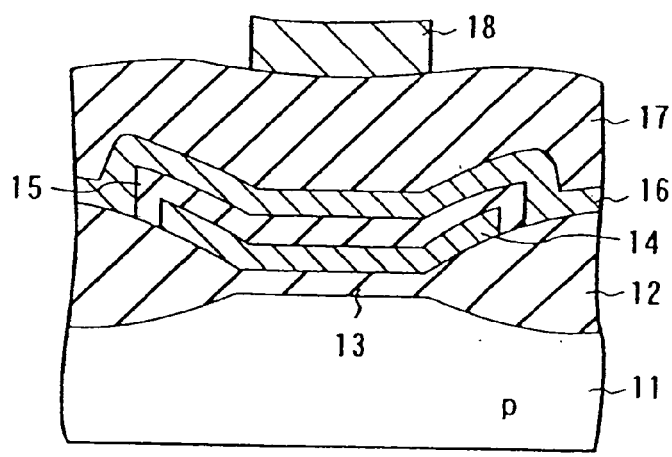

Thus, the cell size or the length of the NAND cell in the lengthwise direction (corresponding to the length of the cross section taken along the A–A' line in FIGS. 3A, 5A) becomes slightly larger than that of the NAND cell shown in FIGS. 3A, 3B, 4A, 4B. The line width of the selection gate line $SG_2$ shown in FIGS. 5A, 5B, 6 is set to such a width which does not cause breakage thereof even if the processing precision is lowered. With this construction, a problem of breakage of the selection gate line $SG_2$ in each of the blocks 2-0, 2-N arranged on the end portion of the memory cell array 2 can be solved. Further, the cell shown in FIGS. 3A, 3B, 4A, 4B which is smaller in cell size than the cell shown in FIGS. 5A, 5B, 6 is used in the other blocks 2-1 to 2-(N–1) in the memory cell array 2. Therefore, the difference in length in view of the direction parallel to the bit lines between this invention shown in FIG. 1 and the conventional cell array shown in FIG. 34 can be expressed as follows:

[NAND cell size of FIG. 3A–NAND cell size of FIG. 5A]×2

Generally, since the number of blocks is several hundreds to several thousands, the rate of occupancy by the above difference in the whole cell size is extremely small and the above difference is made as small as negligible. That is, according to the first embodiment, the reliability of the operation of the chip can be enhanced without substantially increasing the chip size.

In the first embodiment, a method for preventing breakage of the selection gate line $SG_2$ in each of the blocks 2-0, 2-N on the end portion of the memory cell array by setting Wsg2 of NAND-A cell<Wsg2 of NAND-B cell is explained, but this invention is not limited to the above first embodiment and can be variously modified. If modifications described below are used, the reliability of the operation of the chip and the manufacturing yield thereof can be enhanced without substantially increasing the chip size for the same reason as described above.

For example, if the space between the selection gate line $SG_2$ and the source line contact is set to Ss1 (refer to FIGS. 3A, 4A) and when the relation of Ss1 in NAND-A cell<Ss1 in NAND-B cell is set in the case of FIG. 1 and the processing precision of the block in the end portion of the cell array is lowered to make the line width of the selection gate line $SG_2$ larger, the possibility of the short circuit between the selection gate line $SG_2$ and the source line contact can be extremely lowered since the space Ss1 between the selection gate line $SG_2$ and the source line contact is large. This method is extremely effective and a chip with high reliability can be realized.

Figures 7A, 7B:
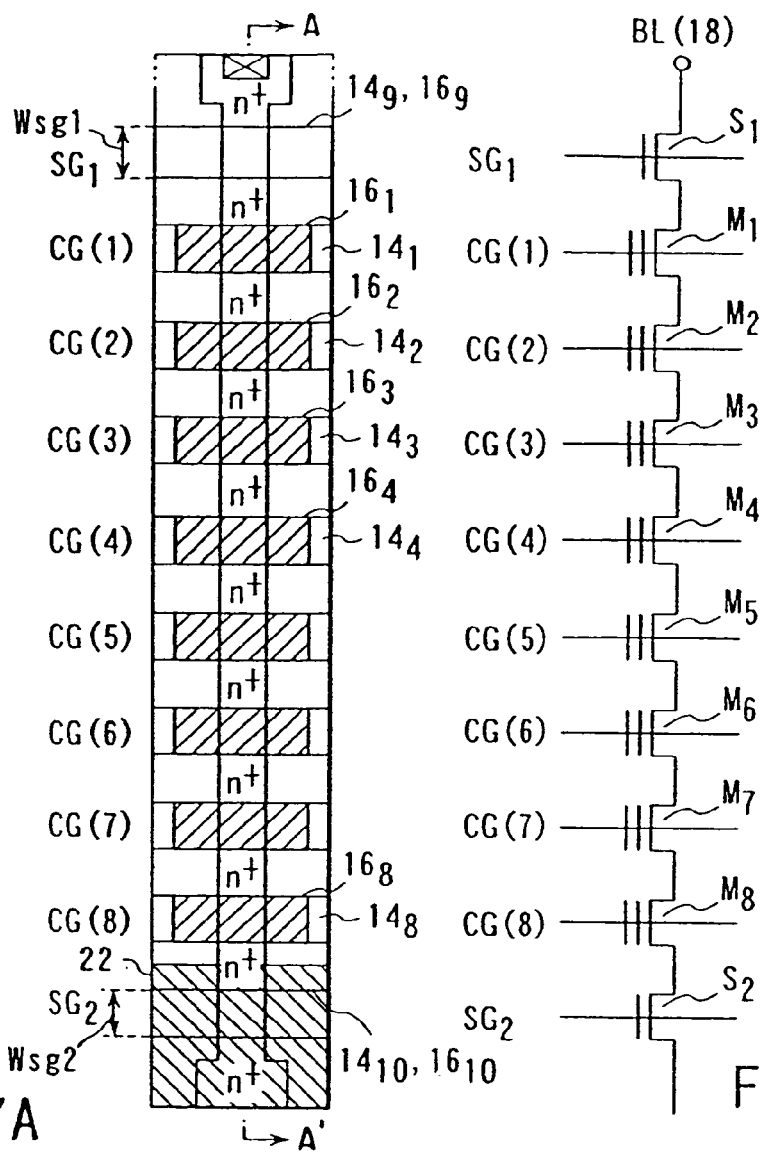
FIG. 7A is a pattern plan view showing one NAND cell portion of the memory cell in another construction example of the block constructed by NAND-B cells shown in FIG. 1
FIG. 7B is an equivalent circuit diagram thereof.
Figure 8:
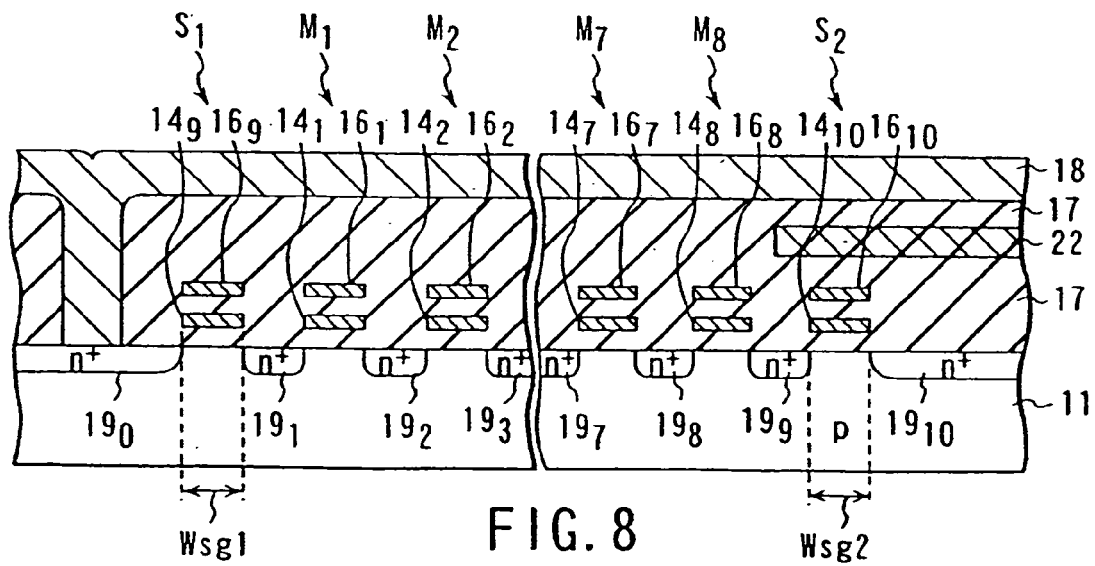
FIG. 8 is a cross sectional view taken along the A–A' line of FIG. 7A.

Further, as shown in FIGS. 7A, 7B, 8, a system for using a NAND cell from which the source line contact is omitted as the NAND-B cell (blocks 2-0, 2-N) in FIG. 1 and using the NAND cell shown in FIGS. 3A, 3B, 4A, 4B as the NAND-A cell (blocks 2-1 to 2-(N-1)) can be provided. In this case, since the source line contact is not present in the block on the end portion of the cell array, the possibility of the short circuit between the selection gate line $SG_2$ and the source line contact can be eliminated even if the processing precision of the block on the end portion of the cell array is lowered to increase the line width of the selection gate line $SG_2$.

In FIGS. 7A, 7B, 8, the source line contact is removed, but the wiring layer 22 for the source line is left behind. No problem occurs irrespective of the presence or absence of the wiring layer 22 and whether the wiring layer 22 is necessary or not is determined from the viewpoint of the processing precision of the wiring layer 22. That is, this invention is effective irrespective of the presence or absence of the wiring layer 22.

Figure 9:
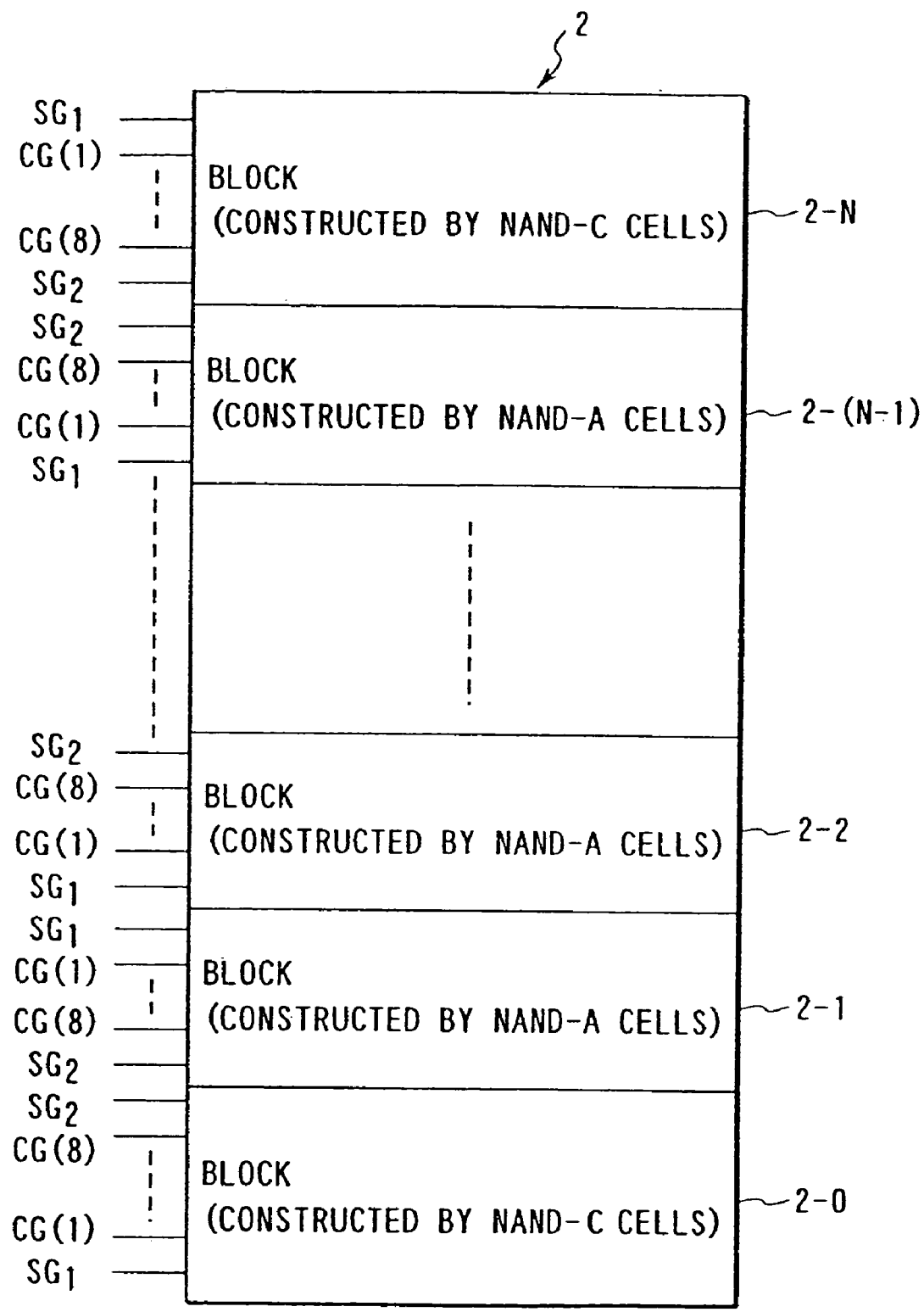
FIG. 9 is a diagram showing the other block arrangement of the memory cell array in the NAND cell type EEPROM.

Further, in the first embodiment, this invention is explained by taking a case wherein the blocks of the memory cell array are arranged as shown in FIG. 1 as an example, but this invention can also be applied to another case, for example, a case wherein the blocks of the memory cell array are arranged as shown in FIG. 9.

That is, the selection gate line $SG_2$ is formed as the wiring on the end portion of the memory cell array in the case of FIG. 1, but in the case of FIG. 9, the selection gate line $SG_1$ is formed. In this case, if the wiring width of the selection gate line $SG_1$ is set to Wsg1, breakage of the selection gate line $SG_1$ in the block on the end portion of the memory cell array can be prevented by setting the relation of Wsg1 in NAND-A cell<Wsg1 in NAND-C cell. Further, the space between the selection gate line $SG_1$ and the bit line contact is set to Sb1, the possibility of the short circuit between the selection gate line $SG_1$ and the bit line contact can be extremely lowered by setting the relation of Ss1 in NAND-A cell<Ss1 in NAND-C cell in the case of FIG. 9 like the case of the first embodiment even if the processing precision of the block in the end portion of the cell array is lowered to make the selection gate line $SG_1$ wider.

Figures 10A, 10B:
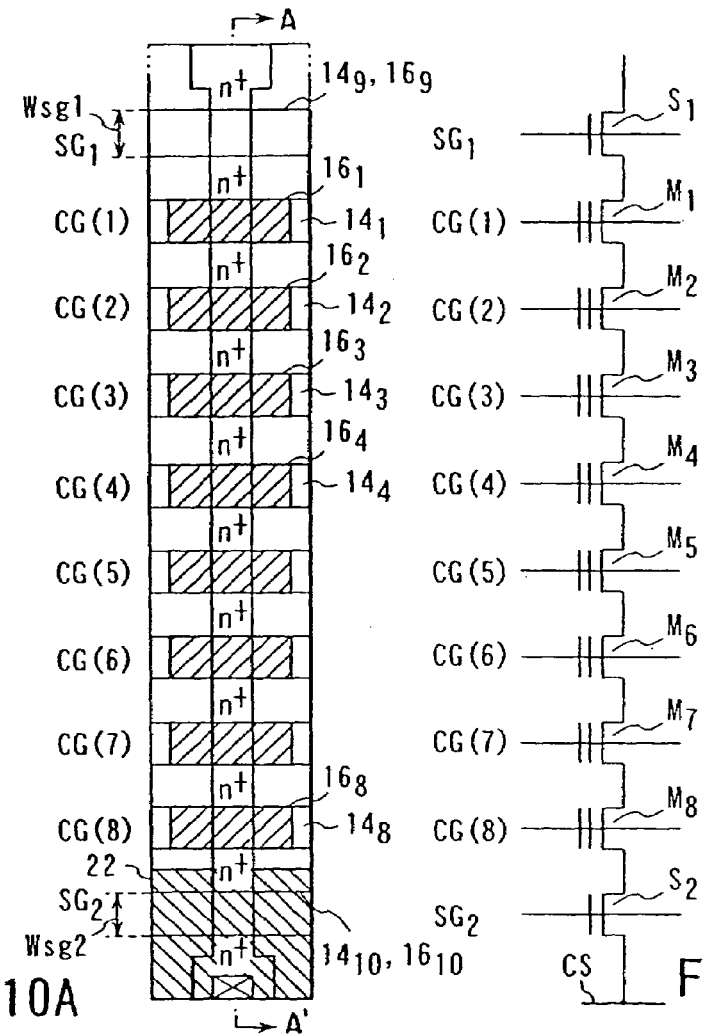
FIG. 10A is a pattern plan view showing one NAND cell portion of the memory cell in still another construction example of the block constructed by NAND-C cells shown in FIG. 9
FIG. 10B is an equivalent circuit diagram thereof.
Figure 11:
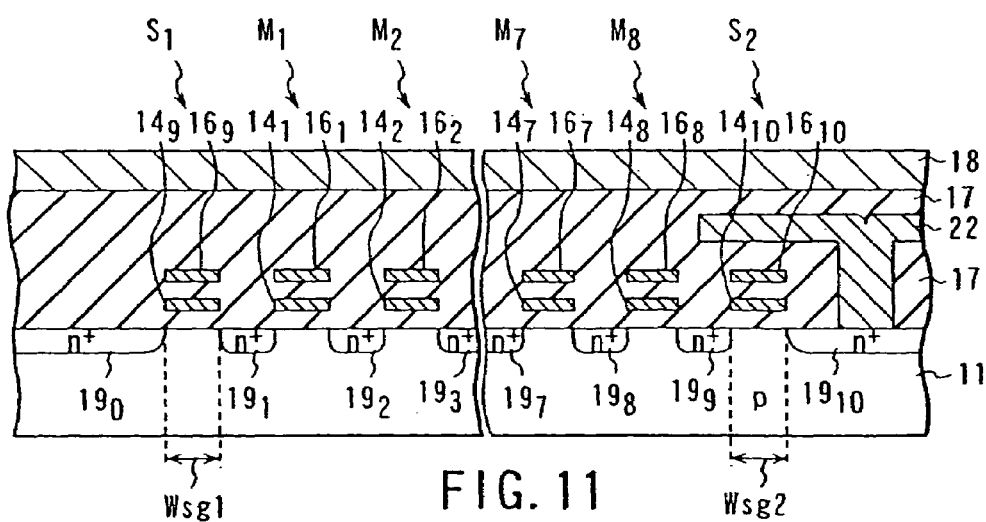
FIG. 11 is a cross sectional view taken along the A–A' line of FIG. 10A.

As shown in FIGS. 10A, 10B, 11, by removing the bit line contact in the block on the end portion of the cell array, the possibility of the short circuit between the selection gate line $SG_1$ and the bit line contact can be eliminated even if the processing precision of the blocks 2-0, 2-N on the end portions of the cell array is lowered to make the selection gate line $SG_1$ wider.

The above modifications relating to the first embodiment can be made significantly effective by various combining them.

For example, in a case where the cell shown in FIGS. 3A, 3B, 4A, 4B is used as the NAND-A cell and a combination of the cell shown in FIGS. 5A, 5B, 6 and the cell shown in FIGS. 7A, 7B, 8 is used as the NAND-B cell in the block arrangement of FIG. 1, that is, in a case where the relation of Wsg2 in NAND-A cell<Wsg2 in NAND-B cell is set and the NAND-B cell from which the source line contact is removed is used, the reliability of the operation and the manufacturing yield can be significantly enhanced.

Likewise, in a case where the cell shown in FIGS. 3A, 3B, 4A, 4B is used as the NAND-A cell, the NAND-C cell from which the bit line contact is removed (refer to FIGS. 10A, 11) is used, and the relation of Wsg1 in NAND-A cell<Wsg1 in NAND-B cell is set in the block arrangement of FIG. 9, the reliability of the operation and the manufacturing yield can be significantly enhanced.

Figure 12:
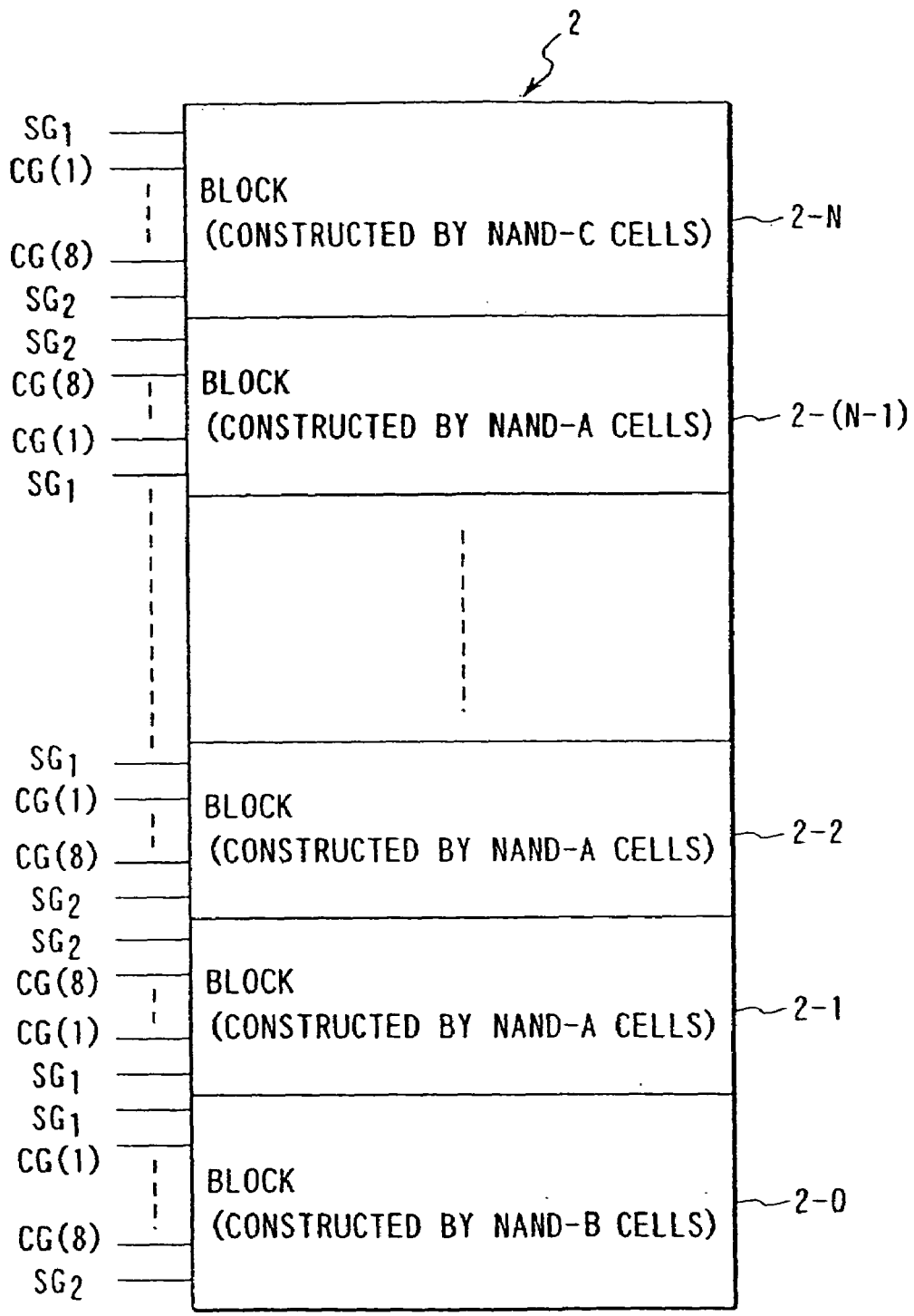
FIG. 12 is a diagram showing the still other block arrangement of the memory cell array in the NAND cell type EEPROM.
Figure 13:
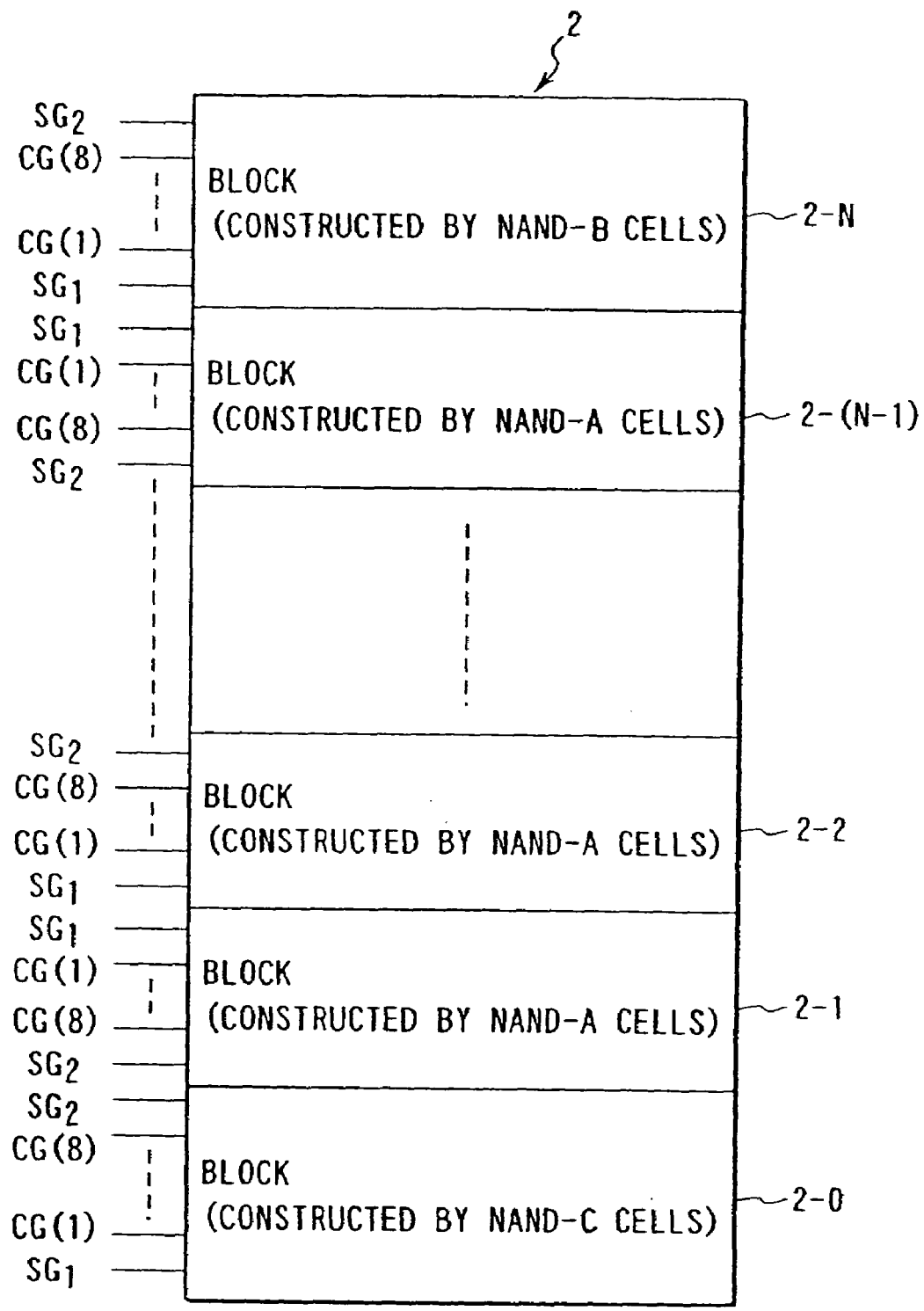
FIG. 13 is a diagram showing the other block arrangement of the memory cell array in the NAND cell type EEPROM.

Further, in the first embodiment, the wirings on the upper and lower end portions of the memory cell array are the same, that is, the selection gate line $SG_2$ is used as each of the wirings on the upper and lower end portions in the arrangement of FIG. 1 and the selection gate line $SG_1$ is used as each of the wirings on the upper and lower end portions in the arrangement of FIG. 9, but this invention can be made effective in a case other than the above cases. For example, this invention is effective in a case where the wirings on the upper and lower end portions of the memory cell array are respectively formed of the selection gate lines $SG_1$, $SG_2$ (refer to FIG. 12) or the selection gate lines $SG_2$, $SG_1$ (refer to FIG. 13) and thus they are different from each other on the upper and lower end portions and this invention can be applied to a combination of the above modifications. In this case, the blocks may be divided into three blocks by respectively using the NAND-B block and NAND-C block as the blocks 2-0, 2-N on the upper and lower end portions of the memory cell array and using the NAND-A blocks as the other blocks.

Figure 14:
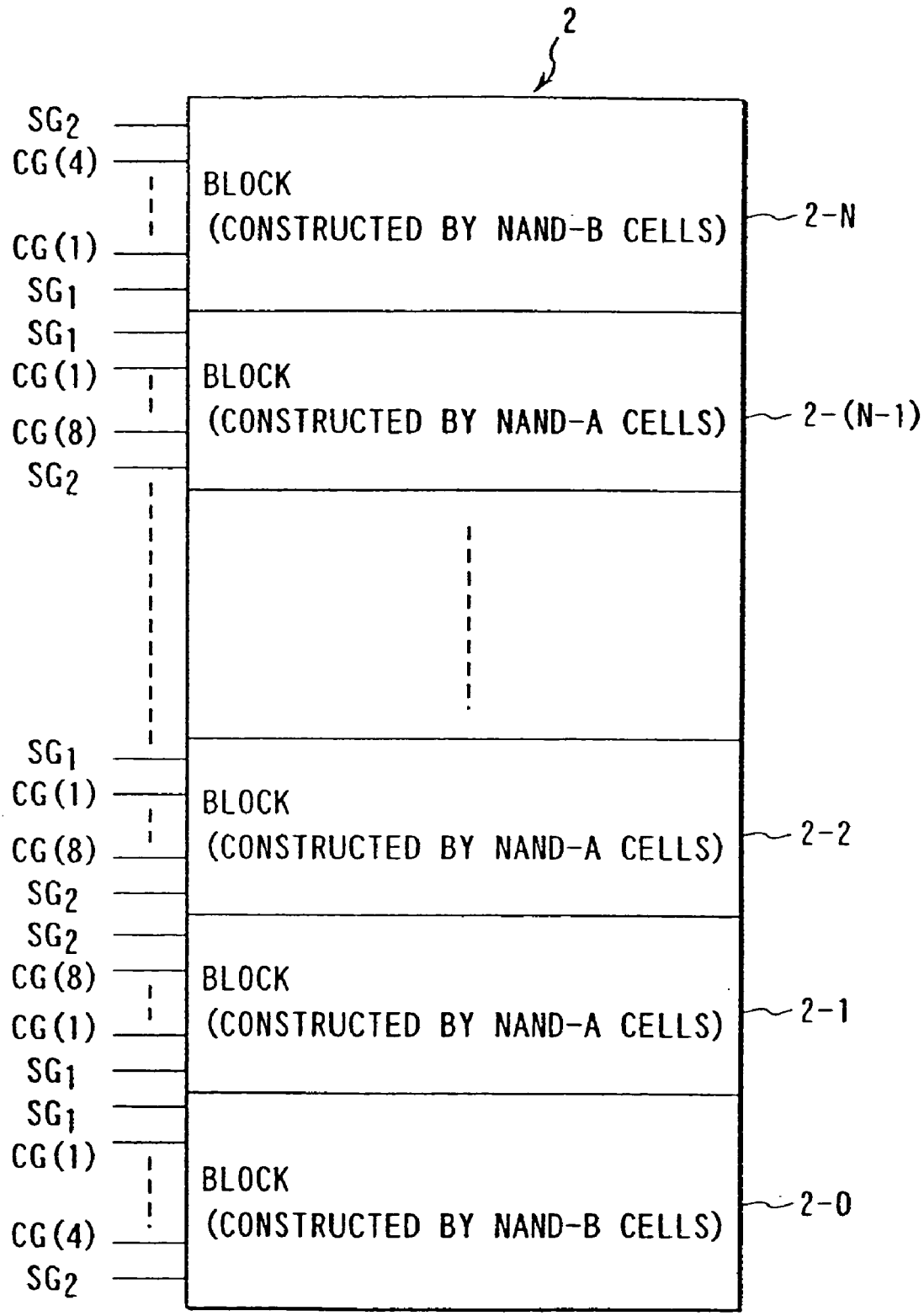
FIG. 14 is a diagram showing the still other block arrangement of the memory cell array in the NAND cell type EEPROM.
Figure 15:
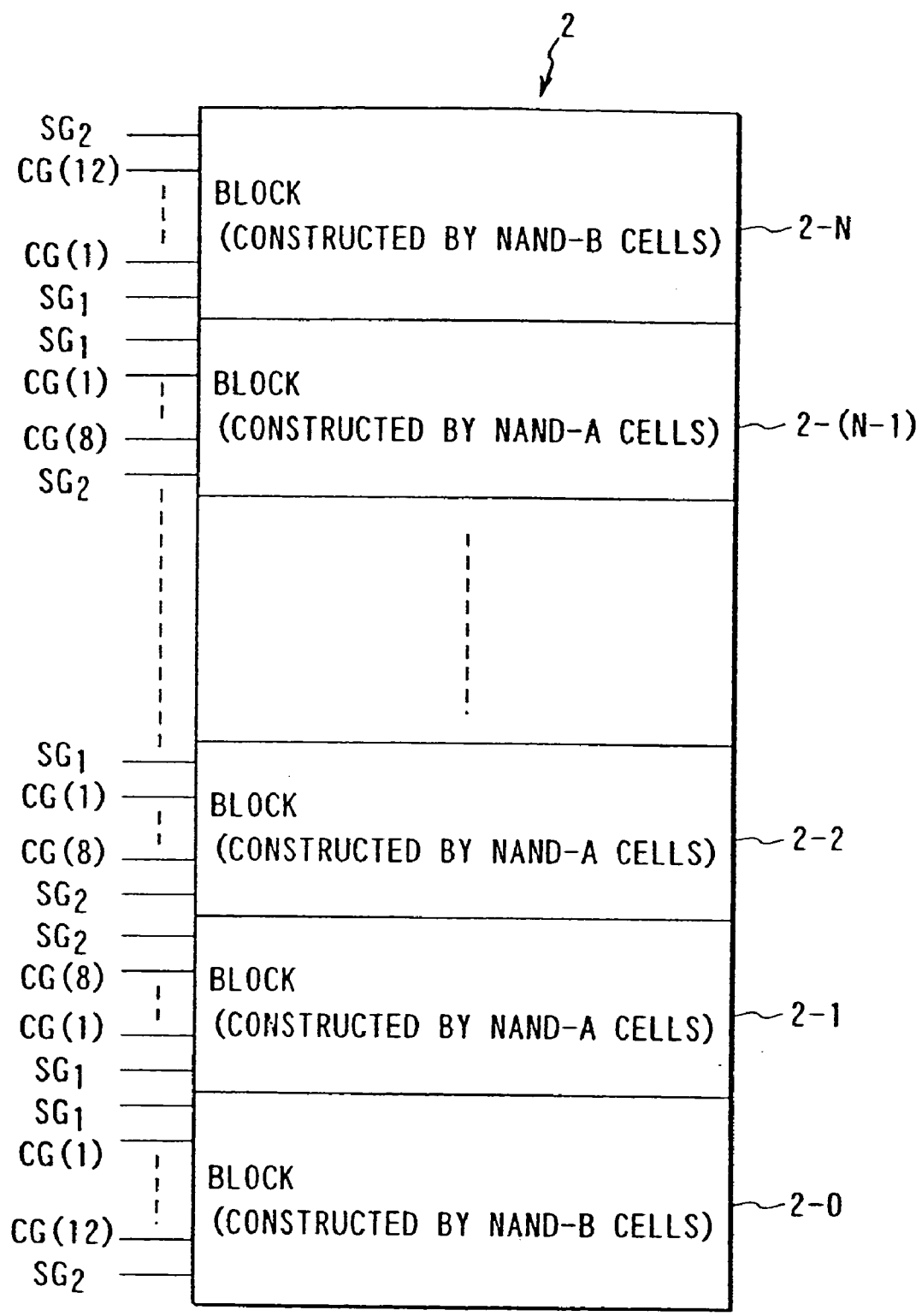
FIG. 15 is a diagram showing the other block arrangement of the memory cell array in the NAND cell type EEPROM.

In the first embodiment, this invention is explained by taking a case wherein the numbers of the control gate lines and word lines in the blocks 2-0, 2-N on the end portions of the memory cell array are the same as those in the other blocks as an example, but this invention is not limited to this case. The block on the end portion of the memory cell array is a block (non-use block) which is not normally used (which is not used for data programming/readout) and it is not necessary to set the number of wirings to the same number as that in the blocks (use blocks) which are actually used, and it is sufficient to set wirings of a number which does not cause the processing precision for the adjacent block to be lowered. For example, in FIG. 1, the blocks on the end portions are provided in order to maintain the processing precision of the blocks 2-1, 2-(N−1) adjacent to the blocks on the end portions of the cell array among the use blocks 2-1 to 2-(N−1) and it is sufficient to provide the minimum number of wirings which maintains the processing precision in each of the blocks. For example, according to the processing precision, the number of control gate lines in the block on the end portion of the cell array is set to four which is smaller than in the other block (refer to FIG. 14) or the number of control gate lines is increased to twelve in order to enhance the processing precision (refer to FIG. 15) and thus various modifications can be made.

In the first embodiment, a case wherein the wiring for the selection gate line on the end portion of the memory cell array is made wide or the surrounding portion of the contact of the end portion of the cell array is modified is explained as an example, but this invention can be applied to other cases, for example, a case wherein the adjacent control gate line is also made wide in addition to the selection gate line on the end portion of the cell array or a case wherein the wirings in the block on the end portion of the cell array are all made wide.

In the NAND cell, at least one of the selection transistors $S_1$, $S_2$ must be kept in the OFF state at the time of non-selection of the block; otherwise, the bit line and the source line are short-circuited to each other, thereby causing a defect. According to the operation system, only the selection transistor $S_1$ may be kept in the OFF state or only the selection transistor $S_2$ may be kept in the OFF state in the non-selected block. A problem which is particularly serious in the prior art case occurs a case of FIG. 9 wherein the selection gate line $SG_1$ is formed on the end portion of the memory cell array when the operation system for setting only the selection transistor $S_1$ in the OFF state is used or a case of FIG. 1 wherein the selection gate line $SG_2$ is formed on the end portion of the memory cell array when the operation system for setting only the selection transistor $S_2$ in the OFF state is used. In the above cases, the selection gate line on the end portion of the memory cell array may be made narrow and cut off due to a variation in the processing precision and the bit line and the source line are short-circuited to each other to make a defect by a deterioration of the cut-off characteristic caused by a reduction in the channel length of the selection transistor. By applying this invention to the above cases, since the line width of the selection gate line on the end portion of the memory cell array is made large, the selection transistor can be stably turned OFF, thereby making it possible to prevent occurrence of the defect.

As described above, the line width of the selection gate line on the end portion of the memory cell array can be made large by using the system for setting the line width of the selection gate line on the end portion of the memory cell array larger than the other selection gate line on the data pattern of the selection gate processing mask. Further, this invention is effective in a case where the line width of the selection gate line on the end portion of the memory cell array is made large by use of other methods.

Further, a variation in the line width of the selection gate line on the end portion of the memory cell array is small after processing the selection gate line, but the ratio of the line width thereof after the processing to the line width of the selection gate line on the mask is always made lower in comparison with the other selection gate line width in some cases because the regular arrangement of the wirings (the arrangement of the wirings at regular intervals) is not attained. That is, this is a case wherein the line width of the selection gate line on the end portion of the memory cell array always becomes smaller than the other selection gate line width when all of the selection gate lines have the same line width on the data pattern of the mask. In this case, it is effective to use a system for setting the line width of the selection gate line on the end portion of the memory cell array larger than the other selection gate line width on the data pattern of the mask so as to set all of the selection gate line widths after the processing to the same value. Since all of the selection gate line widths are set to the same value, the channel lengths of the selection transistors in all of the NAND cells are set to the same value and occurrence of the defect caused by the short circuit between the bit line and the source line can be prevented.

Further, in the first embodiment, a case wherein the line widths of the selection gate lines $SG_1$, $SG_2$ in the NAND cell other than that in the block on the end portion of the memory cell array are set to the same width is explained as an example, but this invention is not limited to this case. For example, even if the line widths of the selection gate lines $SG_1$, $SG_2$ in the NAND cell other than that in the block on the end portion of the memory cell array are different, the system for making the line width of the selection gate line $SG_1$ on the end portion of the cell array larger than the line width of the other selection gate line $SG_2$ on the data pattern of the mask can be effectively used when the wiring on the end portion of the cell array is the selection gate line $SG_1$. Likewise, the system for making the line width of the selection gate line $SG_2$ on the end portion of the cell array larger than the line width of the other selection gate line $SG_2$ on the data pattern of the mask can be effectively used when the wiring on the end portion of the cell array is the selection gate line $SG_2$ and this invention can be applied to this case.

The block on the end portion of the memory cell array is normally provided to enhance the processing precision of other blocks and maintain the regular (regular-interval) arrangement of the wirings in the block other than the block on the end portion of the cell array in the memory cell array. In this case, a lowering in the processing precision of the selection gate line and control gate line in the block on the end portion of the cell array will occur, and therefore, the block on the end portion of the cell array may be used as a dummy block (a block which is not generally used as a data storing area and is provided only to enhance the processing precision, cannot be selected and cannot be used in place of another block). Particularly, the block (corresponding to FIGS. 8, 11) from which the source line contact and bit line contact on the end portion of the cell array are omitted is used as a dummy block in the first embodiment since the normal data storing/readout operation cannot be effected. If the contacts with the bit lines and source lines are left behind in the block on the end portion of the cell array and the number of control gate lines in the block is the same as that in the other block, it is possible to use the block on the end portion of the cell array as a redundancy block, that is, a replaceable block (a block which can be replaced by a defective block by cutting off the fuse) which can be used instead of a defective block. In a case where the block is used as a redundancy cell block, a method for recognizing the operation of the redundancy block on the end portion of the memory cell array after the chip is manufactured, using the block as a redundancy block if the operation is normal, and using the block as a dummy block if the operation is abnormal can be used. As a result, the number of redundancy blocks can be increased according to the processed state of the block on the end portion of the cell array, thereby making it possible to attain an extremely significant effect. By using this invention, the processed state of the block on the end portion of the cell array can be significantly improved in comparison with the conventional case and this invention can be made extremely effective when the block is used as the redundancy block. Thus, this invention can be applied to a case where the block on the end portion of the cell array is used as the dummy block or redundancy block.

[Second Embodiment]

Next, a semiconductor memory device according to a second embodiment of this invention is explained. In the first embodiment, a lowering in the processing precision of the block on the end portion of the memory cell array is dealt with as a problem, but in the second embodiment, a lowering in the processing precision caused by disturbance of the regular arrangement of wirings around the word line in one NAND cell is prevented.

Figure 16A:
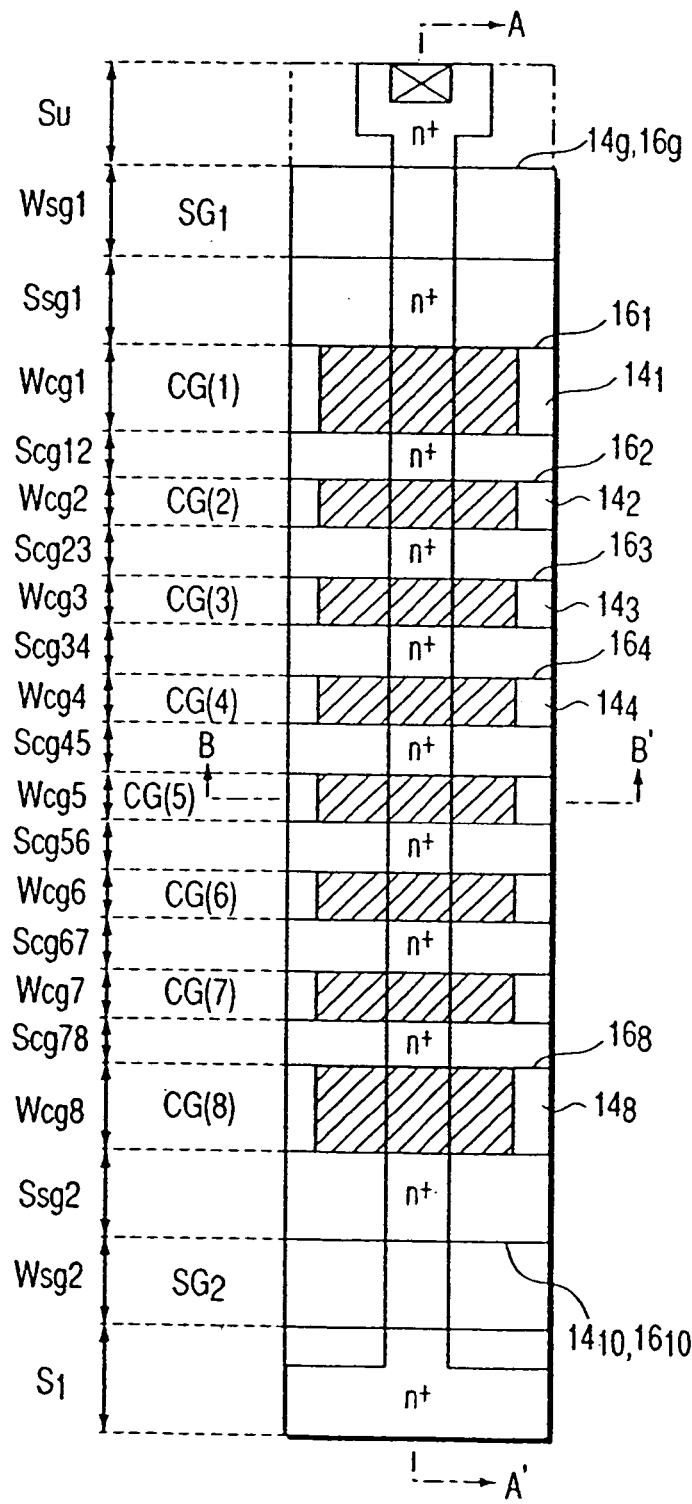
FIG. 16A is a pattern plan view showing one NAND cell portion of a memory cell array in a semiconductor memory device according to a second embodiment of this invention and FIG. 16B is an equivalent circuit diagram thereof.
Figure 16B:
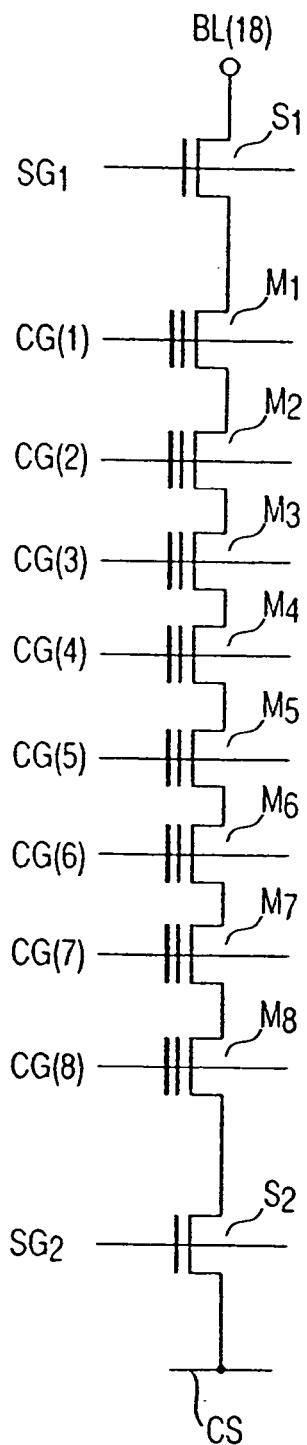
Figure 17A:
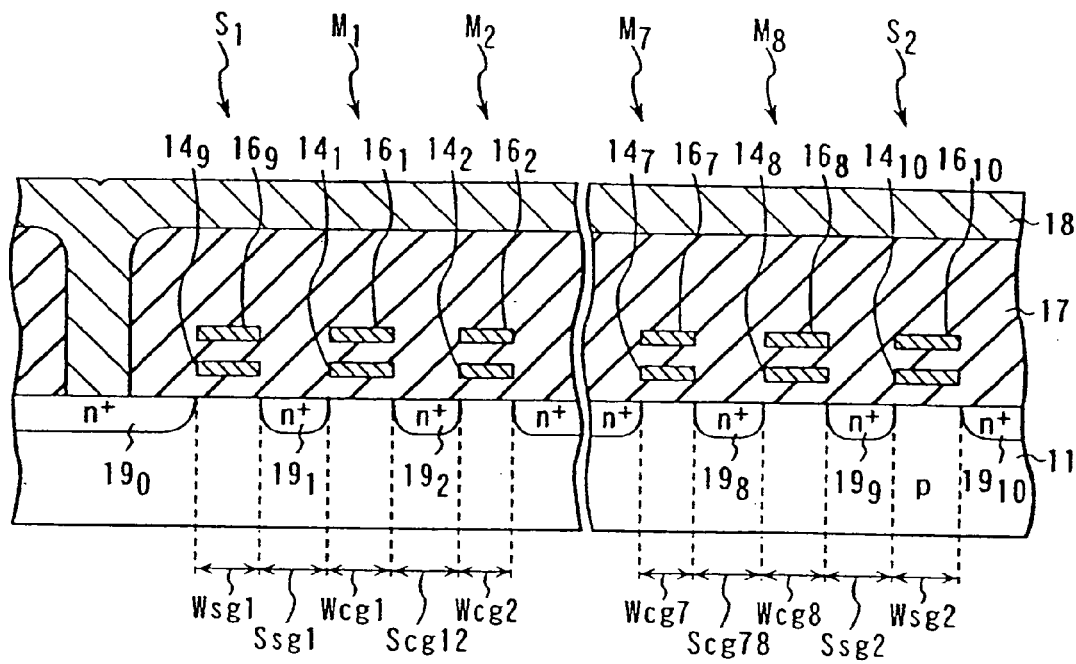
FIG. 17A is a cross sectional view taken along the A–A' line of FIG. 16A
Figure 17B:
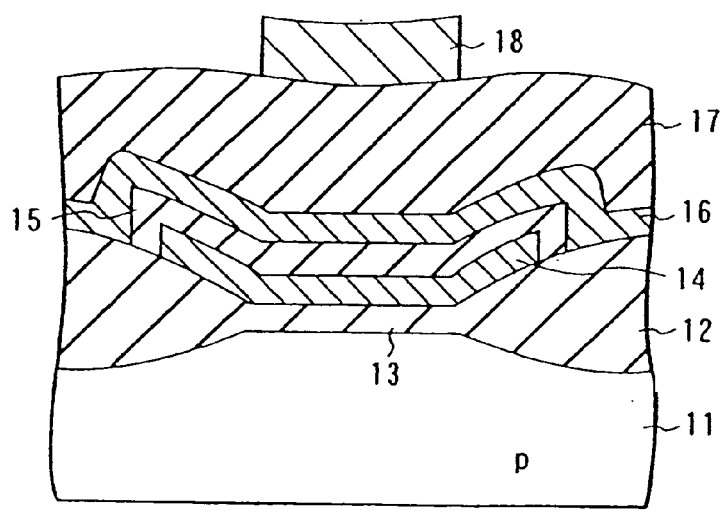
FIG. 17B is a cross sectional view taken along the B–B' line of FIG. 16A.

FIGS. 16A, 16B are a pattern plan view showing one NAND cell portion of a memory cell array and an equivalent circuit diagram thereof, and FIGS. 17A, 17B are cross sectional views taken along the A–A' line and B–B' line of FIG. 16A. A memory cell array formed of a plurality of NAND cells is formed in a p-type silicon substrate (or a p-type well region) 11 surrounded by an element isolation oxide film 12. Like the first embodiment, in the second embodiment, eight memory cells $M_1, M_2, \ldots, M_8$ are serially connected to construct a NAND cell.

In each of the memory cells $M_1, M_2, \ldots, M_8$, a floating gate 14 ($14_1, 14_2, \ldots, 14_8$) is formed above the substrate 11 with a gate insulating film 13 formed therebetween and a control gate 16 ($16_1, 16_2, \ldots, 16_8$) is formed above the corresponding floating gate with an insulating film 15 formed therebetween. Further, n-type diffusion layers 19 ($19_1, 19_2, \ldots, 19_8$) used as the sources and drains of the memory cells $M_1, M_2, \ldots, M_8$ are connected with the sources/drains of the adjacent memory cells commonly used so as to construct the series-connected memory cells $M_1, M_2, \ldots, M_8$.

Selection gates $14_9, 16_9$ and $14_{10}, 16_{10}$ which are formed in the same process as the floating gates 14 and control gates 16 of the memory cells $M_1, M_2, M_8$ are formed on the drain side and source side of the NAND cell. The selection gates $14_9, 16_9$ and $14_{10}, 16_{10}$ are electrically connected to each other in an area which is not shown in the drawing and respectively used as the gate electrodes of selection gate transistors $S_1, S_2$. The upper surface of the substrate 11 on which the elements are formed is covered with a CVD oxide film (inter-level insulating film) 17 and bit lines (BL) 18 are formed on the CVD oxide film 17. The bit line 18 is formed in contact with a diffusion layer $19_0$ on the drain side of one end of the NAND cell. The control gates 14 of the NAND cells arranged in the row direction are respectively commonly arranged as control gate lines CG(1), CG(2), ..., CG(8). The control gate lines are used as word lines. The selection gates $14_9, 16_9$ and $14_{10}, 16_{10}$ are also arranged continuously in the row direction and respectively used as the selection gate lines $SG_1, SG_2$.

The feature of the NAND cell type EEPROM according to the second embodiment is that the line widths of the control gate lines CG(1), CG(8) are made larger than those of the control gate lines CG(2) to CG(7) as shown in FIGS. 16A, 17A.

Generally, the designed value of the line width of the selection gate lines $SG_1, SG_2$ is set larger that the line width of the control gate line in order to enhance the cut-off characteristic of the selection gate transistors $S_1, S_2$ (reduce the leak current at the OFF time). Further, in order to reduce an influence on the portion of the selection gate lines $SG_1$, $SG_2$ at the time of processing the wiring layer 14 on the portion of the control gate lines CG(1) to CG(8), the designed values of the spaces Ssg1, Ssg2 between the control gate lines and the selection gate lines are set larger than the spaces Scg12 to Scg78 between the control gate lines. Therefore, since the regular arrangement of the wirings cannot be maintained in portions between CG(1) and $SG_1$ and between CG(8) and $SG_2$, the processing precision for CG(1), CG(8) is lowered in comparison with that for CG(2) to CG(7) and a variation in the processing becomes large.

Figure 38A:
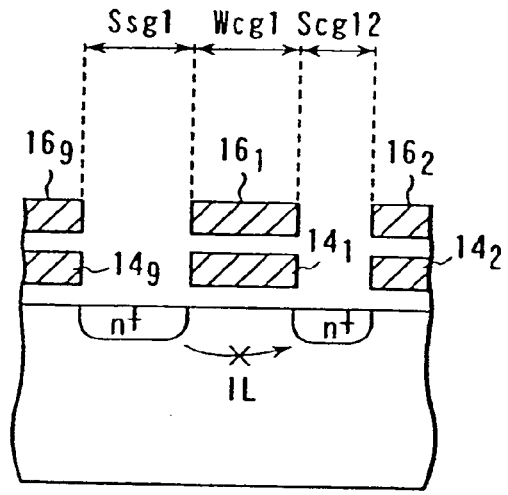
FIGS. 38A, 38B are cross sectional views of a memory cell for illustrating a problem occurring in a case where the processing precision is lowered, FIG. 38A showing a case where the line width of the control gate line is set to the designed line width and FIG. 38B showing a case where the line width of the control gate line is smaller than the designed line width.
Figure 38B:
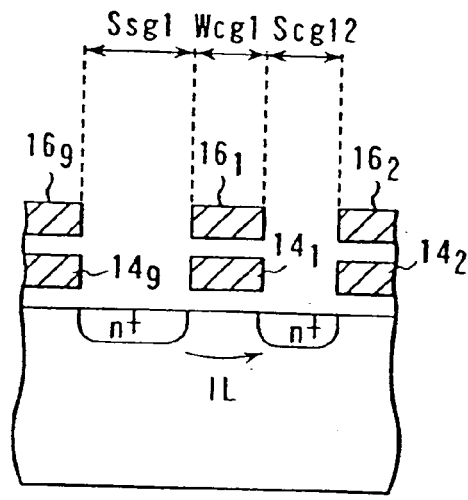

However, by setting the designed value of the line width of the control gate lines CG(1), CG(8) adjacent to the selection gate lines are set larger than that of the other control gate lines as in the embodiment shown in FIGS. 16A, 17A, the finished line width of the control gate lines CG(1), CG(8) will not become extremely smaller than that of the control gate lines CG(2) to CG(7) even if the control gate lines CG(1) and CG(8) are made narrow by a lowering in the processing precision since the designed value of the line widths is originally set to a slightly larger value. In this case, an extreme lowering in the cut-off characteristic of the memory cell caused by an extreme reduction in the channel length as shown in FIG. 38B can be prevented and the cut-off permissible state as shown in FIG. 38A can always be attained.

Further, in the second embodiment, since only two control gate lines which are adjacent to the selection gate lines among the control gate lines in the NAND cell are set as the control gate lines whose designed line width is set to a large value, an increase in the NAND cell size by setting the designed line width to a large value can be suppressed to a very small extent.

Therefore, a chip in which the reliability of the data programming/readout operation is high can be attained without significantly increasing the chip size by use of the second embodiment.

In the second embodiment, a case wherein the designed value of the line width is set larger for the control gate lines which are adjacent to the selection gate lines among the control gate lines in the NAND cell than for the other control gate lines is explained. The content of this embodiment is expressed by the following expressions.

Wcg1>Wcg2 to Wcg7
Wcg8>Wcg2 to Wcg7
Wcg2=Wcg3=Wcg4=Wcg5=Wcg6=Wcg7.

In this case, increasing amounts of the designed values of Wcg1, Wcg8 with respect to Wcg2 to Wcg7 can be set to optimum values according to the degrees of influences (the degrees of the lowering in the processing precision) on the control gate lines CG(1), CG(8) when the regular arrangement cannot be maintained. Therefore, WcG(1)=WcG(8), WcG(1)>WcG(8) or WcG(1)<WcG(8) can be set as an optimum case depending on the degrees of influences on the control gate lines CG(1), CG(8).

In this case, since Wcg1, Wcg8 are set to values larger than the line widths of the other control gate lines, strictly speaking, the regular arrangement cannot be maintained in portions between Wcg1 and Wcg2 and between Wcg7 and Wcg8, but the degree of a lowering in the processing precision for Wcg2 and Wcg7 by an influence caused by disturbance of the regular arrangement between Wcg1 and Wcg2 and between Wcg7 and Wcg8 can be suppressed to minimum if differences between Wcg1, Wcg8 and Wcg2, Wcg7 are relatively small. In the second embodiment, a case wherein the word line width is adjusted in a range in which the degree of the lowering in the processing precision caused by disturbance of the regular arrangement due to a difference between the control gate line widths is low (which is low so as not to cause any problem) is considered.

Figure 36A:
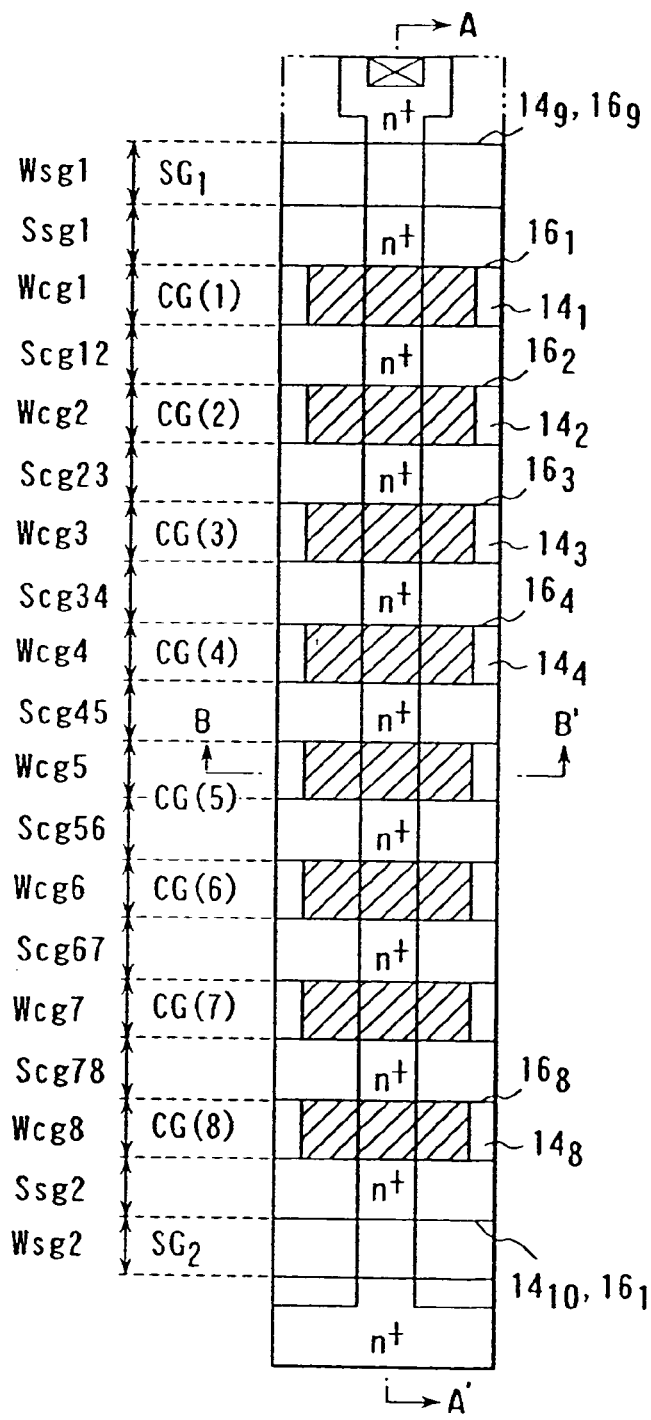
FIG. 36A is a pattern plan view showing another detail construction example of one NAND cell portion extracted from the circuit shown in FIG. 33
Figure 36B:
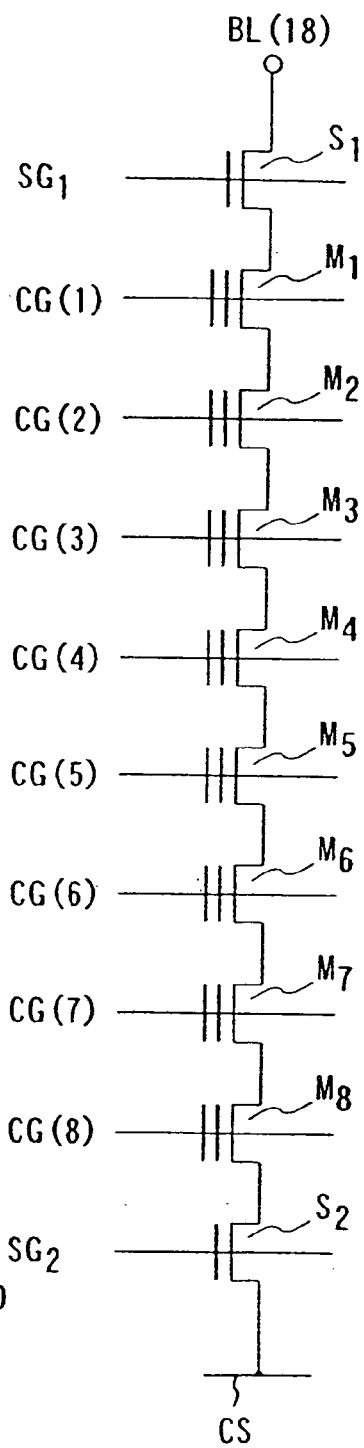
FIG. 36B is an equivalent circuit diagram thereof.
Figure 37A:
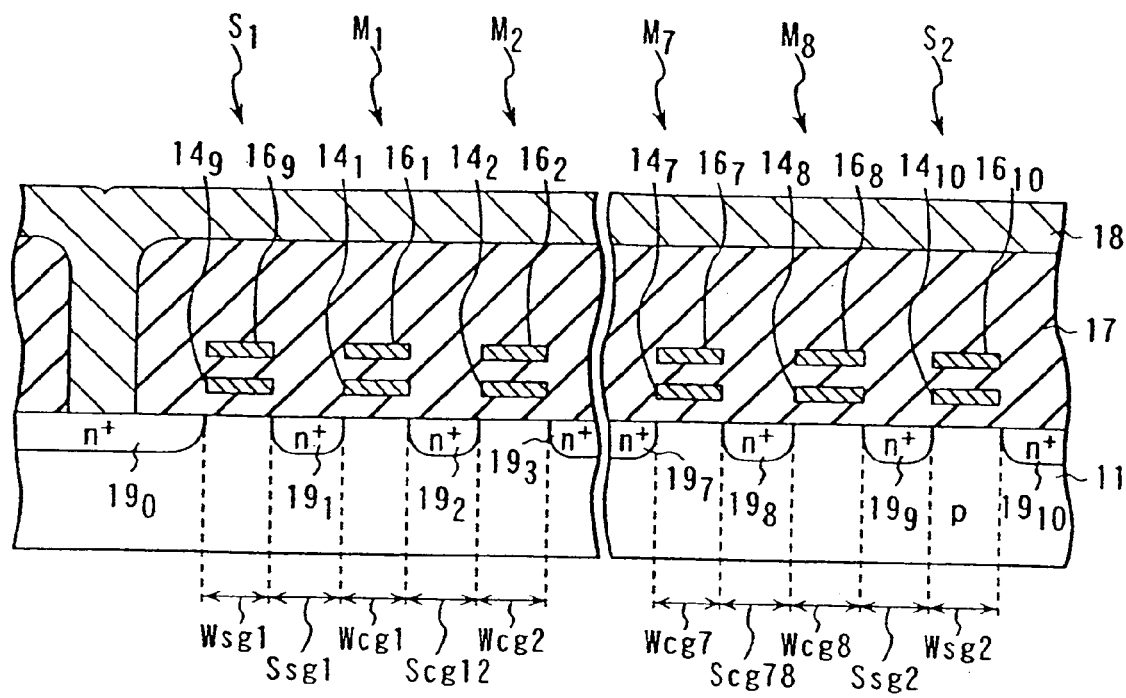
FIGS. 37A, 37B are views showing another detail construction example of one NAND cell portion extracted from the circuit shown in FIG. 33, FIG. 37A being a cross sectional view taken along the A–A' line of the pattern shown in FIG. 36A and FIG. 35B being a cross sectional view taken along the B–B' line of FIG. 36A.
Figure 37B:
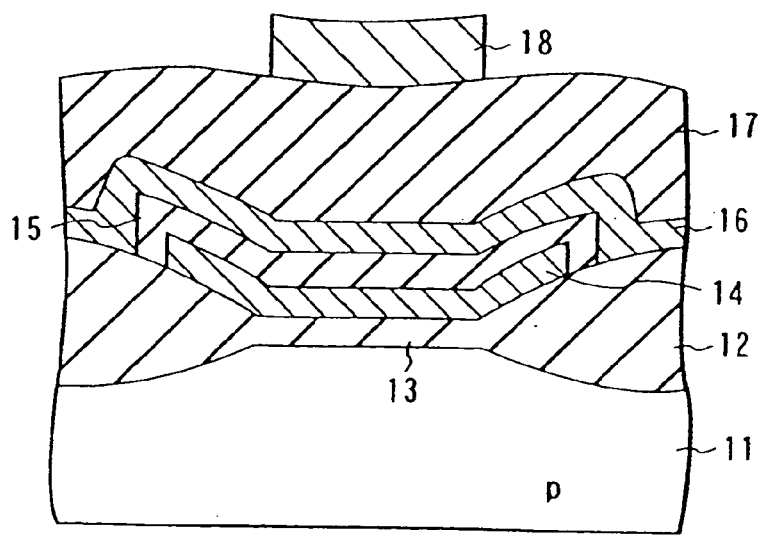

Generally, if S1, Wsg2, Ssg2 are set to substantially the same values as Su, Wsg1, Ssg1 in FIGS. 16A, 36A, it is desirable to set Wcg1=wcg8 since the degree of a lowering in the processing precision is set to substantially the same value for the control gate lines CG(1) and CG(8). Further, if S1, Wsg2, Ssg2 are set to values relatively smaller than Su, Wsg1, Ssg1, it will be optimum to set Wcg1>Wcg8 and if S1, Wsg2, Ssg2 are set to values relatively larger than Su, Wsg1, Ssg1, it will be optimum to set Wcg1<Wcg8.

In the second embodiment, a method is explained for solving a problem that the regular arrangement of the control gate lines and selection gate lines of the NAND cell is disturbed and the processing precision of the control gates CG(1), CG(8) near the boundary on which the regular arrangement is disturbed is lowered. Generally, since the degree of the lowering in the processing precision of the control gates CG(1), CG(8) among the control gates CG(1) to CG(8) is particularly high, the second embodiment is effective.

However, the influence caused by disturbance of the regular arrangement is given to wirings other than the wirings on the boundary and the degree of the influence is higher (the degree of the lowering in the processing precision is higher) as the wirings are closer to the boundary. For example, in FIG. 36A, the greatest influence is exerted on the control gate lines CG(1), CG(8), the next greatest influence is exerted on the control gate lines CG(2), CG(7), and the influence which gradually decreases is sequentially exerted on the control gate lines CG(3), CG(6), . . . . If the degree of the lowering in the processing precision of the control gate lines CG(2), CG(7) or the like other than the control gate lines CG(1), CG(8) becomes high to cause a problem, the system for setting the line width to a large designed value can be effectively applied to the control gate lines CG(2), CG(7). If only the four control gate lines CG(1), CG(8), CG(2), CG(7) are considered, a system for setting the designed line width in a portion closer to the boundary on which the regular arrangement is disturbed to a larger value as shown by the following expressions can be effectively used.

Wcg1>Wcg2>Wcg3 to Wcg6
Wcg8>Wcg7>Wcg3 to Wcg6
Wcg3=Wcg4=Wcg5=Wcg6

A system for setting designed values as follows according to the degree of disturbance of the regular arrangement may be effective in some cases.

Wcg1>Wcg2>Wcg3>Wcg4, Wcg5
Wcg8>Wcg7>Wcg6>Wcg4, Wcg5
Wcg4=Wcg5

In the second embodiment, a case wherein the number of control gate lines whose line width is set to a slightly larger value is set to the same number for the control gate lines close to the selection gate line $SG_1$ and for the control gate lines close to the selection gate line $SG_2$ is explained as an example, but this invention is not limited to this case. For example, if the degree of the lowering in the processing precision due to disturbance of the regular arrangement is higher for the control gate line close to the selection gate line $SG_1$, a system for setting the following expressions may be most effectively used in some cases.

Wcg1>Wcg2>Wcg3=Wcg4=Wcg5=Wcg6=Wcg7
Wcg8>Wcg3=Wcg4=Wcg5=Wcg6=Wcg7

Further, if the degree of the lowering in the processing precision due to disturbance of the regular arrangement is higher for the control gate line close to the selection gate line $SG_2$, a system for setting the following expressions may be most effectively used in some cases.

Wcg1>Wcg2=Wcg3=Wcg4=Wcg5=Wcg6
Wcg8>Wcg7>Wcg2=Wcg3=Wcg4=Wcg5=Wcg6

If the degree of the lowering in the processing precision due to disturbance of the regular arrangement is lower for the control gate line close to the selection gate line $SG_2$, a system for increasing the line width only of the control gate line close to the selection gate line $SG_1$ as indicated by the following expression can be most effectively used.

Wcg1>Wcg2=Wcg3=Wcg4=Wcg5=Wcg6=Wcg7=Wcg8

Further, if the degree of the lowering in the processing precision due to disturbance of the regular arrangement is lower for the control gate line close to the selection gate line $SG_1$, a system for increasing the line width only of the control gate line close to the selection gate line $SG_2$ as indicated by the following expression can be most effectively used.

Wcg8>Wcg1=Wcg2=Wcg3=Wcg4=Wcg5=Wcg6=Wcg7

In the second embodiment, the line widths of most of the control gate lines in the NAND cell are set to larger designed values and since the system for setting the line widths to the least sufficient value for the lines whose line widths are required to be set to a large value is used, the amount of an increase in the NAND cell size can be suppressed in comparison with the system for uniformly increasing the line widths of the control gate lines as in the prior art. Further, one of the systems in the second embodiment which is most effective can be detected by studying the processing precision and NAND cell size.

The second embodiment of this invention in which the system for selectively changing the designed values of the word line widths in order to solve the problem caused by a lowering in the processing precision due to disturbance of the regular arrangement of the wirings or the like is used is explained above, but this invention is not limited to the second embodiment and can be variously modified. In the second embodiment, this invention is explained by taking a case where the regular arrangement of the selection gate lines and the control gate lines is disturbed as an example, but this invention is also effective when the regular arrangement of the other portion is disturbed, for example, the regular arrangement of the control gate lines cannot be attained or when the regular arrangement cannot be realized by an influence of the wirings other than the selection gate lines and control gate lines and a system for selectively changing the designed values of the gate line widths can be applied.

In the explanation for the second embodiment, the system for selectively increasing the designed values of the line widths of the control gate lines and selection gate lines is explained. In the actual chip manufacturing process, a method for changing the size on the mask is the easiest method and is normally used. That is, the second embodiment can be realized by setting the line width of the control gate line adjacent to the selection gate line larger than the line width of the other control gate line on the data pattern in the processing mask for the control gate lines and selection gate lines. However, when a method other than the method using the mask is used, this invention can be applied if the method can attain the second embodiment.

The processing precision of the wirings whose line widths are increased in the second embodiment is relatively low and the designed value of the line width is set so as not to degrade the cut-off characteristic of the memory cell even if the degree to which the line width becomes small due to a variation in the processing is highest. Therefore, in many cases (in a case where the line width is not made extremely small by a variation in the processing), the width of the wiring having a large designed value of the line width becomes larger than that of the other control gate lines after the processing.

In the second embodiment, a case where the processing precision of the control gate line formed in the end portion of the control gate line group is lowered and a variation in the processing becomes large is explained, but this invention is effectively used in the other case. For example, if the line widths of all of the control gate lines on the mask are the same, this invention can be applied to a case where the line width of the control gate line formed in the end portion of the control gate line group is processed to be always set smaller than that of the other control gate line due to disturbance of the regular arrangement of the wirings. That is, this invention can be applied to a case where a variation in the processing is small and the ratio of the wiring width after the processing to the wiring width on the mask in the control gate line formed on the end portion of the control gate line group is stably set to a smaller value in comparison with that of the other control gate line. In this case, a method for setting the wiring width on the mask of the control gate line formed on the end portion of the control gate line group slightly larger than the wiring width of the other control gate line so as to set the wiring widths after the processing to the same value for all of the control gate lines.

[Third Embodiment]

Next, a semiconductor memory device according to a third embodiment of this invention is explained. In the first and second embodiments, a lowering in the processing precision caused by disturbance of the regular arrangement of the wirings around the word lines in one NAND cell or the block formed on the end portion of the memory cell array is prevented, but the third embodiment is to prevent a lowering in the reliability of the insulating film around the floating gate of the memory cell and destruction of stored data by stress applied to the control gate line in the manufacturing process.

Figures 18A, 18B:
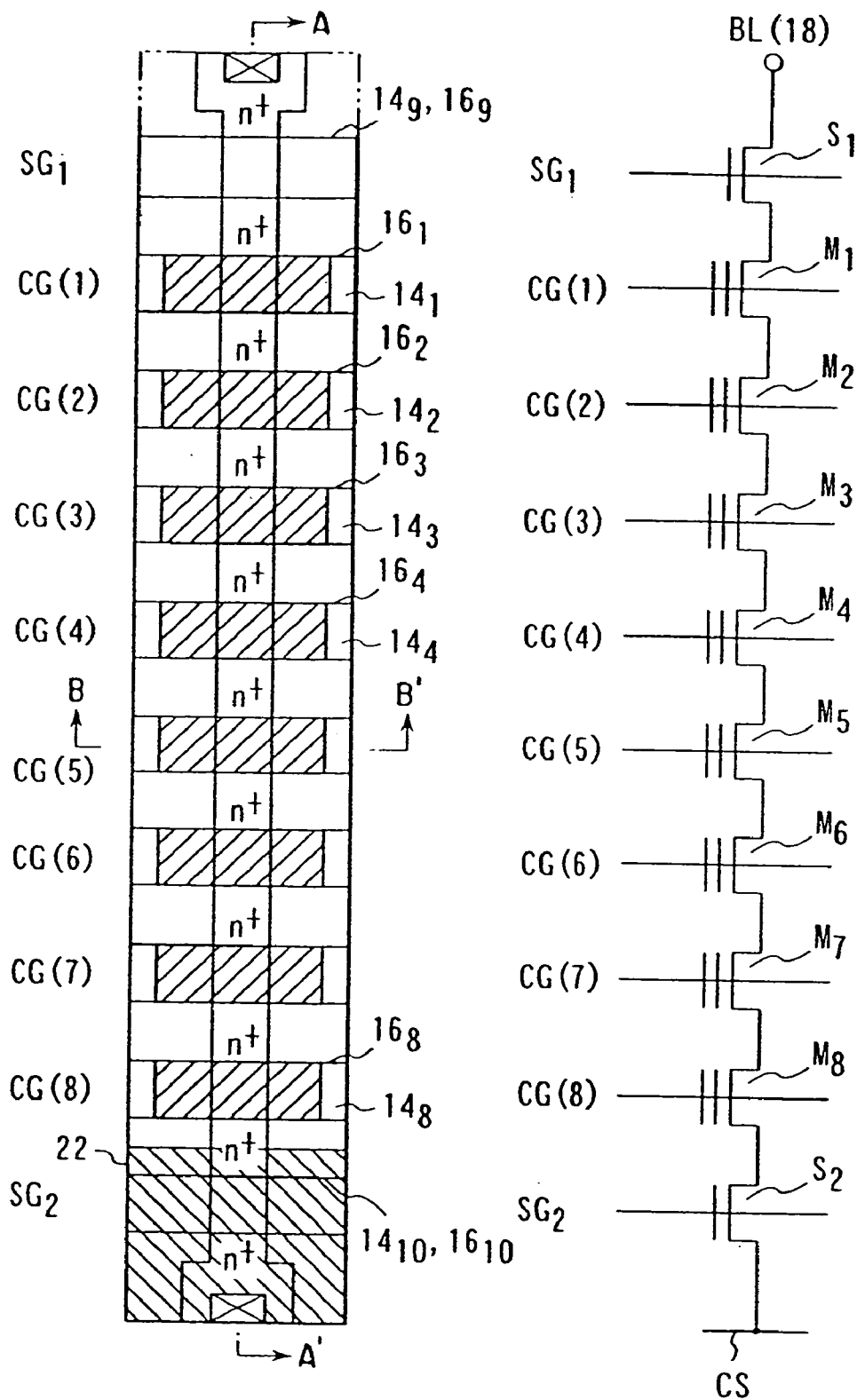
FIG. 18A is a pattern plan view showing one NAND cell portion of a memory cell array in a semiconductor memory device according to a third embodiment of this invention and FIG. 18B is an equivalent circuit diagram thereof.
Figure 19A:
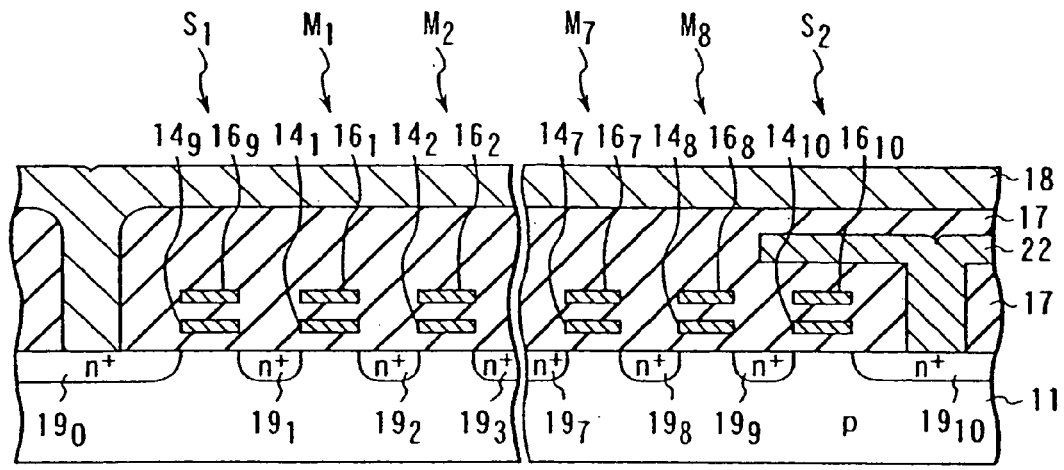
FIG. 19A is a cross sectional view taken along the A–A' line of FIG. 18A
Figure 19B:
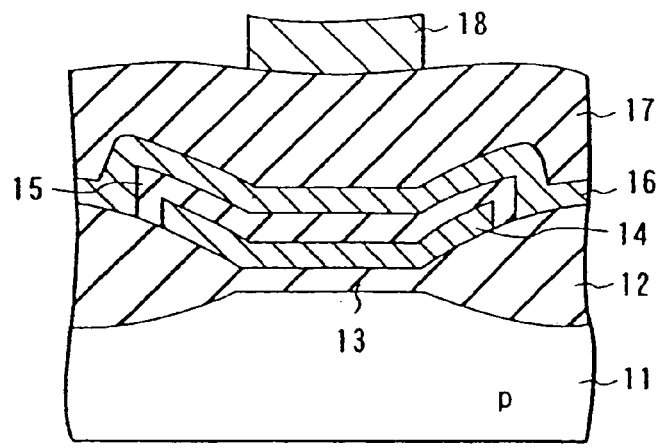
FIG. 19B is a cross sectional view taken along the B–B' line of FIG. 18A.

FIGS. 18A, 18B are a pattern plan view showing one NAND cell portion of a memory cell array and an equivalent circuit diagram thereof, and FIGS. 19A, 19B are cross sectional views taken along the A–A' line and the B–B' line of FIG. 18A. A memory cell array which is formed of a plurality of NAND cells is formed in a p-type silicon substrate (or a p-type well region) 11 surrounded by an element isolation oxide film 12. In the third embodiment, like the first and second embodiments, eight memory cells $M_1, M_2, \ldots, M_8$ are serially connected to construct a NAND cell.

In each of the memory cells $M_1, M_2, \ldots, M_8$, a floating gate 14 ($14_1, 14_2, \ldots, 14_8$) is formed above the substrate 11 via a gate insulating film 13 formed therebetween and a control gate 16 ($16_1, 16_2, \ldots, 16_8$) is formed above the corresponding floating gate with a gate insulating film 15 formed therebetween. Further, n-type diffusion layers 19 ($19_1, 19_2, \ldots, 19_8$) used as the sources and drains of the memory cells are connected with the sources/drains of the adjacent memory cells commonly used so as to construct the series-connected memory cells $M_1, M_2, \ldots, M_8$.

Selection gates $14_9, 16_9$ and $14_{10}, 16_{10}$ which are formed in the same process as the floating gates and control gates of the memory cells are formed on the drain side and source side of the NAND cell. The selection gates $14_9, 16_9$ and $14_{10}, 16_{10}$ are electrically connected to each other in an area which is not shown in the drawing and respectively used as the gate electrodes of the selection gate transistors $S_1, S_2$. The upper surface of the substrate 11 on which the elements are formed is covered with a CVD oxide film (inter-level insulating film) 17 and bit lines (BL) 18 are formed on the CVD oxide film 17. The bit line 18 is formed in contact with a diffusion layer $19_0$ on the drain side of one end of the NAND cell. The control gates 14 of the NAND cells arranged in the row direction are respectively commonly arranged as the control gate lines CG(1), CG(2), CG(8). The control gate lines are used as word lines. The selection gates $14_9, 16_9$ and $14_{10}, 16_{10}$ are also arranged continuously in the row direction and used as the selection gate lines $SG_1, SG_2$. A wiring layer 22 for the source line is disposed between a wiring layer for the bit line 18 and a wiring layer for the control gate line/selection gate line and is formed in contact with a diffusion layer $19_{10}$ on the source side of the NAND cell (on the end opposite to the bit line contact portion).

Figure 20:
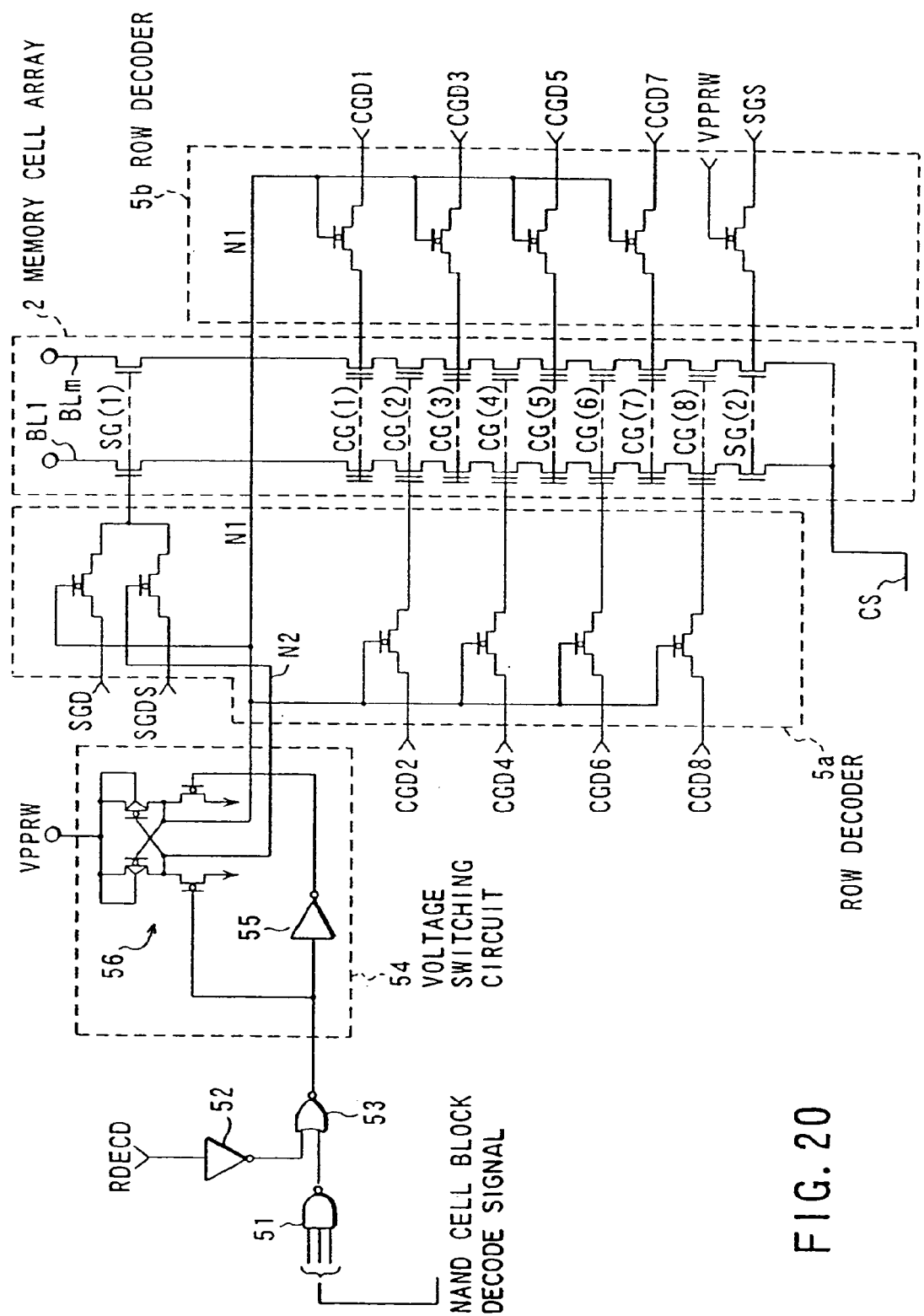
FIG. 20 is a circuit diagram showing a construction example of a row decoder and an example of connection between the row decoder and the memory cell array in the semiconductor memory device according to the third embodiment.

FIG. 20 shows a construction example of a row decoder and an example of connection between the row decoder and the memory cell array. A NAND cell block decode signal of each block is supplied to a NAND gate 51 and a row decoder starting signal RDECD is supplied to an inverter 52. Output signals of the NAND gate 51 and inverter 52 are supplied to a NOR gate 53 whose output signal is supplied to a voltage switching circuit 54. The voltage switching circuit 54 switches potential levels on nodes N1, N2 in response to the output signal of the NOR gate 53 and it is constructed by an inverter 55 and a flip-flop 56. The output signals of the NOR gate 53 and inverter 55 are supplied to the flip-flop 56 in a selected block, and the output signal of the flip-flop 56 is inverted. A voltage VPPRW is supplied from the voltage switching circuit 54 to row decoders 5a, 5b via the node N1. The row decoder 5a is supplied with signals SGD, SGDS, CGD2, CGD4, CGD6, CGD8 and the row decoder 5b is supplied with signals CGD1, CGD3, CGD5, CGD7, SGS and the voltage VPPRW.

As is clearly seen from FIG. 20, the control gate lines CG(1) to CG(8) and selection gate lines $SG_1, SG_2$ in the memory cell array 2 are connected to the sources or drains of the transistors in the row decoders 5a, 5b.

Figure 21A:
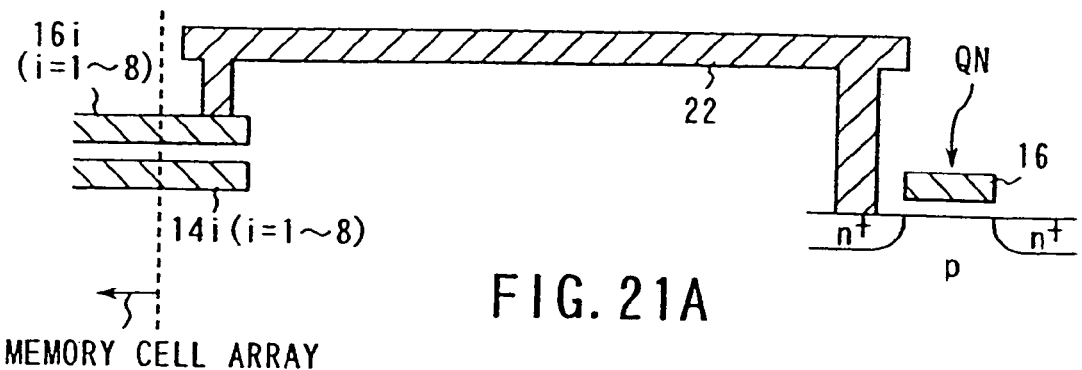
FIG. 21A is a cross sectional view showing a control gate line in an example of the structure associated with connection of the selection gate line and the control gate line extending from the inside portion of the memory cell array to the row decoder in the circuit of FIG. 20
Figure 21B:
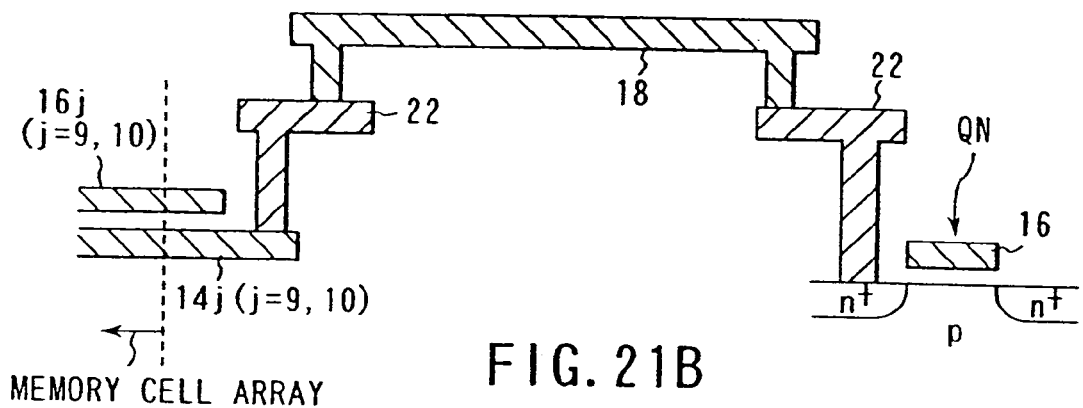
FIG. 21B is a cross sectional view showing the selection gate line.

An example of the structure relating to the connection of the control gate lines and selection gate lines extending from the memory cell array 2 to the row decoders 5a, 5b is shown in FIGS. 21A and 21B. FIG. 21A shows an example of the structure of a control gate line and FIG. 21B shows an example of the structure of a selection gate line. N-channel transistors QN shown in the right portion of FIGS. 21A, 21B correspond to the transistors in the row decoders 5a, 5b.

In the example of FIG. 21A, when the control gate line is connected to the transistor QN in the row decoder 5a or 5b from the memory cell array 2, only one wiring layer 22 is used as a wiring layer lying above the control gate line. Therefore, with this structure, since the contact to the control gate line can be made by only one step in the manufacturing process, the control gate line is charged at the time of contact formation and stress is applied to an insulating film around the floating gate only once and thus the stress can be significantly reduced in comparison with the conventional case in which stress is applied twice. As a result, a deterioration in the quality of the insulating film around the floating gate at the time of contact formation can be significantly improved in comparison with the conventional case and a data holding characteristic of the memory cell can be improved. Therefore, a chip with high reliability for significantly reducing the possibility of data destruction in comparison with the conventional case can be attained.

On the other hand, when the selection gate line is connected to the transistor QN in the row decoder 5a, 5b from the memory cell array in an example of FIG. 21B, two wiring layers 22, 18 are used as wiring layers which lie above the control gate line. This is because the selection gate line forms a gate electrode of the selection transistor in the NAND cell. The insulating film around the selection gate line does not have an operation or role (corresponding to the data holding ability in the memory cell) requiring extremely high film quality of the insulating film such as required for an insulating film around the gate electrode. Thus, no serious problems occur even if some stress is applied to the selection gate line.

Generally the selection gate line has a role for controlling the operation for selection/non-selection of the block and it is preferable to charge/discharge the selection gate line at a high speed to realize the operation with high reliability. For example, in order to reduce the leak current flowing through the NAND cell of the non-selected block from the bit line in the readout operation, it is necessary to turn OFF the selection transistor in the non-selected block at high speed and it becomes important to charge/discharge the selection gate line at high speed. In order to attain the high-speed operation, it is preferable to make low the wiring resistance of the selection gate line extending from the memory cell array 2 to the row decoder 5a, 5b. Generally, since the upper wiring has a lower resistivity if wirings formed on different wiring layers are compared, it is preferable to use the wiring formed in the upper level as the wiring of the selection gate line. Therefore, in the case of FIG. 21B, the upper wiring layer 18 is used for connection. As to the control gate line, since it is generally more important to improve the data holding characteristic of the memory cell than to enhance the operation speed of the charging/discharging operation, connection is made without using the wiring layer 18 in the case of FIG. 21A.

Figure 39A:
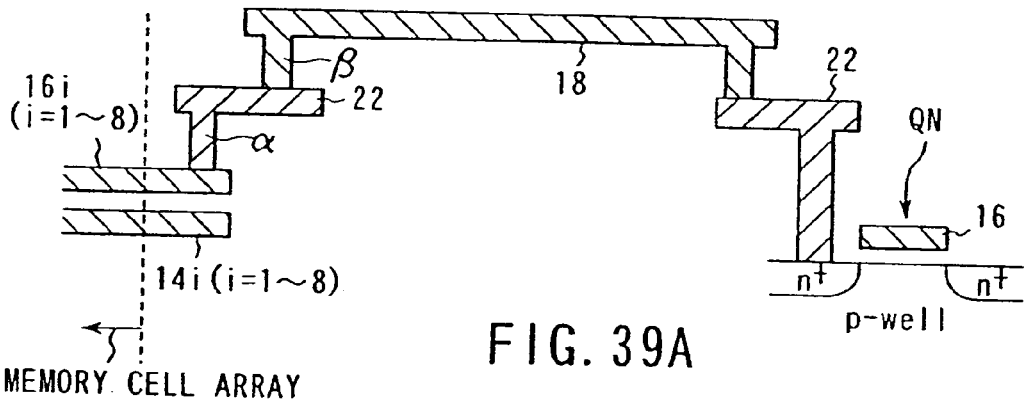
FIGS. 39A, 39B are views for illustrating the wiring structure used for connection of the selection gate and the control gate extending from the inside portion of the memory cell array to the row decoder, FIG. 39A showing the wiring structure of the control gate line and FIG. 39B showing the wiring structure of the selection gate.
Figure 39B:
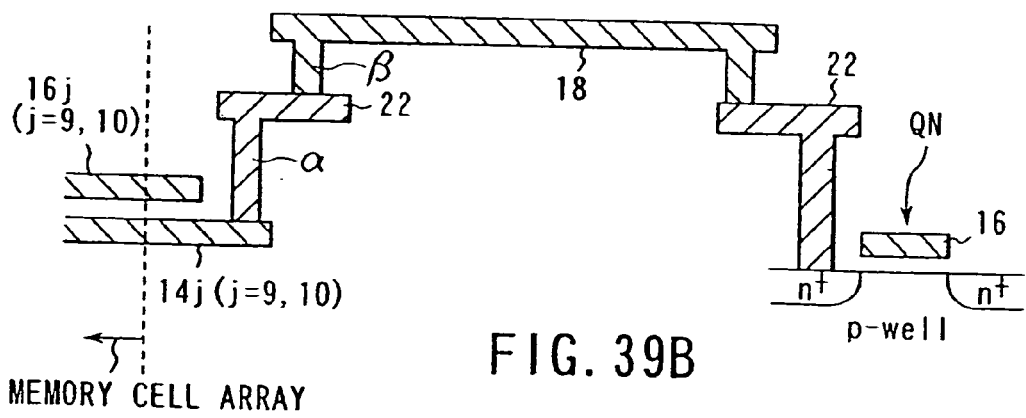

The following advantages can be further attained by using different wiring layers for the control gate line and selection gate line as the wirings extending from the cell array 2 to the row decoders 5a, 5b as shown in FIGS. 21A and 21B when the patterns for the row decoders 5a, 5b are formed. That is, the patterns of the row decoders 5a, 5b must be formed in a manner such that all of the transistors in the row decoders 5a, 5b can be arranged in an area of one block width (corresponding to the length in the lengthwise direction in FIG. 18A) of the NAND cell. That is, at the time of pattern formation, a large number of wirings (the total number of control gate lines and selection gate lines) must be formed in the area of one-block width. In the case of FIGS. 39A, 39B where the wiring layers of the control gate line and selection gate line have the same structure, the wirings of the control gate line and the selection gate line cannot be allocated to overlap each other, with the result that the width of the area required for the wirings to pass therethrough becomes wider. Thus, there is a problem that the pattern area of the row decoder 5a, 5b is increased and the design rule for the wirings must be made strict (the wiring pitch must be made small). On the other hand, as shown in FIGS. 21A, 21B, since the control gate line and selection gate line can be superposed on each other if the main wiring layers (corresponding to the wiring layer 22 used as the control gate line in FIG. 21A and the wiring layer 18 used as the selection gate line) used for the wirings are different from the control gate line and the selection gate line, the row decoders 5a, 5b with the small pattern area can be formed without making the design rule strict.

The main wiring layer or the wiring layer of the main wiring which is described above and will be described below corresponds to a wiring layer constructing a wiring (which is drawn to be longest in the drawing in the third embodiment) having the largest wiring length among the wiring layers used for connection from the end portion of the memory cell array to the transistors in the row decoder in the control gate line and selection gate line and corresponds to the wiring layer 22 in the control gate line shown in FIG. 21A or the wiring layer 18 in the selection gate line shown in FIG. 21B. Further, if a plurality of transistors in the row decoder which are connected to one selection gate line or one control gate line are provided, only a wiring between the connecting portion of a transistor (generally corresponding to a transistor arranged nearest to the memory cell array) to which the wiring from the end of the memory cell array is first connected and the end portion of the memory cell array is considered and a wiring layer constructing the wiring having the largest wiring length in this range is called the wiring layer of the main wiring.

In the third embodiment, a system for attaining the high-speed charging/discharging operation of the selection gate line, reducing stress applied to the memory cell array at the time of contact formation and reducing the pattern area of the row decoder 5a, 5b by using a wiring layer which lies above the wiring layer used for the control gate line as the selection gate line in the wiring layer extending from the memory cell array 2 to the row decoder 5a, 5b is explained, but this invention is not limited to the third embodiment as mentioned above and can be variously modified.

Figure 22A:
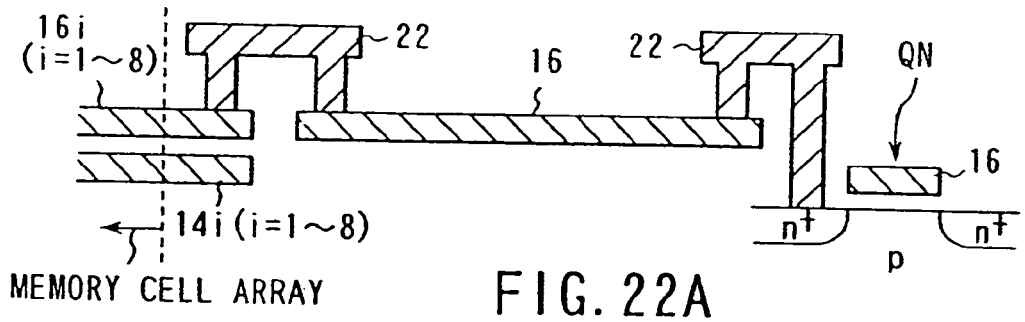
FIG. 22A is a cross sectional view showing another example of the structure of the control gate line in a case where the control gate line is first connected to a different wiring layer and then connected to the wiring layer which is the same as the control gate line and FIG. 22B is a cross sectional view showing another example of the structure of the control gate line in a case where the control gate line is first connected to a different wiring layer and then connected to a wiring layer which lies between the wiring layer and the wiring layer of the control gate line.
Figure 22B:
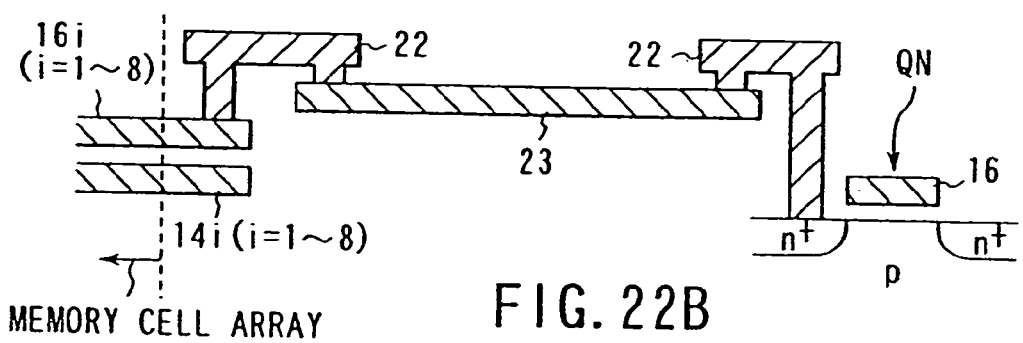

For example, in the third embodiment, the same operation and effect can be attained by using the wiring structures shown in FIGS. 22A, 22B as the control gate line instead of the structure shown in FIG. 21A and using the wiring structure shown in FIG. 21B as the selection gate line. FIG. 22A shows a case wherein the control gate line is first connected to a wiring layer 22 and then connected to a wiring layer 16 which is formed in the same step as the control gate line. FIG. 22B shows a case wherein the control gate line is first connected to a wiring layer 22 and then connected to a wiring layer 23 which lies between the wiring layers 22 and 16. The structure using the wiring layer 23 is suitable for a case where a wiring which cannot be directly connected to the wiring layer 16, for example, a polysilicon wiring is used, and in this case, the wiring layer 22 which can be connected to the wiring layer 16 or 23 is used to connect the wiring layers. Like the case of FIG. 21A, in a case where the wiring structures shown in FIGS. 22A, 22B are used, the contact forming step in which stress is applied to the control gate line $16_i$ (i=1 to 8) is effected only once (to form a contact between the wiring layer 22 and the control gate line $16_i$ (i=1 to 8)) and the wiring layers 22, 23 mainly used as the control gate line are different from the wiring layer 18 (refer to FIG. 21B) mainly used as the selection gate line, and therefore, the same effect as that obtained when the wiring structure shown in FIGS. 21A and 21B is used can also be attained in this modification.

Figure 23A:
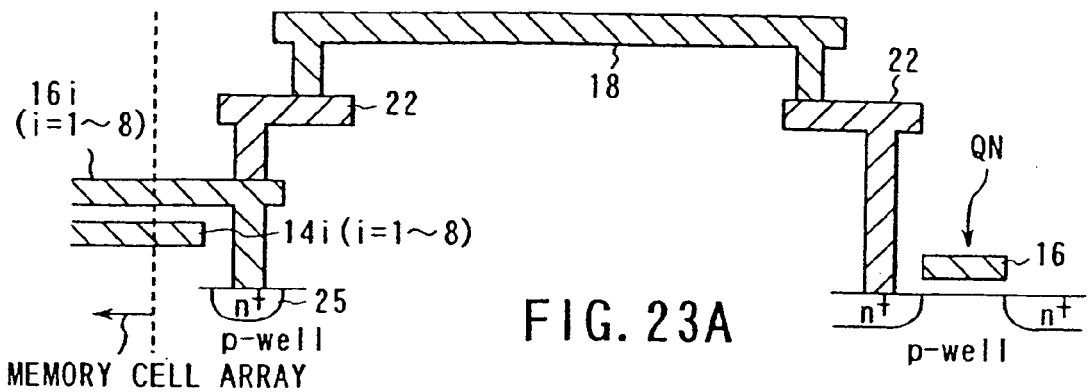
FIGS. 23A, 23B, 23C are cross sectional views showing examples of the structures of the wiring extending from the memory cell array of the control gate line to the row decoder, FIG. 23A showing a case wherein the top wiring layer is used as the wiring layer for the control gate line and the control gate and the pn junction are directly connected by use of the wiring layer of the control gate line, FIG. 23B showing a case wherein the wiring layer used for connection to the pn junction is a wiring layer formed above the wiring layer for the control gate line, and FIG. 23C showing a case wherein a portion for connection of the control gate line to the pn junction is added to the structure of FIG. 21A.
Figure 23B:
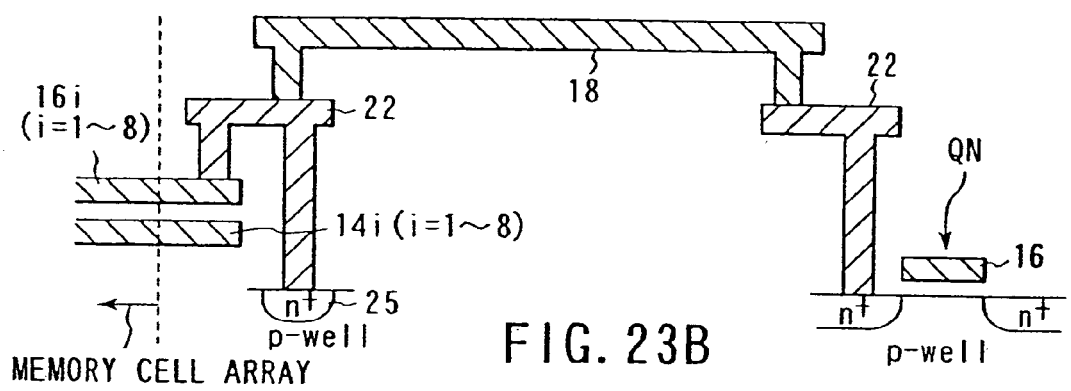
Figure 23C:
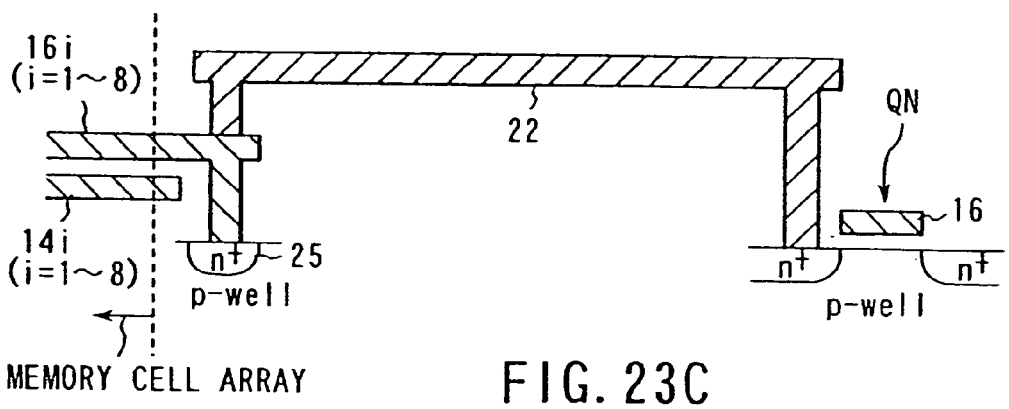

FIGS. 23A, 23B, 23C show different examples of the wiring structures extending from the memory cell array 2 to the row decoders 5a, 5b and a case where the wiring structures shown in FIGS. 23A, 23B, 23C are used as the wiring structures of the control gate lines and the wiring structure shown in FIG. 21B is used as the wiring of the selection gate line.

FIG. 23A shows a structure in which the wiring layer 18 is mainly used as the control gate line and the control gate line is connected to the pn junction by way of the wiring layer $16_i$ (i=1 to 8). The wiring layer 18 is connected to the wiring layer $16_i$ via the wiring layer 22 and the wiring layer $16_i$ is formed in contact with an n$^+$-type diffusion layer 25. Since the voltage range of the control gate line is set to approx. 0V to 20V in operation, a forward bias voltage will not be applied between the n$^+$-type diffusion layer 25 and the p-type well region in the normal operation and no influence is given to the operation if the p-type well region is set to 0V or less. Since the p-type well region in which an N-channel transistor QN of FIG. 23A is formed is normally set at 0V or less, the n$^+$-type diffusion layer 25 and the source/drain regions of the transistor QN can be formed in the same p-type well region, and in this case, it is not necessary to provide two p-type well regions and the pattern area can be reduced. Thus, if the wiring layer $16_i$ is connected to the pn junction, the pn junction functions as a current path for discharging the charges of the wiring layer $16_i$ when the wiring layer $16_i$ tends to be charged at the time of contact formation between the wiring layers 22 and $16_i$ or at the time of contact formation between the wiring layers 18 and 22, and thus stress applied to the memory cell caused by the charging on the wiring layer $16_i$ can be reduced. Generally, the wiring layer $16_i$ is formed of polysilicon, and in this case, if the wiring layer $16_i$ is formed in direct contact with the n$^+$-type diffusion layer 25, the contact resistance thereof tends to be larger in comparison with the contact resistance using a wiring material such as aluminum (Al) or tungsten (W), and therefore, a system for directly connecting the polysilicon wiring to the n$^+$-type diffusion layer which forms the source/drain of the transistor QN is not frequently used. However, as the current path for preventing the charging of the wiring during the manufacturing process as described before, any current path can be used if it functions to permit a certain amount of current even if the contact resistance thereof is somewhat larger and stress to be applied can be significantly reduced in comparison with a case wherein no connection is made between the pn junction and the wiring layer $16_i$.

FIG. 23B shows a case wherein connection to the pn junction is made by use of the wiring layer 22. Like the case of FIG. 21A, in this case, stress is caused by the wiring layer $16_i$ charged at the time of contact formation process for connection between the wiring layers 22 and $16_i$. However, since connection between the wiring layer 22 and the pn junction has been completed at the time of contact formation for connection between the wiring layers 18 and 22, a discharging current path is already formed and application stress caused by the charging of the wiring layers 22 and 18 can be significantly reduced.

Therefore, as is clearly seen from FIGS. 23A, 23B, even if the wiring layer 18 is used as the main wiring of the control gate line like the case of FIG. 39A used for explaining the conventional wiring structure, application stress caused by the charging of the wiring layer $16_i$ at the time of contact formation can be significantly reduced by forming a connecting portion for connection with the pn junction.

FIG. 23C shows a structure obtained by adding a portion for connection to the pn junction of the wiring layer $16_i$ to the wiring structure shown in FIG. 21A, and in this case, since the stress is applied to the wiring layer $16_i$ only one time, which is less than that in the conventional structure. Further, connection to the pn junction of the wiring layer $16_i$ has already been made before the time of stress application. The application stress can, therefore, be further reduced. Hence, the application stress can be suppressed to an extremely small value.

Further, a portion for connection to the pn junction of the wiring layer $16_i$ may be added to the structures shown in FIGS. 22A and 22B although not shown in the drawing. The third embodiment can be further modified accordingly.

In the third, embodiment, this invention is explained by using the wiring structure shown in FIG. 21B as the example of the structure of the selection gate line, but this invention is effective in other modifications, for example, when the structure shown in FIGS. 24A to 24D are used as the example of the structure of the selection gate line.

Figure 24A:
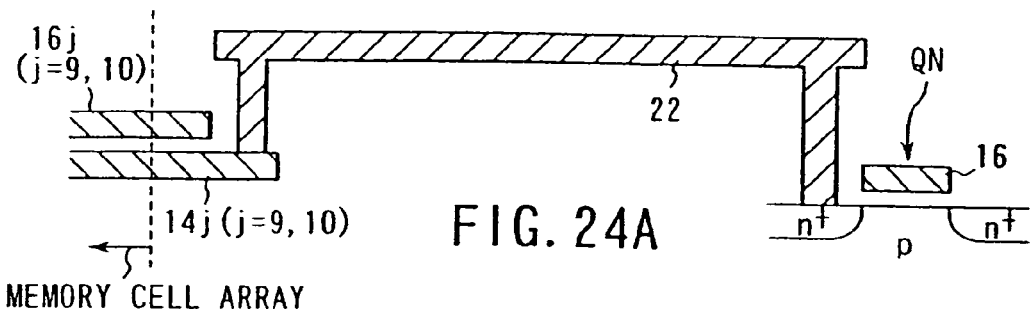
FIGS. 24A, 24B, 24C, 24D are cross sectional views showing examples of the structures of the selection gate lines, FIG. 24A showing the wiring structure of the selection gate line for enhancing the charging/discharging speed of the selection gate line and reducing the pattern area of the row decoder, FIG. 24B showing the wiring structure of the selection gate line for connection to the pn junction in order to reduce stress, and FIGS. 24C, 24D showing the wiring structures of the selection gate lines for reducing the pattern area of the row decoder, reducing the stress and enhancing the charging/discharging speed of the selection gate line.

First, assume that the wiring structure shown in FIG. 22A is used as the wiring structure of the control gate line and the wiring structure shown in FIG. 24A is used as the wiring structure of the selection gate line. In a case where only two wiring layers 16 and 22 are used as wiring layers which can be used for connection between the memory cell array 2 and the row decoders 5a, 5b, one of the wiring layers (corresponding to the wiring layer 22) which has a lower resistivity is used as the wiring for the selection gate line and the other wiring layer 16 is used as the wiring for the control gate line. Thus, the operation speed of the charging/discharging operation of the control gate line can be enhanced and the pattern areas of the row decoders 5a, 5b can be reduced.

If the wiring structures shown in FIGS. 23C and 24A are used, a difference between the wiring structures of the control gate line and the selection gate line is a portion for connection to the pn junction. Since the use of pn junction has a defect that it increases the pattern area and increases the wiring capacitance, it is preferable to make the number of wirings connected to the pn junction as small as possible. If the wiring structures shown in FIGS. 23C and 24A are combined, an advantage that the number of pn junctions can be suppressed to minimum (=the number of control gate lines) can be attained since the control gate line is connected to the pn junction and the selection gate line is not connected to the pn junction. This modification is a system particularly effective in a case where no wiring layers other than the wiring layer 22 can be used for the wiring for connection between the memory cell array 2 and the row decoders 5a, 5b.

Figure 24B:
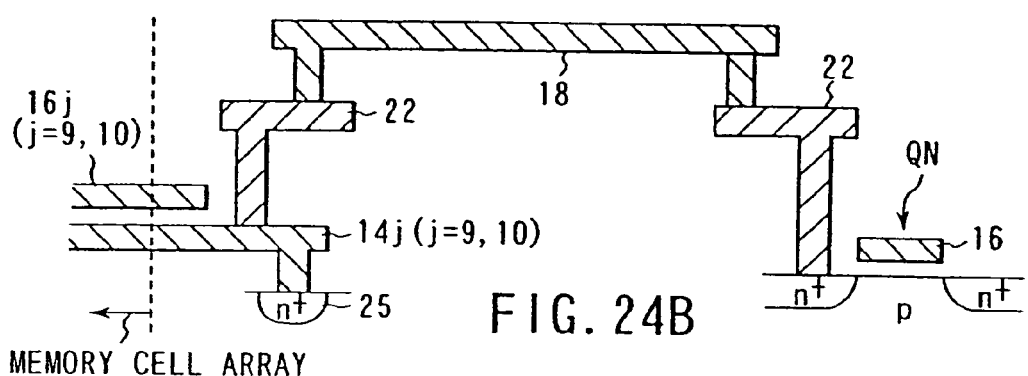
Figure 24C:
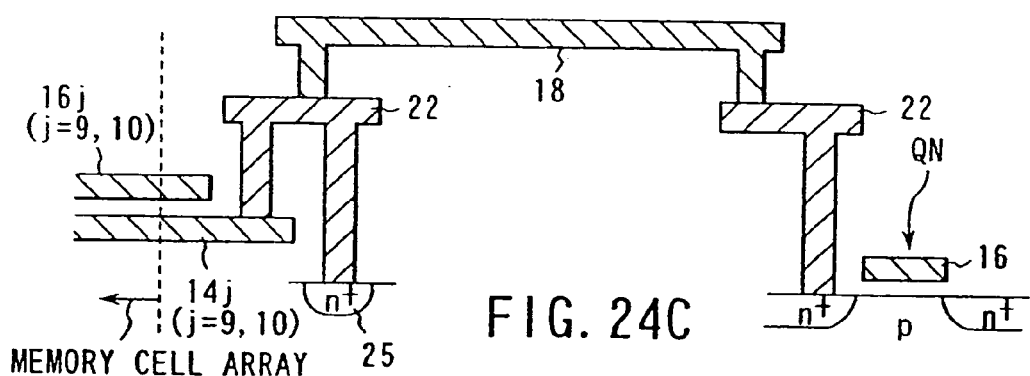
Figure 24D:
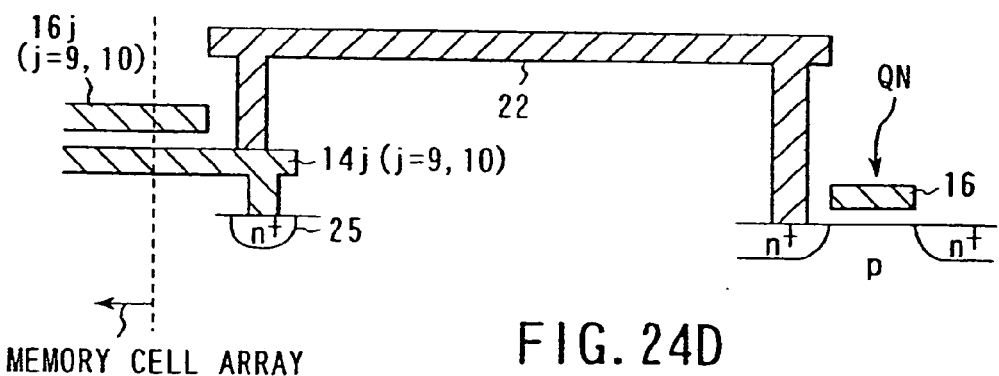

In the above modifications of the third embodiment, the explanation is made without considering a reduction in the application stress at the time of contact formation in the selection gate line. However, it is also preferable to reduce the stress applied to the selection gate line, and in this case, a system for connecting the pn junction to reduce the stress becomes effective. For example, if the wiring structure shown in FIG. 24B is used as the wiring structure of the selection gate line and the wiring structure shown in FIGS. 22A, 22B, 23C is used as the wiring structure of the control gate line, the pattern area of the row decoders 5a, 5b can be reduced (because the main wirings of the control gate line and the selection gate line are different from each other), the application stress can be reduced, and the operation speed of the charging/discharging operation of the selection gate line can be enhanced (one of the wiring layers (which is generally an upper wiring layer) which has a lower resistivity is used as the main wiring of the selection gate line). Further, if the wiring structure shown in FIG. 24C is used as the wiring structure of the selection gate line and the wiring structure shown in FIGS. 21A, 22A, 22B, 23C is used as the wiring structure of the control gate line, the same effect can be attained. Also, if the wiring structure shown in FIG. 24D is used as the wiring structure of the selection gate line and the wiring structure shown in FIGS. 22A, 22B is used as the wiring structure of the control gate line, the same effect can be attained.

The above mentioned third embodiment or its modifications has been explained by taking a case wherein the pn junction connected to the selection gate line and control gate line is the n$^+$-type diffusion layer-p-type well structure and the wiring layer is connected to the n$^+$-type diffusion layer as an example, but this invention can be applied in another design, for example, in a case where the wiring layer is connected to a p$^+$-type diffusion layer of a pn junction of a p$^+$-type diffusion layer-n-type well structure. In this case, in order to prevent that the pn junction of the p$^+$-type diffusion layer-n-type well structure is biased in the forward direction and a voltage of the control gate line varies, it is necessary to set a voltage of the n-type well region equal to or higher than a voltage of the control gate line or selection gate line connected thereto in the normal operation.

A current flowing in the pn junction used as the current path corresponds to a reverse current of the pn junction in a case where charges on the wiring layer are positive in the n$^+$-type diffusion layer-p-type well structure and it corresponds to a forward current of the pn junction in a case where charges on the wiring layer are negative. On the other hand, in the p$^+$-type diffusion layer-n-type well structure, the current corresponds to a forward current of the pn junction in a case where charges on the wiring layer are positive and it corresponds to a reverse current of the pn junction in a case where charges on the wiring layer are negative. Generally, since the forward current is extremely larger than the reverse current in the same pn junction, the more significant effect of reducing the application stress at the time of contact formation can be attained by use of the forward current of a larger current amount of the pn junction which flows via the current path.

Therefore, the application stress reducing effect can be made most significant by using the pn junction of the p$^+$-type diffusion layer-n-type well structure when charges at the time of contact formation are positive and using the pn junction of the n$^+$-type diffusion layer-p-type well structure when charges at the time of contact formation are negative. Further, in a case where the pn junctions of both of the p$^+$-type diffusion layer-n-type well structure and n$^+$-type diffusion layer-p-type well structure are used for the wiring layer which is desired to be prevented from being charged, the current path due to the forward current of the pn junction can be attained irrespective of positive or negative charging and the application stress can be suppressed to minimum.

Figure 25A:
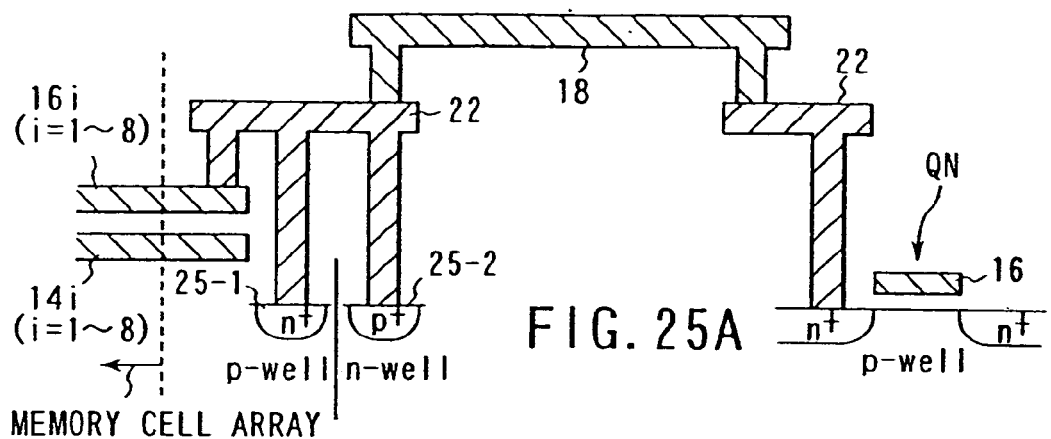
FIGS. 25A, 25B are cross sectional views showing other examples of the structures of the selection gate lines, FIG. 25A showing the wiring structure having pn junctions formed in both of the $p^+$-type diffusion layer-n-type well structure and the $n^+$-type diffusion layer-p-type well and FIG. 25B showing the wiring structure in which the $n^+$-type diffusion layer is directly connected to a wiring layer when the wiring layer is formed of n-type polysilicon and it is connected to the $p^+$-type diffusion layer via another wiring layer.
Figure 25B:
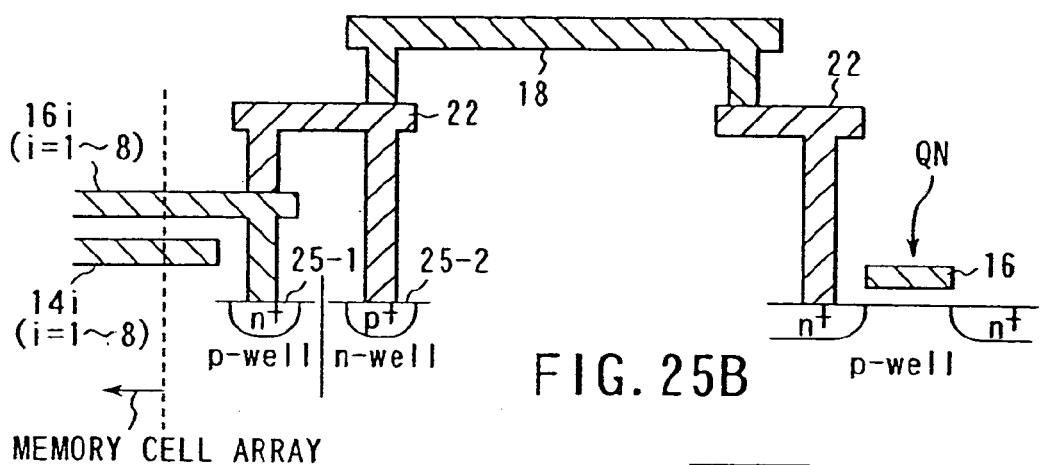

FIGS. 25A, 25B show other examples of the wiring structures in which the pn junctions of both of the p$^+$-type diffusion layer-n-type well structure and n$^+$-type diffusion layer-p-type well structure are provided in the wiring structure shown in FIG. 23B. Generally, if the wiring layer $16_i$ is directly connected to the n$^+$-type diffusion layer or p$^+$-type diffusion layer, the resistance of a contact with an n$^+$-type diffusion layer 25-1 may become extremely large in some cases when the wiring layer $16_i$ is formed of p-type polysilicon and the resistance of a contact with an p$^+$-type diffusion layer 25-2 may become extremely large in some cases when the wiring layer $16_i$ is formed of n-type polysilicon, and in this case, it is preferable to connect the wiring layer $16_i$ to the pn junction via a wiring layer of Al or W (the contact resistance of the n$^+$-type diffusion layer 25-1 or p$^+$-type diffusion layer 25-2 is relatively low) and this system is used in the case of FIG. 25A. As another example, as shown in FIG. 25B, the n$^+$-type diffusion layer 25-1 and the wiring layer $16_i$ are directly connected to each other when the wiring layer $16_i$ is formed of n-type polysilicon and it is connected to the p$^+$-type diffusion layer 25-2 via a wiring layer 22 and thus various modifications can be made in the same manner.

Figure 26A:
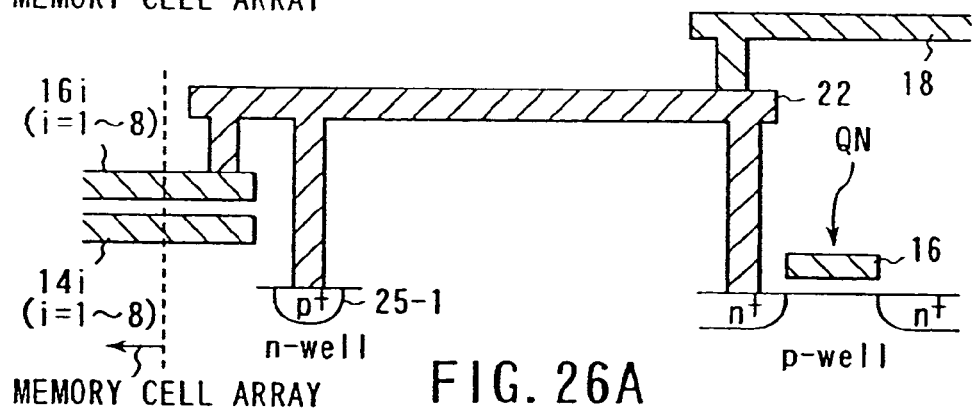
FIGS. 26A, 26B are cross sectional views showing still other examples of the structures of the selection gate lines, FIGS. 26A, 26B showing the wiring structure for reducing stress by use of the diffusion layer as the source/drain region of the transistor in the row decoder.
Figure 26B:
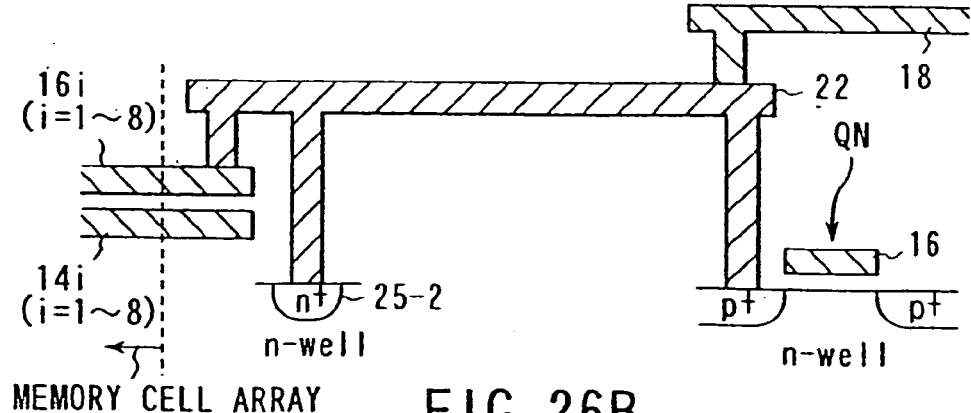

FIGS. 26A, 26B show still other modifications. This modification as shown in FIGS. 26A, 26B is applicable to the case where the wiring for the control gate line is connected to an element or part other than transistor QN in row decoder 5a, 5b. The wiring structure of this modification is further connected to a upper wiring layer 18 in the row decoder 5a, 5b. This modification is usable for reducing the application stress at the time of formation of a contact for connection between the wiring layers 18 and 22 is shown. In FIG. 26A, since the wiring layer 22 is connected to an n$^+$-type diffusion layer used as the source/drain of the transistor QN (connected to the pn junction of the n$^+$-type diffusion layer-p-type well structure), it is sufficient to use only a p$^+$-type diffusion layer 25-1 formed in the n-type well region as a pn junction which is newly connected to the wiring layer 22. Likewise, in FIG. 26B, since the wiring layer 22 is connected to a p$^+$-type diffusion layer of the transistor QN (connected to the pn junction of the p$^+$-type diffusion layer-n-type well structure), it is sufficient to use only an n$^+$-type diffusion layer 25-2 formed in the p-type well region as a pn junction which is newly connected to the wiring layer 22.

Figure 27A:
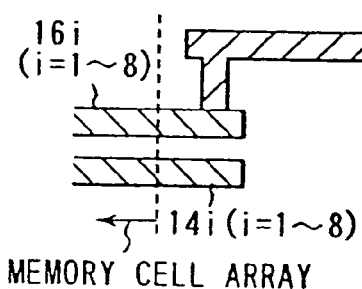
FIGS. 27A, 27B, 27C are cross sectional views showing modifications of the wiring structure shown in FIGS. 21A and 21B, FIG. 27A showing the wiring structure in which a wiring layer to which a potential measuring probe is applied is added above the transistor of FIG. 21A, FIG. 27B showing the wiring structure in which a wiring layer to which a potential measuring probe is applied is added to the wiring structure shown in FIG. 27A, and FIG. 27C showing the wiring structure in which a wiring layer to which a potential measuring probe is applied is added to the wiring structure shown in FIG. 21B.
Figure 27A:
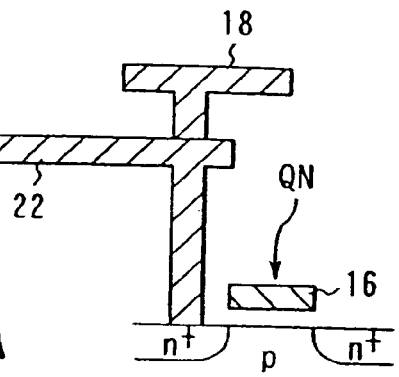
Figure 27B:
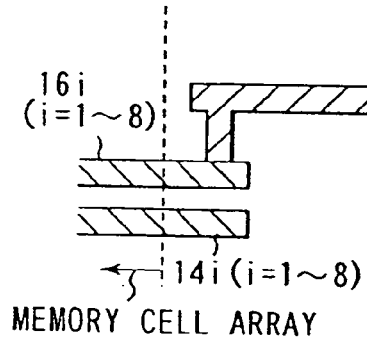
Figure 27B:
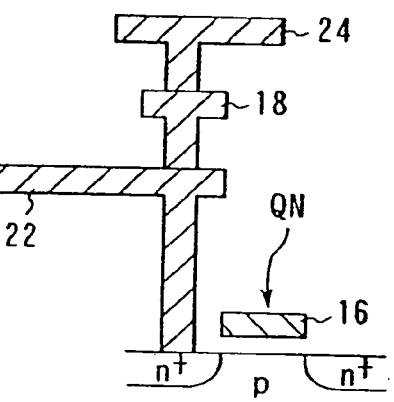
Figure 27C:
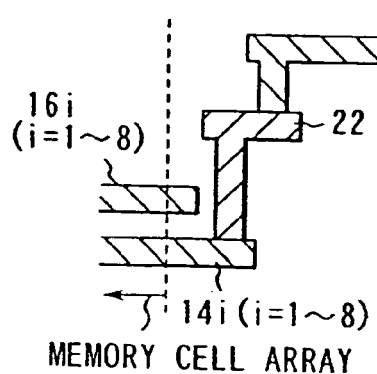
Figure 27C:
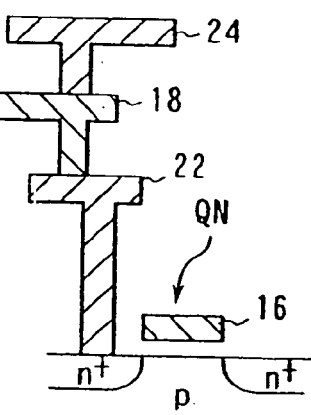

FIGS. 27A, 27B, 27C show other modifications. The wiring structures of FIGS. 27A, 27B, 27C are modifications of FIG. 21A or FIG. 21B. FIG. 27A shows the wiring structure obtained by adding a wiring layer 18 above the transistor QN of FIG. 21A. At the time of chip evaluation, generally, a method for applying a probe to a node which is set at the same potential as the word line to measure the word line potential is used. Generally, it is easier to apply the probe if the position of the wiring layer is set at a higher level, and therefore, the node of the wiring layer 18 of FIG. 27A is provided to make it easier to apply the probe. Further, as to the damage occurring at the time of formation of a contact opening when the wiring structure of FIG. 27A is used, only the damage occurring at the time of formation of a contact opening for connection with the wiring layers 18 and 22 is different from that of FIG. 21A, but in this case, since the wiring layer 22 is connected to the pn junction of the transistor, the wiring layer 22 and control gate line $14_i$ (i=1 to 8) will not be charged and almost no damage occurs. Therefore, if the wiring structure of FIG. 27A is used instead of the wiring structure of FIG. 21A, a chip with extremely high reliability in comparison with the prior art case can be attained.

FIG. 27B shows a modification in which a wiring layer lying above the wiring layer 18 is present and shows the structure obtained by adding a wiring layer 24 to the wiring structure shown in FIG. 27A. Since the wiring layer 24 is formed above the wiring layer 18, it becomes easier to apply the probe in comparison with a case of FIG. 27A if the wiring structure of FIG. 27B is used. Further, since the wiring layer 24 is already connected to the pn junction of the transistor QN at the time of formation of a contact opening for connection with the wiring layers 22 and 24, the wiring layer 22 and control gate line $14_i$ (i=1 to 8) will not be charged and almost no damage occurs. Therefore, when the wiring structure shown in FIG. 27B is used, a chip with extremely high reliability in comparison with the prior art case can be attained.

FIG. 27C is a modification obtained by adding a wiring layer 24 to the wiring structure of FIG. 21B. Similar to the wiring structure shown in FIG. 27B, it makes easier to apply the probe and a chip with extremely high reliability in comparison with the prior art case can be attained.

The third embodiment is explained by use of the various modifications and this invention is not limited to the third embodiment and the modifications thereof and can be variously modified. For example, in FIGS. 25A, 25B, 26A and 26B, the wiring structure of the control gate line is shown, but the same wiring structure for the selection gate line can be used.

Further, in the third embodiment, this invention is explained by taking as an example a case where a contact is formed with respect to the wiring layer 14 when the selection gate line is connected to another wiring on the end portion of the memory cell array, but if the wiring layer 16 is connected to the wiring layer 14 in the selection gate line portion in the memory cell array, for example, a portion connected to the wiring $14_j$ (j=9, 10) in the third embodiment may be changed to a portion for connection with the wiring $16_j$ (j=9, 10) and the same effect as the third embodiment can be attained.

Further, in the third embodiment, a case wherein the wiring structure of the control gate line extending from the memory cell array 2 to the row decoders 5a, 5b is the same in the entire portion is explained as an example, but the combination of the above modifications may be applicable. For example, this invention can be applied to the wiring structure obtained by using the selection gate line constructed as shown in FIG. 21B, three of the eight control gate lines constructed as shown in FIG. 23B and the other five control gate lines constructed as shown in FIG. 21A. This invention can also be applied to a combination of three or more modifications in which the wring structure is obtained by using the selection gate line constructed as shown in FIG. 21B, two of the eight control gate lines constructed as shown in FIG. 21A, three of the eight control gate lines constructed as shown in FIG. 22A and the other three control gate lines constructed as shown in FIG. 23B, for example. When the patterns of the row decoders 5a, 5b are taken into consideration, the wiring layers of the main wirings of the control gate lines and the selection gate lines extending from the memory cell array 2 to the row decoders 5a, 5b may be separately formed so as to form them in a superposed configuration. For example, since the wiring layers can be superposed in three levels if the wiring layers are separately formed into three wiring layers, the pattern area can be reduced. Further, in order to reduce the pattern area, it is extremely effective to combine and use the above modifications according to the condition at the time of pattern formation.

In some modifications of the third embodiment, this invention is explained by taking a case wherein the uppermost layer of the wiring layers used for the wiring is the wiring layer 18 as an example, but this invention can be effective in other cases, for example, a modification in which a wiring layer lying above the wiring layer 18 and directly connected to the wiring layer 18 is additionally provided can be made and this invention can be applied to the wiring structure.

In the first to third embodiments, a case wherein eight memory cells are serially connected in one NAND cell is explained, but this invention can be applied even if the number of series-connected memory cells is not eight. The number of memory cells may be set to 2, 4, 16, 32, 64, for example. Further, in the first to third embodiments, this invention is explained by taking the NAND cell type EEPROM as an example, but this invention is not limited to the NAND type EEPROM and, for example, the first and third embodiments can be applied to a NOR cell type EEPROM, DINOR cell type EEPROM, AND cell type EEPROM, NOR cell type EEPROM with selection transistors and the like and the second embodiment can be applied to a DINOR cell type EEPROM, AND cell type EEPROM and the like.

Figure 28:
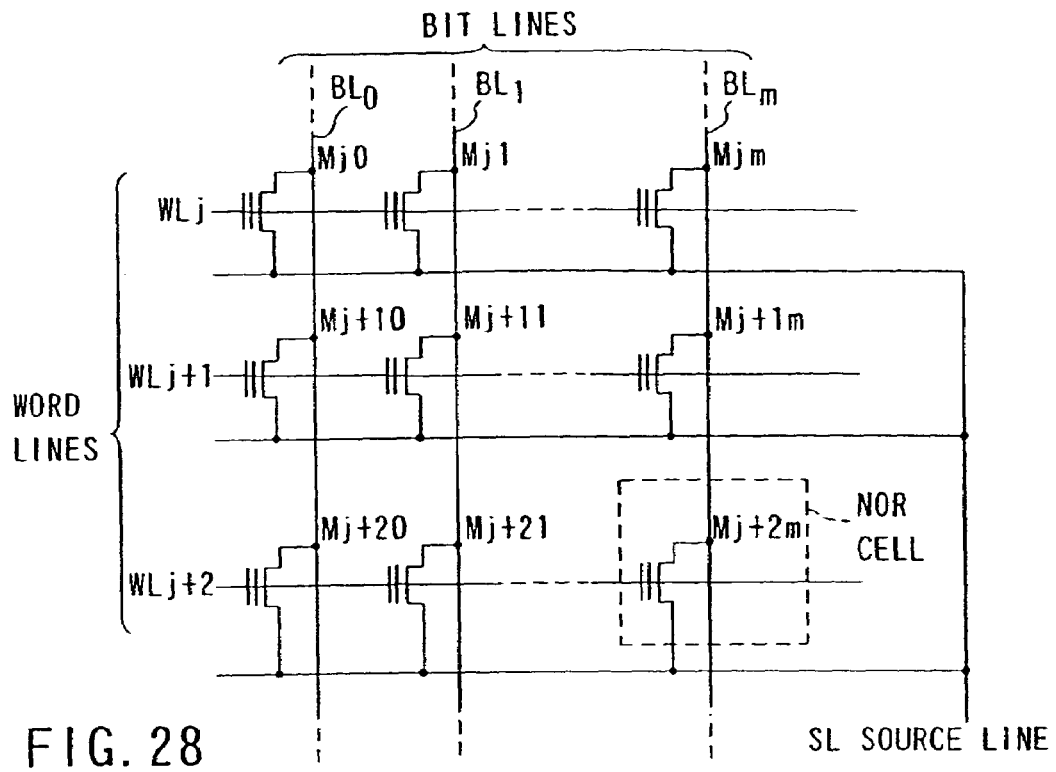
FIG. 28 is an equivalent circuit diagram of a memory cell array in the NOR cell type EEPROM.

FIG. 28 is an equivalent circuit diagram of a memory cell array in the NOR cell type EEPROM. The memory cell array has NOR cells $M_{j0}$ to $M_{j+2m}$ arranged at intersections between word lines $WL_j$, $WL_{j+1}$, $WL_{j+2}$, . . . and bit lines $BL_0$, $BL_1$, . . . , $BL_m$, the control gates of the NOR cells $M_{j0}$ to $M_{j+2m}$ on the same row are connected to a corresponding one of the word lines $WL_j$, $WL_{j+1}$, $WL_{j+2}$, . . . , the drains of the NOR cells $M_{j0}$ to $M_{j+2m}$ on the same column are connected to a corresponding one of the bit lines $BL_0$, $BL_1$, . . . , $BL_m$, and the sources of the NOR cells are commonly connected to a source line SL.

Figure 29:
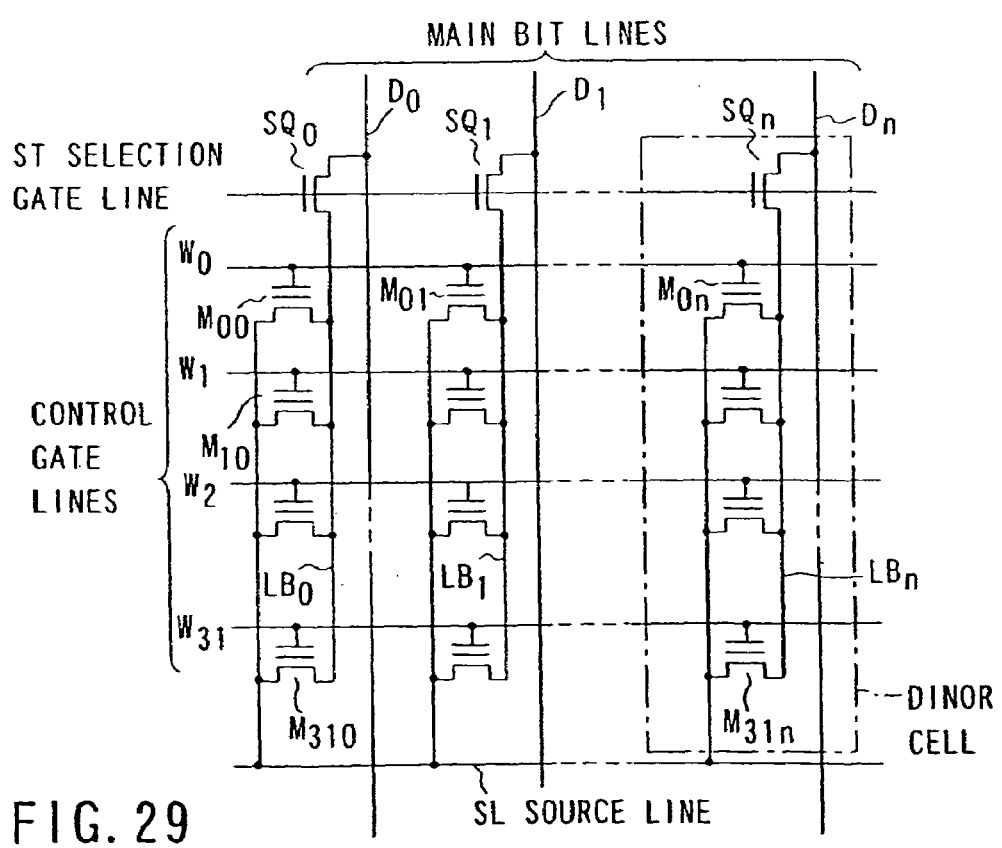
FIG. 29 is an equivalent circuit diagram of a memory cell array in the DINOR cell type EEPROM.

FIG. 29 is an equivalent circuit diagram of a memory cell array in the DINOR cell type EEPROM. In the DINOR cell type memory cell array, DINOR cell blocks are formed in correspondence to main bit lines $D_0$, $D_1$, . . . , $D_n$. Each DINOR cell is formed of selection gate transistors $SQ_0$, $SQ_1$, . . . , $SQ_n$ and memory cells $M_{00}$ to $M_{31n}$, the drains of the selection gate transistors $SQ_0$, $SQ_1$, . . . , $SQ_n$ are respectively connected to the main bit lines $D_0$, $D_1$, . . . , $D_n$, the gates thereof are connected to a selection gate line ST and the sources thereof are respectively connected to local bit lines $LB_0$, $LB_1$, . . . , $LB_n$. The drains of the memory cells $M_{00}$ to $M_{31n}$ on the same column are connected to a corresponding one of the local bit lines $LB_0$, $LB_1$, . . . , $LB_n$, the control gates thereof on the same row are connected to a corresponding one of the word lines $W_0$ to $W_{31}$, and the sources thereof are commonly connected to a source line SL.

Figure 30:
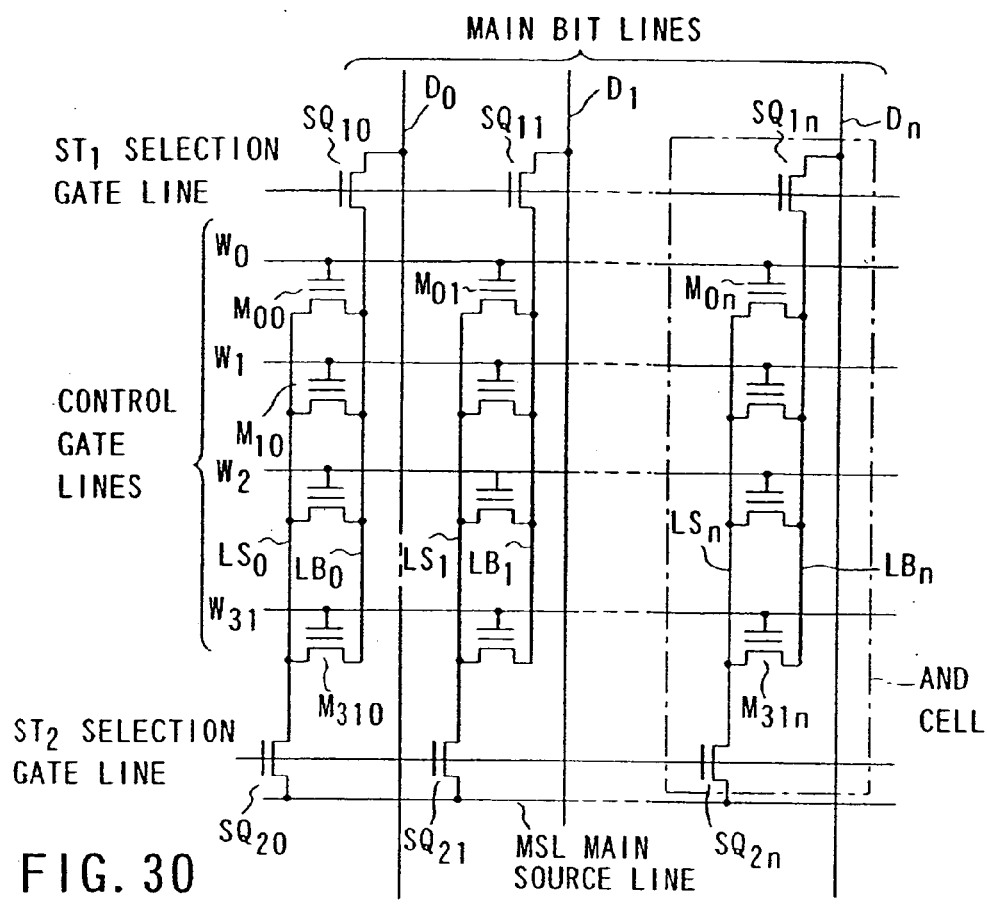
FIG. 30 is an equivalent circuit diagram of a memory cell array in the AND cell type EEPROM.

FIG. 30 is an equivalent circuit diagram of a memory cell array in the AND cell type EEPROM. In the AND cell type memory cell array, AND cell blocks are formed in correspondence to main bit lines $D_0$, $D_1$, . . . , $D_n$. Each AND cell is formed of first selection gate transistors $SQ_{10}$, $SQ_{11}$, . . . , $SQ_{1n}$, memory cells $M_{00}$ to $M_{31n}$ and second selection gate transistors $SQ_{20}$, $SQ_{21}$, . . . , $SQ_{2n}$, the drains of the selection gate transistors $SQ_{10}$, $SQ_{11}$, . . . , $SQ_{1n}$ are respectively connected to the main bit lines $D_0$, $D_1$, . . . , $D_n$, the gates thereof are connected to a first selection gate line $ST_1$, and the sources thereof are respectively connected to local bit lines $LB_0$, $LB_1$, . . . , $LB_n$. The drains of the memory cells $M_{00}$ to $M_{31n}$ on the same column are connected to a corresponding one of the local bit lines $LB_0$, $LB_1$, . . . , $LB_n$, the control gates thereof on the same row are connected to a corresponding one of the word lines $W_0$ to $W_{31}$, and the sources thereof are respectively connected to local source lines $LS_0$, $LS_1$, . . . , $LS_n$. The drains of the second selection gate transistors $SQ_{20}$, $SQ_{21}$, . . . , $SQ_{2n}$ are respectively connected to the local source lines $LS_0$, $LS_1$, . . . , $LS_n$, the gates thereof are connected to a second selection gate line $ST_2$, and the sources thereof are commonly connected to a main source line MSL.

Figure 31:
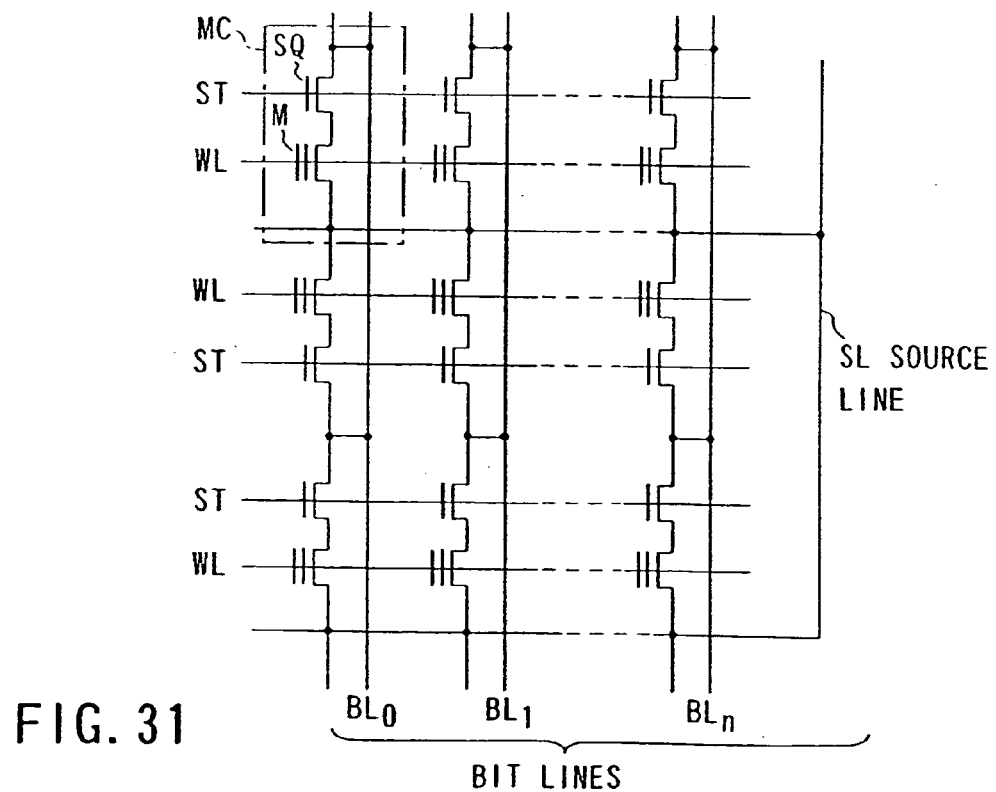
FIG. 31 is an equivalent circuit diagram of a memory cell array in the NOR cell type EEPROM with the selection transistor.
Figure 32:
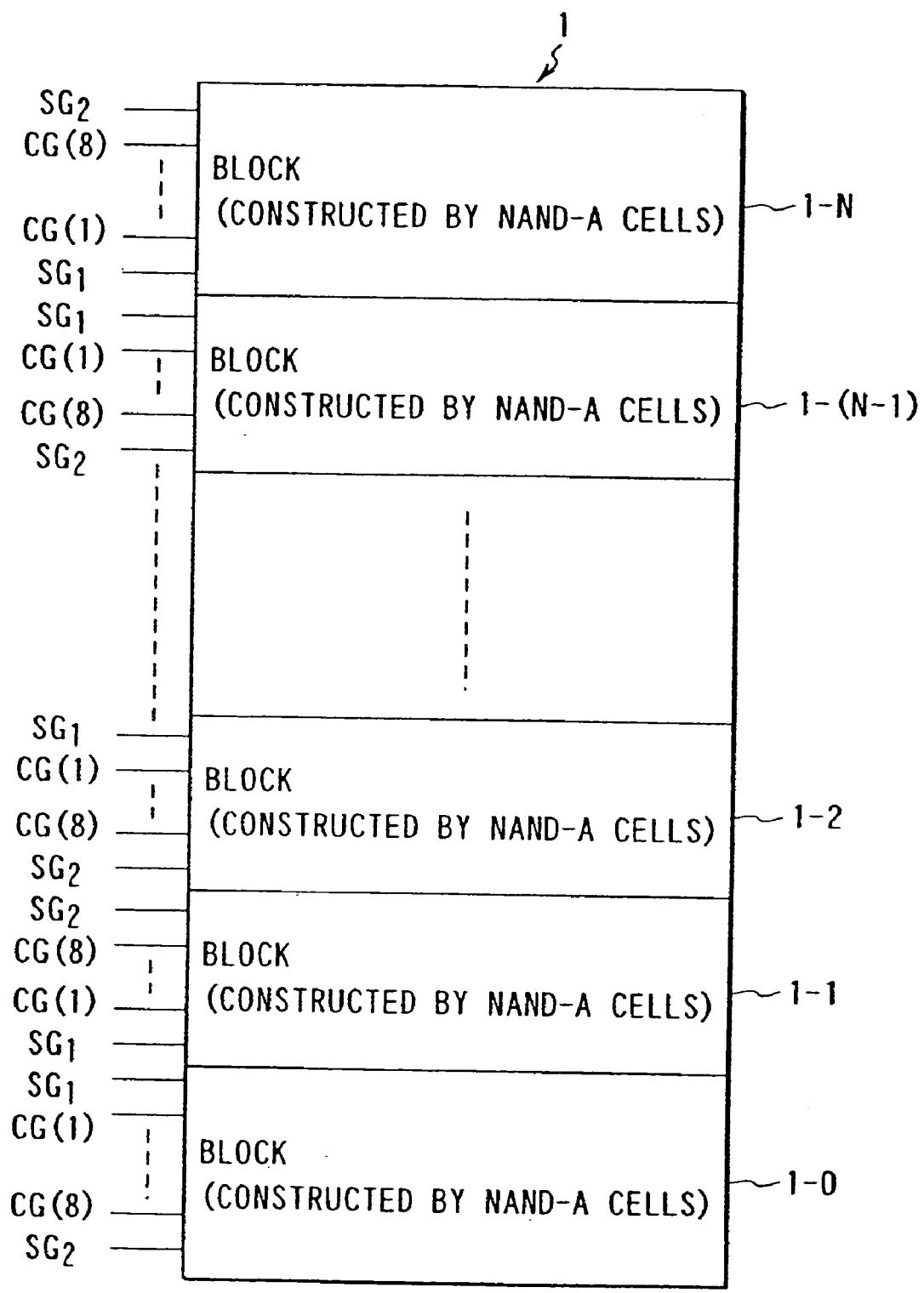
FIG. 32 is a diagram showing the block arrangement in a memory cell array of a NAND cell type EEPROM, for illustrating the conventional semiconductor memory device.
Figure 33:
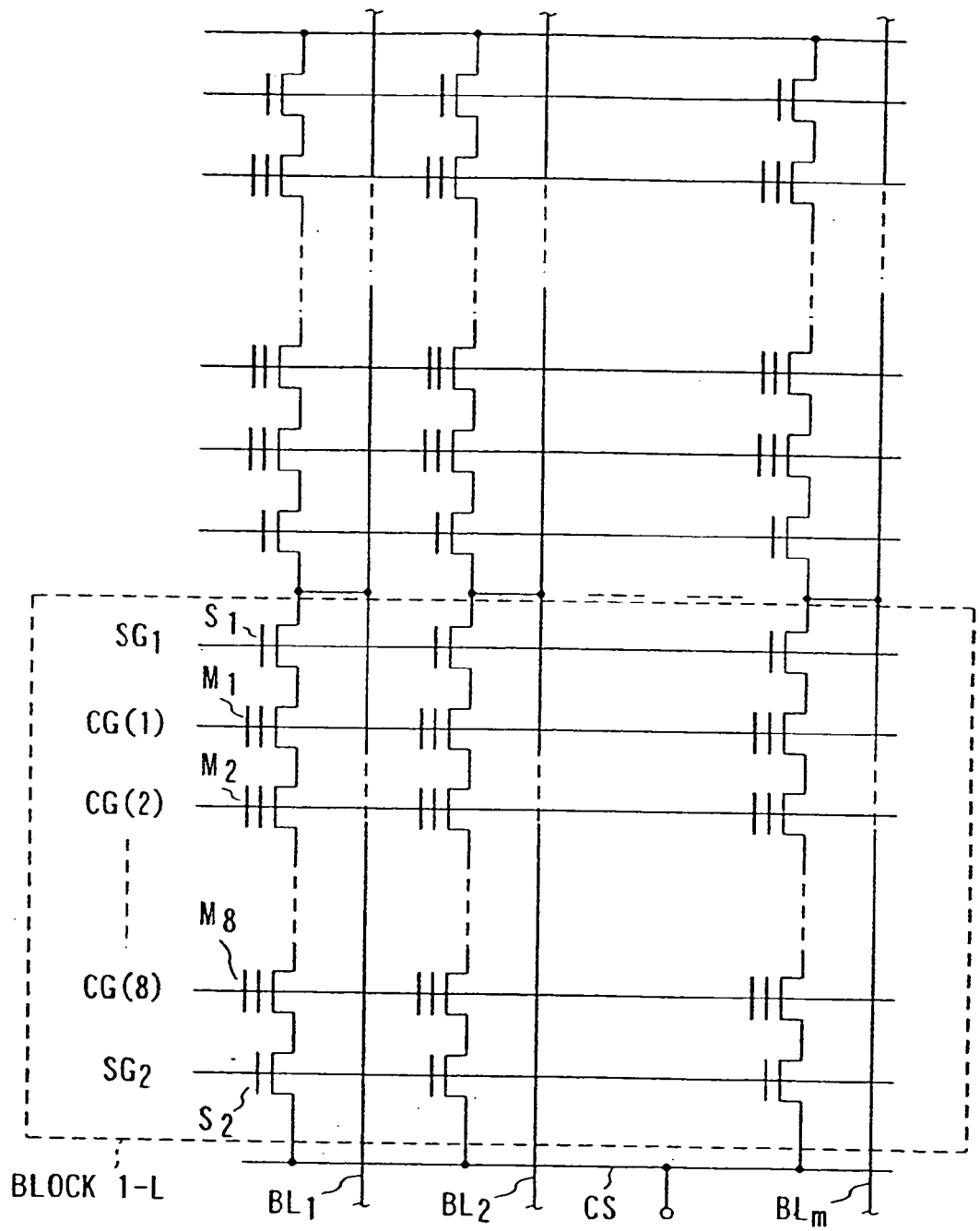
FIG. 33 is an equivalent circuit diagram of the memory cell array having NAND cells arranged in a matrix form and shows the detail construction example of part of the memory cell array shown in FIG. 32.

FIG. 31 is an equivalent circuit diagram of a memory cell array in the NOR cell type EEPROM with selection transistors. The memory cell array includes memory cells MC each of which has a selection transistor SQ and a memory cell transistor M and which are arranged in a matrix form. The drains of the selection transistors SQ on the same column are connected to a corresponding one of the bit lines $BL_0$, $BL_1$, . . . , $BL_n$, the gates thereof on the same row are connected to a corresponding one of selection gate lines ST and the sources thereof are respectively connected to the drains of the corresponding memory cell transistors M. The control gates of the memory cell transistors M on the same row are connected to a corresponding one of word lines WL and the sources thereof are commonly connected to a source line SL.

The DINOR cell type EEPROM is explained in detail in "H. Onoda et al., IEDM Tech. Digest, 1992, pp. 599 to 602" and the AND cell type EEPROM is explained in detail in "H. Kume et al., IEDM Tech. Digest, 1992, pp. 991 to 993".

In the DINOR cell type EEPROM, the selection gate lines are provided only on one side of the memory cell group, but it is effective to selectively change the designed value of the word line width in order to solve a problem due to a lowering in the processing precision caused by disturbance of the regular arrangement of the control gate lines in a portion in which the selection gate lines are not formed (for example, in a portion of the control gate lines (corresponding to the word line $W_{31}$ in FIG. 29) on the end portion of the control gate line group on which the selection gate lines are not formed) and, in this case, the second embodiment of this invention can be applied.

Further, in the first to third embodiments, this invention is explained by taking the electrically programmable nonvolatile semiconductor memory device as an example, but this invention can be applied to another device, for example, another nonvolatile semiconductor memory device and the first and second embodiments can be applied to a device such as a DRAM, SRAM.

This invention has been explained by using the first to third embodiments and the various modifications thereof but can be variously modified without departing from the technical scope thereof.

As described above, according to this invention, occurrence of a defect caused by a lowering in the processing precision in an end area of the memory cell array can be prevented. Therefore, a semiconductor memory device capable of realizing a chip having high operation reliability and high manufacturing yield in comparison with the conventional case without substantially increasing the chip size can be attained.

Further, a word line having an extremely small line width caused by a lowering in the processing precision due to disturbance of the regular arrangement of the wirings around the word line can be prevented from being formed. Therefore, a semiconductor memory device capable of realizing a chip having high reliability in the data programming/readout operation in comparison with the conventional case without significantly increasing the chip size can be attained.

Also, stress applied to the memory cell in the manufacturing process can be reduced and the pattern area of the row decoder can be reduced. Therefore, a semiconductor memory device capable of realizing an inexpensive chip having high operation reliability and high manufacturing yield in comparison with the conventional case can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array comprising memory cell units arranged in an array form;
    a plurality of word lines formed by continuously extending gates of memory cells included in said memory cell units;
    a plurality of bit lines continuously extending in said memory cell array and crossing with said word lines perpendicularly;
    a first block in which first memory cell units each having at least one memory cell and at least one selection gate transistor are arranged; and
    a second block in which second memory cell units each having at least one memory cell and at least one selection gate transistor are arranged,
    wherein said first block is arranged on a first end portion of said memory cell array, said second block is arranged in another portion, a structure of each of said first memory cell units is different from a structure of each of said second memory cell units, and said plurality of bit lines continuously extend between said first block and said second block.

2. The semiconductor memory device according to claim 1, wherein said first block is arranged on the first end portion and a second end portion of said memory cell array, and said second block is arranged in other portions.

3. The semiconductor memory device according to claim 1, further comprising:
    a first selection gate line formed by continuously extending gates of said selection gate transistors included in said first memory cell units; and
    a second selection gate line formed by continuously extending gates of said selection gate transistors included in said second memory cell units,
    wherein said first selection gate line is formed by use of a mask having a data pattern in which a width of said first selection gate line is set greater than a width of said second selection gate line.

4. The semiconductor memory device according to claim 3, wherein said first selection gate line is located at a position closer to an edge of said memory cell array than other selection gate lines in said memory cell array.

5. The semiconductor memory device according to claim 1, further comprising:
    a first selection gate line formed by continuously extending gates of said selection gate transistors included in said first memory cell units; and
    a second selection gate line formed by continuously extending gates of said selection gate transistors included in said second memory cell units,
    wherein a width of said first selection gate line is greater than a width of said second selection gate line.

6. The semiconductor memory device according to claim 5, wherein said first selection gate line is located at a position closer to an edge of said memory cell array than other selection gate lines in said memory cell array.

7. The semiconductor memory device according to claim 1, wherein a width of a first word line in said first block is greater than a width of a corresponding word line in said second block.

8. The semiconductor memory device according to claim 1, further comprising:
    a first selection gate line formed by continuously extending gates of said selection gate transistors included in said first memory cell units;
    a second selection gate line formed by continuously extending gates of said selection gate transistors included in said second memory cell units;
    a first contact connected to one of said first memory cell units; and a second contact connected to one of said second memory cell units and located at a corresponding position, wherein a first space between said first contact and a first wiring adjacent to said first contact is larger than a second space between said second contact and a second wiring adjacent to said second contact, said first wiring is located in said first block and said second wiring is located in said second block.

9. The semiconductor memory device according to claim 8, wherein both of said first wiring and said second wiring are selection gate lines, said first selection gate line is located at a position closer to an edge of said memory cell array than other selection gate lines in said memory cell array, and both of said first contact and said second contact are bit line contacts or source line contacts.

10. The semiconductor memory device according to claim 1, further comprising:
a first wiring located in said first block;
a second wiring located at a corresponding position in said second block; and
a contact connected to one of said first memory cell units;
wherein said contact is located adjacent to said first wiring and no contact is located at a corresponding position adjacent to said second wiring.

11. The semiconductor memory device according to claim 1, wherein said first block is a dummy block.

12. The semiconductor memory device according to claim 1, wherein said first block is a redundancy block.

13. The semiconductor memory device according to claim 1, wherein a number of word lines in each of said first memory cell units is different from a number of word lines in each of said second memory cell units.

14. The semiconductor memory device according to claim 1, wherein a length of each of said first memory cell units is different from a length of each of said second memory cell units.

15. The semiconductor memory device according to claim 1, further comprising:
a first selection gate line formed by continuously extending gates of said selection gate transistors included in said first memory cell units, located in said first block;
a second selection gate line formed by continuously extending gates of said selection gate transistors included in said second memory cell units, located at a corresponding position in said second block;
wherein said first selection gate line is located at a position closer to an edge of said memory cell array than other selection gate lines in said memory cell array and a width of said first selection gate line is greater than a width of said second selection gate line.

16. The semiconductor memory device according to claim 1, further comprising:
a first selection gate line formed by continuously extending gates of said selection gate transistors included in said first memory cell units, located in said first block;
a second selection gate line formed by continuously extending gates of said selection gate transistors included in said second memory cell units, located at a corresponding position in said second block;
wherein said first selection gate line is located at a position closer to an edge of said memory cell array than other selection gate lines in said memory cell array and a structure around said first selection gate line is different from a structure around said second selection gate line.

17. The semiconductor memory device according to claim 1, wherein said memory cell is a nonvolatile memory cell.

18. The semiconductor memory device according to claim 1, wherein said memory cell is a flash memory cell.

19. The semiconductor memory device according to claim 1, wherein each of said memory cell units is a NAND cell type EEPROM.

20. A semiconductor memory device comprising:
a memory cell array comprising memory cell units arranged in an array form;
a plurality of word lines formed by continuously extending gates of memory cells included in said memory cell units;
a plurality of bit lines continuously extended in said memory cell array and crossing with said word lines perpendicularly;
a first block in which first memory cell units each having at least one memory cell and at least one selection gate transistor are arranged;
a second block in which second memory cell units each having at least one memory cell and at least one selection gate transistor are arranged; and
a third block in which third memory cell units each having at least one memory cell and at least one selection gate transistor are arranged,
wherein said first block is arranged on one end portion of said memory cell array, said second block is arranged on the other end portion of said memory cell array, said third block is arranged in another portion, a structure of each of said first memory cell units is different from a structure of each of said third memory cell units, and a structure of each of said second memory cell units is different from a structure of each of said third memory cell units, and said plurality of bit lines continuously extend between said first block and said second block.

21. The semiconductor memory device according to claim 20, wherein a structure of each of said first memory cell units is different from a structure of each of said second memory cell units.

22. The semiconductor memory device according to claim 21, further comprising:
a first selection gate line formed by continuously extending gates of said selection gate transistors included in said first memory cell units; and
a second selection gate line formed by continuously extending gates of said selection gate transistors included in said second memory cell units,
wherein said first selection gate line is formed by use of a mask having a data pattern in which a width of said first selection gate line is set greater than a width of said second selection gate line.

23. The semiconductor memory device according to claim 22, wherein said first selection gate line is located at a position closer to an edge of said memory cell array than other selection gate lines in said memory cell array.

24. The semiconductor memory device according to claim 21, further comprising:
a first selection gate line formed by continuously extending gates of said selection gate transistors included in said first memory cell units; and
a second selection gate line formed by continuously extending gates of said selection gate transistors included in said second memory cell units,
wherein a width of said first selection gate line is greater than a width of said second selection gate line.

25. The semiconductor memory device according to claim 21, wherein a width of a first word line in said first block is greater than a width of a corresponding word line in said second block.

26. The semiconductor memory device according to claim 21, further comprising:
- a first selection gate line formed by continuously extending gates of said selection gate transistors included in said first memory cell units;
- a second selection gate line formed by continuously extending gates of said selection gate transistors included in said second memory cell units;
- a first contact connected to one of said first memory cell units; and
- a second contact connected to one of said second memory cell units and located at a corresponding position,
- wherein a first space between said first contact and a first wiring adjacent to said first contact is larger than a second space between said second contact and a second wiring adjacent to said second contact, said first wiring is located in said first block and said second wiring is located in said second block.

27. The semiconductor memory device according to claim 21, further comprising:
- a first wiring located in said first block;
- a second wiring located at a corresponding position in said second block; and
- a contact connected to one of said first memory cell units;
- wherein said contact is located adjacent to said first wiring and no contact is located at a corresponding position adjacent to said second wiring.

28. The semiconductor memory device according to claim 27, wherein said first selection gate line is located at a position closer to an edge of said memory cell array than other selection gate lines in said memory cell array.

29. The semiconductor memory device according to claim 27, wherein said contact is a bit line contact or a source line contact.

30. The semiconductor memory device according to claim 29, wherein said first selection gate line is located at a position closer to an edge of said memory cell array than other selection gate lines in said memory cell array.

31. The semiconductor memory device according to claim 21, wherein said first block is a dummy block.

32. The semiconductor memory device according to claim 21, wherein said first block is a redundancy block.

33. The semiconductor memory device according to claim 21, wherein a number of word lines in each of said first memory cell units is different from a number of word lines in each of said second memory cell units.

34. The semiconductor memory device according to claim 21, wherein a length of each of said first memory cell units is different from a length of each of said second memory cell units.

35. The semiconductor memory device according to claim 21, further comprising:
- a first selection gate line formed by continuously extending gates of said selection gate transistors included in said first memory cell units, located in said first block;
- a second selection gate line formed by continuously extending gates of said selection gate transistors included in said second memory cell units, located at corresponding position in said second block;
- wherein said first selection gate line is located at a position closer to an edge of said memory cell array than other selection gate lines in said memory cell array and a width of said first selection gate line is greater than a width of said second selection gate line.

36. The semiconductor memory device according to claim 21, further comprising:
- a first selection gate line formed by continuously extending gates of said selection gate transistors included in said first memory cell units, located in said first block;
- a second selection gate line formed by continuously extending gates of said selection gate transistors included in said second memory cell units, located at a corresponding position in said second block;
- wherein said first selection gate line is located at a position closer to an edge of said memory cell array than other selection gate lines in said memory cell array and a structure around said first selection gate line is different from a structure around said second selection gate line.

37. The semiconductor memory device according to claim 21, wherein said memory cell is a nonvolatile memory cell.

38. The semiconductor memory device according to claim 21, wherein said memory cell is a flash memory cell.

39. The semiconductor memory device according to claim 21, wherein each of said memory cell units is a NAND cell type BEPROM.

40. The semiconductor memory device according to claim 1, wherein said plurality of bit lines continuously extend between said first block and a third block, said first bock and said third block are arranged on one end and the other end of said memory cell array, respectively.

* * * * *